(12) United States Patent
Arakawa

(10) Patent No.: US 12,089,457 B2
(45) Date of Patent: Sep. 10, 2024

(54) DISPLAY DEVICE AND METHOD FOR MANUFACTURING DISPLAY DEVICE, AND ELECTRONIC DEVICE

(71) Applicant: SONY SEMICONDUCTOR SOLUTIONS CORPORATION, Kanagawa (JP)

(72) Inventor: Shinichi Arakawa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 466 days.

(21) Appl. No.: 17/425,398

(22) PCT Filed: Jan. 28, 2020

(86) PCT No.: PCT/JP2020/002914
§ 371 (c)(1),
(2) Date: Jul. 23, 2021

(87) PCT Pub. No.: WO2020/158710
PCT Pub. Date: Aug. 6, 2020

(65) Prior Publication Data
US 2022/0102469 A1    Mar. 31, 2022

(30) Foreign Application Priority Data

Feb. 1, 2019  (JP) ................. 2019-016645

(51) Int. Cl.
*H10K 59/131* (2023.01)
*H01L 23/00* (2006.01)
(Continued)

(52) U.S. Cl.
CPC .......... *H10K 59/131* (2023.02); *H01L 25/18* (2013.01); *H10K 77/10* (2023.02); *H01L 24/06* (2013.01);
(Continued)

(58) Field of Classification Search
CPC ............ H10K 59/131; H10K 59/1201; H10K 77/10; H01L 25/18
See application file for complete search history.

(56) References Cited

U.S. PATENT DOCUMENTS

2003/0137325 A1  7/2003  Yamazaki et al.
2011/0127629 A1  6/2011  Yorikado
(Continued)

FOREIGN PATENT DOCUMENTS

CN    1434668 A    8/2003
CN    102446933 A    5/2012
(Continued)

OTHER PUBLICATIONS

International Search Report and Written Opinion of PCT Application No. PCT/JP2020/002914, issued on Mar. 3, 2020, 9 pages of ISRWO.

*Primary Examiner* — Christine A Enad
(74) *Attorney, Agent, or Firm* — CHIP LAW GROUP

(57) ABSTRACT

A display device includes: a first substrate that includes a semiconductor material layer in which a transistor has been formed, the transistor driving a light-emitting part that is included in a pixel; and a second substrate that includes a predetermined circuit. The first substrate and the second substrate are stuck together in such a way that respective joint surfaces face each other. A pad opening is provided from a side of the first substrate to face a pad electrode that has been provided on a side of the respective joint surfaces, in such a way that the pad electrode is exposed on a bottom surface.

16 Claims, 59 Drawing Sheets

(51) Int. Cl.
*H01L 25/18* (2023.01)
*H10K 59/12* (2023.01)
*H10K 77/10* (2023.01)

(52) U.S. Cl.
CPC ...... *H01L 24/08* (2013.01); *H01L 2224/0603* (2013.01); *H01L 2224/08145* (2013.01); *H10K 59/1201* (2023.02)

(56) References Cited

U.S. PATENT DOCUMENTS

| | | | |
|---|---|---|---|
| 2013/0056714 A1 | 3/2013 | Hasegawa et al. | |
| 2014/0117334 A1 | 5/2014 | Nakamura et al. | |
| 2015/0309637 A1* | 10/2015 | Sakuishi | H01L 27/1214 345/174 |
| 2019/0319221 A1 | 10/2019 | Ohchi | |

FOREIGN PATENT DOCUMENTS

| | | | |
|---|---|---|---|
| CN | 102969457 | A | 3/2013 |
| CN | 103794739 | A | 5/2014 |
| CN | 104009055 | A | 8/2014 |
| CN | 105006481 | A | 10/2015 |
| CN | 106663721 | A | 5/2017 |
| EP | 1331666 | A2 | 7/2003 |
| JP | 2003-288994 | A | 10/2003 |
| JP | 2013033786 | A | 2/2013 |
| JP | 2013-054863 | A | 3/2013 |
| JP | 2014-089803 | A | 5/2014 |
| JP | 2015-228018 | A | 12/2015 |
| KR | 10-0979925 | B1 | 9/2010 |
| KR | 20120070870 | A | 7/2012 |
| KR | 10-2015-0123717 | A | 11/2015 |
| SG | 126714 | A1 | 11/2006 |
| TW | 200617822 | A | 6/2006 |
| TW | 201417273 | A | 5/2014 |
| TW | 201543982 | A | 11/2015 |
| WO | 2018/116629 | A1 | 6/2018 |

* cited by examiner

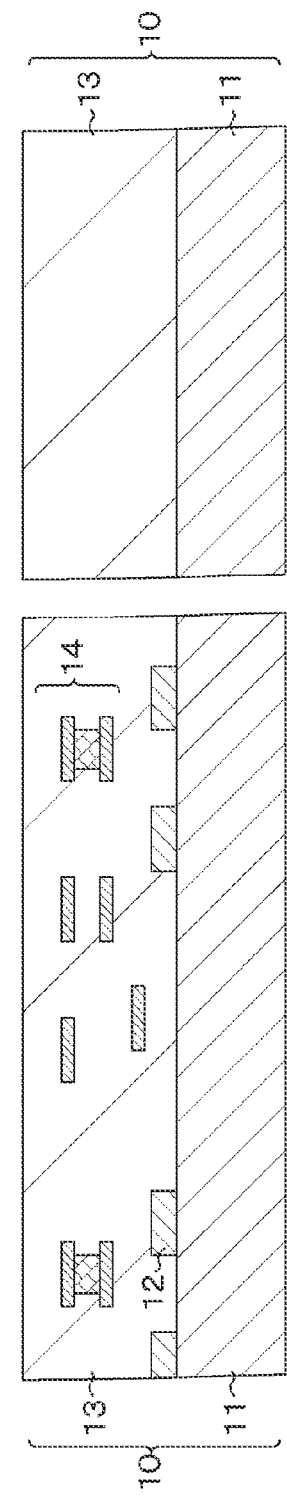
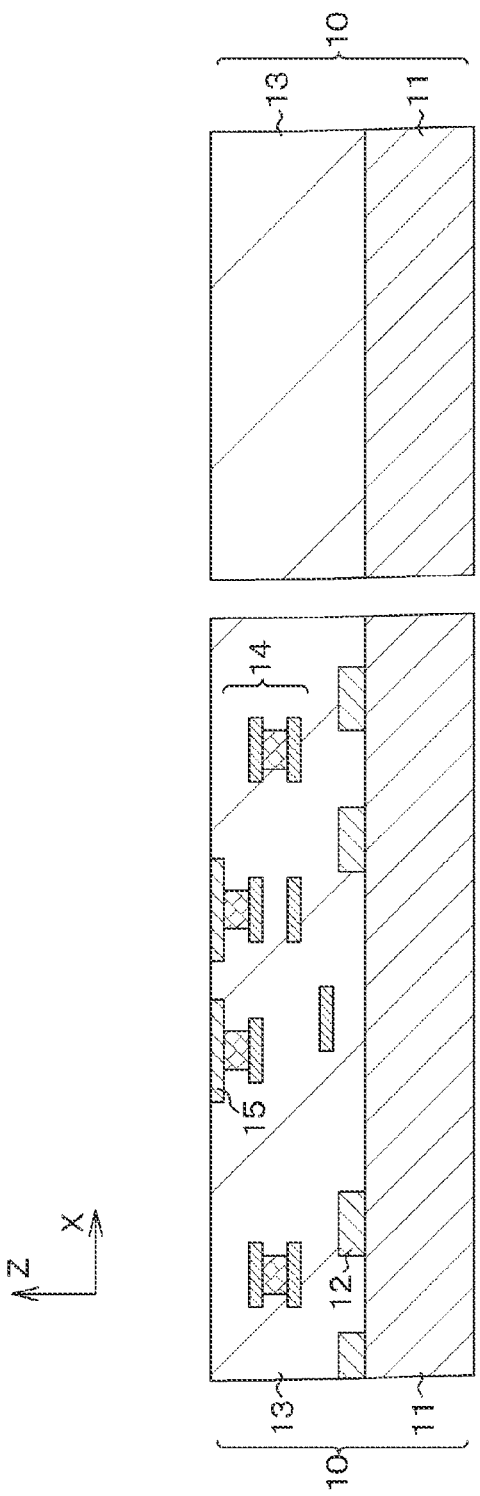

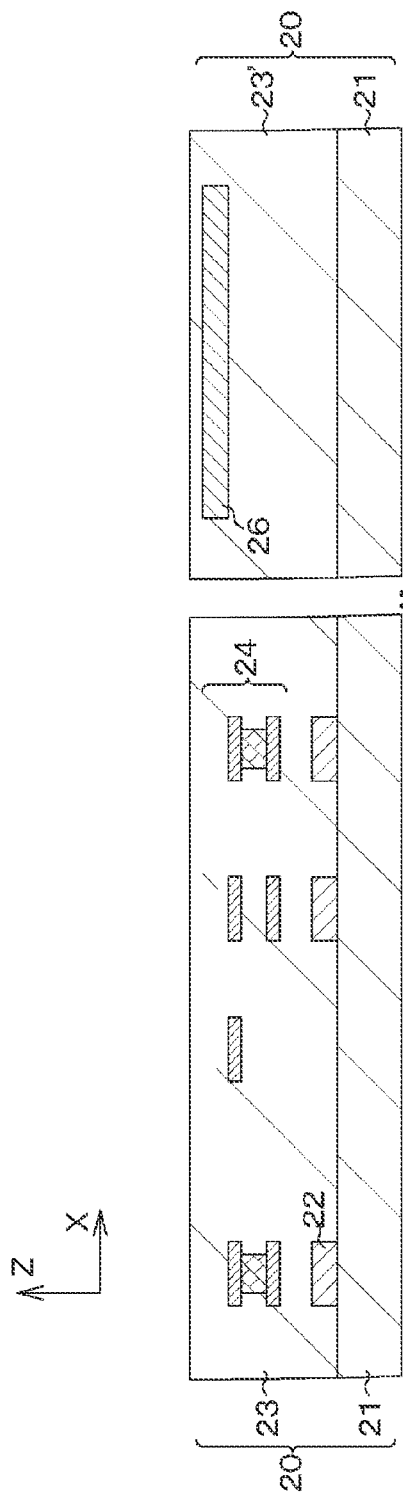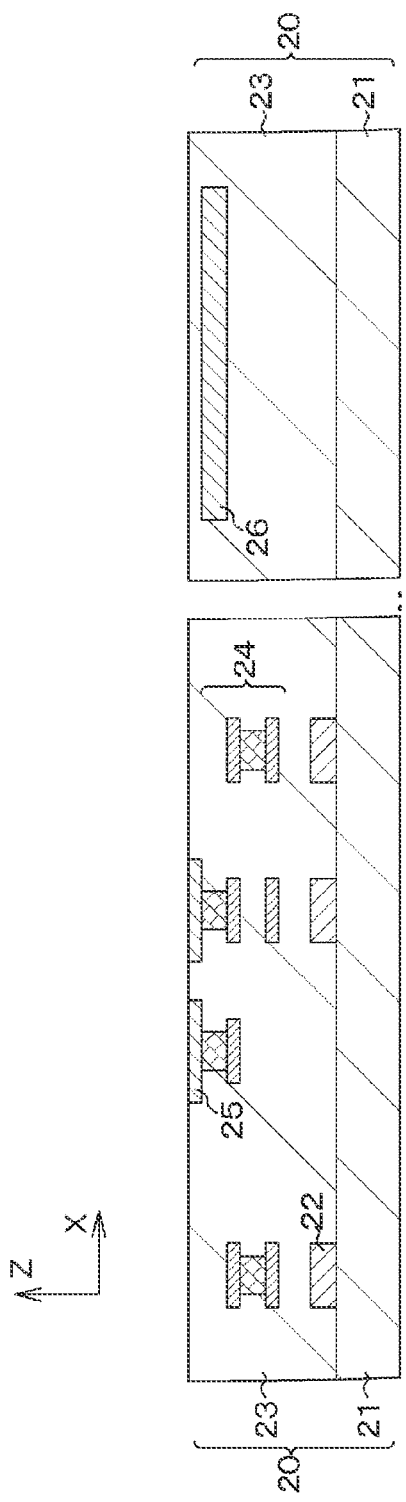
FIG. 8A
FIG. 8B

DISPLAY DEVICE AND METHOD FOR MANUFACTURING DISPLAY DEVICE, AND ELECTRONIC DEVICE

CROSS REFERENCE TO RELATED APPLICATIONS

This application is a U.S. National Phase of International Patent Application No. PCT/JP2020/002914 filed on Jan. 28, 2020, which claims priority benefit of Japanese Patent Application No. JP 2019-016645 filed in the Japan Patent Office on Feb. 1, 2019. Each of the above-referenced applications is hereby incorporated herein by reference in its entirety.

TECHNICAL FIELD

The present disclosure relates to a display device and a method for manufacturing the display device, and an electronic device.

BACKGROUND ART

A display device that includes a light-emitting part using organic electroluminescence and pixels including the light-emitting part is well-known. The display device has been attracting attention as a display device that is driven by a low-voltage direct current to be able to emit light with high luminance.

A display device that uses organic electroluminescence is of spontaneous light emission type, and further has sufficient responsiveness to a high-definition high-speed video signal. In a display device that is attached to eyewear such as glasses or goggles, it is also requested, for example, that a size of a pixel be about several μm to 10 μm.

Normally, the light-emitting part that uses organic electroluminescence includes an organic layer that includes a light-emitting layer, and a first electrode and a second electrode that are disposed to sandwich the organic layer. The pixel includes the light-emitting part, and a driving circuit that drives the light-emitting part and includes a transistor and the like. Then, a display region in which pixels are arranged in a matrix shape is scanned by a predetermined peripheral circuit, and therefore an image is displayed. Patent Document 1 discloses a structure in which a light-emitting part that uses organic electroluminescence, its driving circuit, and a peripheral circuit have been formed on the same substrate.

CITATION LIST

Patent Document

Patent Document 1: Japanese Patent Application Laid-Open No. 2014-89803

SUMMARY OF THE INVENTION

Problems to be Solved by the Invention

A required characteristic of a transistor that drives a light-emitting part that uses organic electroluminescence does not always match a required characteristic of a transistor that is used in a peripheral circuit. If these transistors are formed on the same substrate in a common semiconductor element manufacturing process, processes become very complicated, and this results in a decrease in a yield. Furthermore, it is also difficult to cope with a reduction in size such as a reduction in a size of a substrate.

Accordingly, it is an object of the present disclosure to provide a display device that is capable of causing a transistor used in the display device to have a suitable characteristic and is also capable of achieving a reduction in size, without no complicated semiconductor element manufacturing process and a method for manufacturing the display device, and an electronic device that includes the display device.

Solutions to Problems

A display device according to the present disclosure for achieving the object described above is a display device including:
  a first substrate that includes a semiconductor material layer in which a transistor has been formed, the transistor driving a light-emitting part that is included in a pixel; and
  a second substrate that includes a predetermined circuit, in which the first substrate and the second substrate are stuck together in such a way that respective joint surfaces face each other, and
  a pad opening is provided from a side of the first substrate to face a pad electrode that has been provided on a side of the respective joint surfaces, in such a way that the pad electrode is exposed on a bottom surface.

A method for manufacturing a display device according to the present disclosure for achieving the object described above is a method for manufacturing a display device including:
  a first process for sticking a first substrate and a second substrate together in such a way that respective joint surfaces face each other, the first substrate including a semiconductor material layer in which a transistor that drives a light-emitting part has been formed, the second substrate including a predetermined circuit; and
  a second process for providing a pad opening from a side of the first substrate to face a pad electrode that has been provided on a side of the respective joint surfaces, in such a way that the pad electrode is exposed on a bottom surface.

An electronic device according to the present disclosure for achieving the object described above is an electronic device including a display device that includes:
  a first substrate that includes a semiconductor material layer in which a transistor has been formed, the transistor driving a light-emitting part; and
  a second substrate that includes a predetermined circuit, in which the first substrate and the second substrate are stuck together in such a way that respective joint surfaces face each other, and
  a pad opening is provided from a side of the first substrate to face a pad electrode that has been provided on a side of the respective joint surfaces, in such a way that the pad electrode is exposed on a bottom surface.

BRIEF DESCRIPTION OF DRAWINGS

FIGS. 7A and 7B are schematic partial end face views for explaining a method for manufacturing the display device according to the first embodiment.

FIGS. 8A and 8B are schematic partial end face views that follow FIG. 7B for explaining the method for manufacturing the display device according to the first embodiment.

FIG. 57A illustrates a front view of the digital still camera, and FIG. 57B illustrates a rear view of the digital still camera.

MODES FOR CARRYING OUT THE INVENTION

Figure 1:
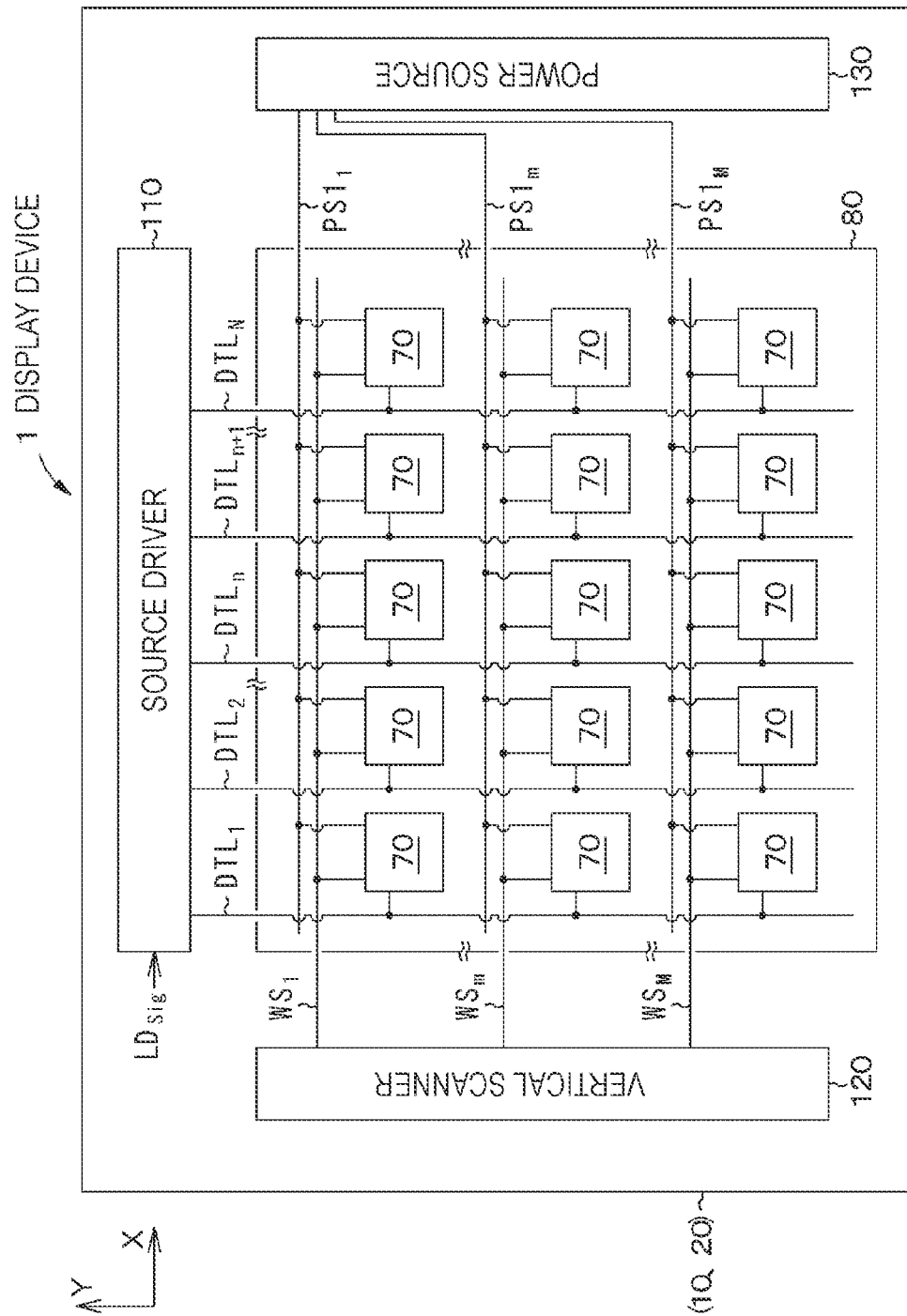
FIG. 1 is a conceptual diagram of a display device according to a first embodiment.

The present disclosure is described below on the basis of embodiments with reference to the drawings. The present disclosure is not limited to the embodiments, and various numerical values or materials in the embodiments are examples. In the description below, it is assumed that the same element or elements that have the same function are denoted by the same reference sign, and a duplicate description is omitted. Note that description will be provided in the order described below.

1. General description of display device and method for manufacturing display device, and electronic device according to the present disclosure
2. First embodiment
3. Second embodiment
4. Third embodiment
5. Fourth embodiment
6. Fifth embodiment
7. Sixth embodiment
8. Seventh embodiment
9. Eighth embodiment
10. Ninth embodiment
11. Tenth embodiment
12. Description of electronic device, and others General Description of Display Device and Method for Manufacturing Display Device, and Electronic Device According to the Present Disclosure A display device according to the present disclosure, a display device obtained by using a method for manufacturing a display device according to the present disclosure, and a display device used in an electronic device according to the present disclosure (hereinafter, in some cases, these are simply referred to as a display device according to the present disclosure) includes, as described above:

a first substrate that includes a semiconductor material layer in which a transistor has been formed, the transistor driving a light-emitting part that is included in a pixel; and a second substrate that includes a predetermined circuit, the first substrate and the second substrate are stuck together in such a way that respective joint surfaces face each other, and a pad opening is provided from a side of the first substrate to face a pad electrode that has been provided on a side of the respective joint surfaces, in such a way that the pad electrode is exposed on a bottom surface.

The display device according to the present disclosure can have a configuration in which on the first substrate, an insulating film;

a first electrode that has been formed on the insulating film, and is arranged in a matrix shape;

an organic layer that has been formed over an entire surface including an upper side of the first electrode; and a second electrode that has been formed over an entire surface including an upper side of the organic layer are stacked and formed, and the light-emitting part includes the first electrode, the organic layer, and the second electrode.

A display device according to the present disclosure that includes the preferred configuration described above can have a configuration in which the pad opening is provided to penetrate the semiconductor material layer of the first substrate, and the semiconductor material layer that is located around the pad opening is sectioned by an insulating structure that has been provided along a circumference of each of the pad openings to penetrate the semiconductor material layer.

In this case, a configuration in which the insulating structure is formed by using an insulating material that is included in the insulating film can be employed. Alternatively, 1. a configuration in which a protective film is formed on the second electrode, and the insulating structure is formed by using an insulating material that is included in the protective film; 1. a configuration in which a color filter is formed on the second electrode, and the insulating structure is formed by using an insulating material that is included in the color filter; or 3. a configuration in which a microlens is formed on the second electrode, and the insulating structure is formed by using an insulating material that is included in the microlens can also be employed.

Alternatively, a display device according to the present disclosure that includes the preferred configuration described above can have a configuration in which the pad opening is provided to penetrate the semiconductor material layer of the first substrate, and a penetration surface of the semiconductor material layer is covered with an insulating material.

In this case, a configuration in which the penetration surface of the semiconductor material layer is covered with an insulating material that is included in the insulating film. Alternatively, 1. a configuration in which a protective film is formed on the second electrode, and the penetration surface of the semiconductor material layer is covered with an insulating material that is included in the protective film; 1. a configuration in which a color filter is formed on the second electrode, and the penetration surface of the semiconductor material layer is covered with an insulating material that is included in the color filter; or 3. a configuration in which a microlens is formed on the second electrode, and the penetration surface of the semiconductor material layer is covered with an insulating material that is included in the microlens can also be employed.

Alternatively, a display device according to the present disclosure that includes the preferred configuration described above can also have a configuration in which an opening having a region that is wider than an exposed region of the pad electrode is provided in the semiconductor material layer.

A display device according to the present disclosure that includes various preferred configurations described above can have a configuration in which
- a first connection electrode is provided on a joint surface of the first substrate,
- a second connection electrode is provided on a joint surface of the second substrate, and
- the first connection electrode and the second connection electrode are metal-joined on the joint surface.

As described above, a method for manufacturing a display device according to the present disclosure includes:
- a first process for sticking a first substrate and a second substrate together in such a way that respective joint surfaces face each other, the first substrate including a semiconductor material layer in which a transistor that drives a light-emitting part has been formed, the second substrate including a predetermined circuit; and
- a second process for providing a pad opening from a side of the first substrate to face a pad electrode that has been provided on a side of the respective joint surfaces, in such a way that the pad electrode is exposed on a bottom surface.

The method for manufacturing the display device according to the present disclosure that has been described above can have a configuration including:
- a process for forming the light-emitting part that includes a first electrode, an organic layer, and a second electrode, by stacking on the first substrate:
- an insulating film;
- the first electrode that has been formed on the insulating film, and is arranged in a matrix shape;
- the organic layer that has been formed over an entire surface including an upper side of the first electrode; and
- the second electrode that has been formed over an entire surface including an upper side of the organic layer.

In this case, a configuration can be employed in which between the first process and the second process,
- a process for sectioning the semiconductor material layer that is located around the pad opening, by using an insulating structure that has been provided along a circumference of each of the pad openings to penetrate the semiconductor material layer
is performed.

In this case, a configuration in which the insulating structure is formed by using an insulating material that is included in the insulating film can be employed. Alternatively,
1. a configuration in which a protective film is formed on the first electrode, and the insulating structure is formed by using an insulating material that is included in the protective film;
2. a configuration in which a color filter is formed on the first electrode, and the insulating structure is formed by using an insulating material that is included in the color filter; or
3. a configuration in which a microlens is formed on the first electrode, and the insulating structure is formed by using an insulating material that is included in the microlens can also be employed.

Alternatively, a configuration can be employed in which between the first process and the second process,
- a process for providing an opening to penetrate the semiconductor material layer of the first substrate in such a way that a region in which the pad opening will be formed is included, and
- a process for forming an insulating material layer over an entire surface including the opening
are performed.

In this case, a configuration in which the insulating material layer is formed by using an insulating material that is included in the insulating film (in other words, a configuration in which a section of the semiconductor material layer is covered with the insulating material that is included in the insulating film) can be employed. Alternatively,
1. a configuration in which a process for forming a protective film on the first electrode is included, and the insulating material layer is formed by using an insulating material that is included in the protective film (a configuration in which the section of the semiconductor material layer is covered with the insulating material that is included in the protective film);
2. a configuration in which a process for forming a color filter on the first electrode is included, and the insulating material layer is formed by using an insulating material that is included in the color filter (a configuration in which the section of the semiconductor material layer is covered with the insulating material that is included in the color filter); or
3. a configuration in which a process for forming a microlens on the first electrode is included, and the insulating material layer is formed by using an insulating material that is included in the microlens (a configuration in which the section of the semiconductor material layer is covered with the insulating material that is included in the microlens)

can also be employed.

Alternatively, a configuration can also be employed in which between the first process and the second process,
- a process for providing, in the semiconductor material layer, an opening having a region that is wider than an exposed region of the pad electrode
is performed.

In a display device and a method for manufacturing the display device, and an electronic device according to the present disclosure (hereinafter, these are simply referred to as the present disclosure in some cases), a substrate in which a semiconductor material layer has been formed on a substrate of glass or the like, or a substrate that includes a semiconductor material such as silicon can be used as a first substrate or a second substrate. A circuit element such as a transistor can be configured, for example, by machining a semiconductor material layer or appropriately forming a transistor or the like in a well that is provided in a substrate that includes a semiconductor material.

As described above, a light-emitting part includes a first electrode, an organic layer, and a second electrode. For example, the first electrode is an anode electrode that is used to inject a hole into the organic layer, and the second electrode is a cathode electrode that is used to inject electrons into the organic layer. In the case of a top emission type in which light generated in the organic layer is emitted toward the cathode electrode, the first electrode has light reflection property, and the second electrode has light transmission property.

It is preferable that an electrode having light reflection property have a high reflectance for a light-emitting wavelength of the organic layer, and the electrode can be formed by using, for example, a metal material including a metal simple substance, such as chromium (Cr), gold (Au), platinum (Pt), nickel (Ni), copper (Cu), molybdenum (Mo), tungsten (W), titanium (Ti), or tantalum (Ta), or an alloy. Note that the electrode may have a single-layer structure, or may have a layered structure.

Furthermore, an electrode having light transmission property can be configured by using a transparent conductive material, such as indium tin oxide (ITO, including Sn-doped $In_2O_3$, crystalline ITO, and amorphous ITO) or indium zinc oxide (IZO). Note that, in some cases, a metal film that has been made thinner to have light transmission property can also be used.

Various wiring lines or the like that are used in the display device can be formed, for example, by combining a well-known film forming method, for example, physical vapor deposition (PVD) such as vacuum deposition or sputtering, various types of chemical vapor deposition (CVD), or the like with a well-known patterning method, for example, etching, lift-off, or the like.

An insulating layer, an insulating film, or the like that is used in the display device can be formed by using a well-known insulating material, for example, an inorganic material such as silicon oxide, silicon nitride, or silicon oxynitride, or an organic material such as polyimide.

The display device may be configured to display a monochromatic image, or may be configured to display a color image. As a value of a resolution of the display device, some examples of a resolution for an image, such as U-XGA (1600, 1200), HD-TV (1920, 1080), Q-XGA (2048, 1536), (3840, 2160), or (7680, 4320), can be provided. However, these values are not restrictive.

The organic layer can have, for example, a structure in which a hole injection layer, a hole transportation layer, a light-emitting layer, an electron transportation layer, and an electron injection layer have been sequentially stacked. A hole transportation material, a hole transportation material, an electron transportation material, and an organic light-emitting material that are included in the organic layer are not particularly limited, and a well-known material can be used.

In a case where the display device is configured to conduct a color display, a configuration in which a white-light emitting organic layer and a color filter have been combined can be employed. In this configuration, an organic layer including the hole transportation layer, the light-emitting layer, the electron transportation layer, or the like can be made common in a plurality of pixels. Accordingly, the organic layer does not need to be separately coated for each of the pixels. Alternatively, a configuration in which a red-light emitting organic layer, a green-light emitting organic layer, or a blue-light emitting organic layer is separately coated according to pixels can also be employed. In this configuration, as a pixel pitch decreases, separate coating becomes more difficult. Accordingly, in a display device having a pixel pitch of a µm unit, it is preferable that the configuration in which the white-light emitting organic layer and the color filter have been combined be employed.

An organic layer that emits white light can be formed to have a layered structure that includes a red-light emitting layer, a green-light emitting layer, and a blue-light emitting layer. Alternatively, the organic layer can be formed to have a layered structure that includes a blue-light emitting layer that emits blue light and a yellow-light emitting layer that emits yellow light, or a layered structure that includes the blue-light emitting layer that emits blue light and an orange-light emitting layer that emits orange light. In these layered structures, white light as a whole is emitted.

A light-emitting material that is included in the light-emitting layer may be fluorescent, or may be phosphorescent. A configuration of the light-emitting material is not particularly limited, and a well-known material, such as a mixture of 4,4-bis(2,2-diphenylvinyn)biphenyl (DPVBi) and 2,6-bis[(4'-methoxydiphenylamino)styryl]-1,5-dicyanonaphthalene (BSN) (emission of red light), a mixture of DPVBi and 4,4'-bis[2-{4-(N,N-diphenylamino)phenyl}vinyl]biphenyl (DPAVBi) (emission of blue light), or a mixture of DPVBi and coumarin 6 (emission of green light), can be used. Furthermore, a light-emitting layer of each color can be configured by appropriately adding a transporting material of a carrier such as an electron or a hole, or the like to the light-emitting material described above.

A hole transporting material is a material that is also used in a hole injection layer that helps injection of a hole into a light-emitting layer, and a well-known material, such as copper phthalocyanine, hexa-aza-triphenylene (HAT), or N,N'-di(1-naphthyl)-N,N'-diphenyl-[1,1'-biphenyl]-4,4'-diamine [α-NPD, can be provided as an example. Furthermore, an electron transporting material is a material that is also used in an electron injection layer that helps injection of an electron into a light-emitting layer, and a well-known material, such as 2,9-dimethyl-4,7-diphenyl-1,10-phenanthroline (BCP), or metal complex or nitrogen-containing heterocyclic derivative of 8-hydroxyquinoline or its derivative (for example, tris(8-quinolinol)aluminum complex, benzimidazole derivative, phenanthroline derivative, or imidazopyridine derivative), can be provided as an example. Examples of a both charge transporting material include a material such as aminostyryl compound, and a material obtained by performing co-deposition on the hole transporting material and the electron transporting material.

A predetermined circuit, such as a source driver, that drives the display device can be configured by using a well-known circuit element. For example, a vertical scanner, a power source, or the like that is illustrated in FIG. 1 can also be configured by using a well-known circuit element.

Furthermore, as an example of an electronic device that includes the display device according to the present disclosure, a forward-viewing-type or projection-type display device, and a variety of electronic devices having an image display function can be provided.

Various conditions herein are not only satisfied in a case where the conditions are strictly established, but are also satisfied in a case where the conditions are substantially established. The presence of a variety of variations generated in designing or manufacturing is allowable. Furthermore, respective drawings used in the description below are schematic, and do not illustrate actual dimensions or a ratio of the actual dimensions.

First Embodiment

A first embodiment relates to a display device and a method for manufacturing the display device, and an electronic device according to the present disclosure.

FIG. 1 is a conceptual diagram of a display device according to the first embodiment.

A display device 1 illustrated in FIG. 1 includes a first substrate 10 that includes a semiconductor material layer in which a transistor that drives a light-emitting part included in a pixel 70 has been formed, and a second substrate 20 that includes a predetermined circuit. The first substrate 10 and the second substrate 20 have been stuck together in such a way that respective joint surfaces JS face each other. Pixels 70 have been formed on the substrates stuck together to be arranged in a two-dimensional matrix shape. Basic configurations of the first substrate 10 and the second substrate 20 will be described later with reference to FIG. 3 described later.

The display device 1 includes a scanning line WS and a feeder line PS1 that are provided for each pixel row that is disposed along a row direction (an X-direction in FIG. 1), and a data line DTL that is provided for each pixel column that is disposed along a column direction (a Y-direction in FIG. 1). Each of the pixels 70 is connected to the scanning line WS and the feeder line PS1, and the data line DTL, and is arranged in a two-dimensional matrix shape including N pixels in the row direction and M pixels in the column direction, N×M pixels in total.

The pixels 70 arranged in the two-dimensional matrix shape are included in a display region (a pixel array) 80 that displays an image. The number of rows of the pixels 70 in the display region 80 is M, and the number of pixels 70 in each row is N.

The respective numbers of scanning lines WS and feeder lines PS1 are M. Pixels 70 in an m-th row (where m=1, 2, . . . , M) are connected to an m-th scanning line WSm and an m-th feeder line $PS1_m$, and are included in a single pixel row. Furthermore, the number of data lines DTL is N. Pixels 70 in an n-th column (where n=1, 2, . . . , N) are connected to an n-th data line $DTL_n$.

Note that the display device 1 includes a common feeder line that is commonly connected to all of the pixels 70, but this is omitted in FIG. 1. For example, a ground potential is steadily supplied as a common voltage to the common feeder line.

The display device 1 further includes a variety of circuits, such as a source driver 110, a vertical scanner 120, or a power source 130, that drive the display region 80. Note that, in the example illustrated in FIG. 1, the vertical scanner 120 and the power source 130 are disposed on respective one end sides of the display region 80, but this is only illustrative.

The display region 80, the source driver 110, the vertical scanner 120, and the power source 130 are integrally configured by the first substrate 10 and the second substrate 20 that have been stuck together. Stated another way, the display device 1 is a driver-circuit integrated display device.

A signal $LD_{Sig}$ that indicates grayscale according to an image to be displayed is input to the source driver 110 from, for example, a not-illustrated device. The signal $LD_{Sig}$ is, for example, a low-voltage digital signal. The source driver 110 is used to generate an analog signal according to a grayscale value of a video signal $LD_{Sig}$ and supply the analog signal as a video signal to the data line DTL. An analog signal to be generated is a signal that has a maximum value that is roughly equal to a value of a power source voltage supplied to the source driver 110, and has an amplitude of about several volts.

The vertical scanner 120 supplies a scanning signal to the scanning line WS. This scanning signal causes pixels 70 to be line-sequentially scanned, for example, in row units. It is described that the power source 130 continuously supplies a predetermined power source voltage $V_{CC}$ (for example, about 10 volts) to the feeder line PS1 regardless of scanning of the scanning line WS. Note that, in some cases, a configuration in which a voltage to be supplied to the feeder line PS1 is switched according to scanning of the scanning line WS may be employed.

The display device 1 is, for example, a display device that conducts a color display, and a group of three pixels 70 that are disposed in the row direction is included in a single color pixel. Accordingly, if it is assumed that N'=N/3, N' color pixels in the row direction and M color pixels in the column direction, N'×M color pixels in total, are arranged in the display region 80.

As described above, a scanning signal of the vertical scanner 120 causes pixels 70 to be line-sequentially scanned in row units. Hereinafter, a pixel 70 located in an m-th row and an n-th column is referred to as an (n, m)th pixel 70.

In the display device 1, N pixels 70 arranged in the m-th row are simultaneously driven. In other words, in N pixels 70 arranged along the row direction, a timing of emitting light or not emitting light is controlled in units of a row that the N pixels 70 belong to. If a display frame rate of the display device 1 is indicated as FR (times/second), a scanning period per row (what is called a horizontal scanning period) at a time when the display device 1 is line-sequentially scanned in row units is less than (1/FR)×(1/M) seconds.

In the display device 1, a signal such as the signal $LD_{Sig}$ described above that indicates grayscale, or a voltage is supplied from the outside. Therefore, a pad region for connection that is used to supply a signal or a voltage is provided.

Figure 2:
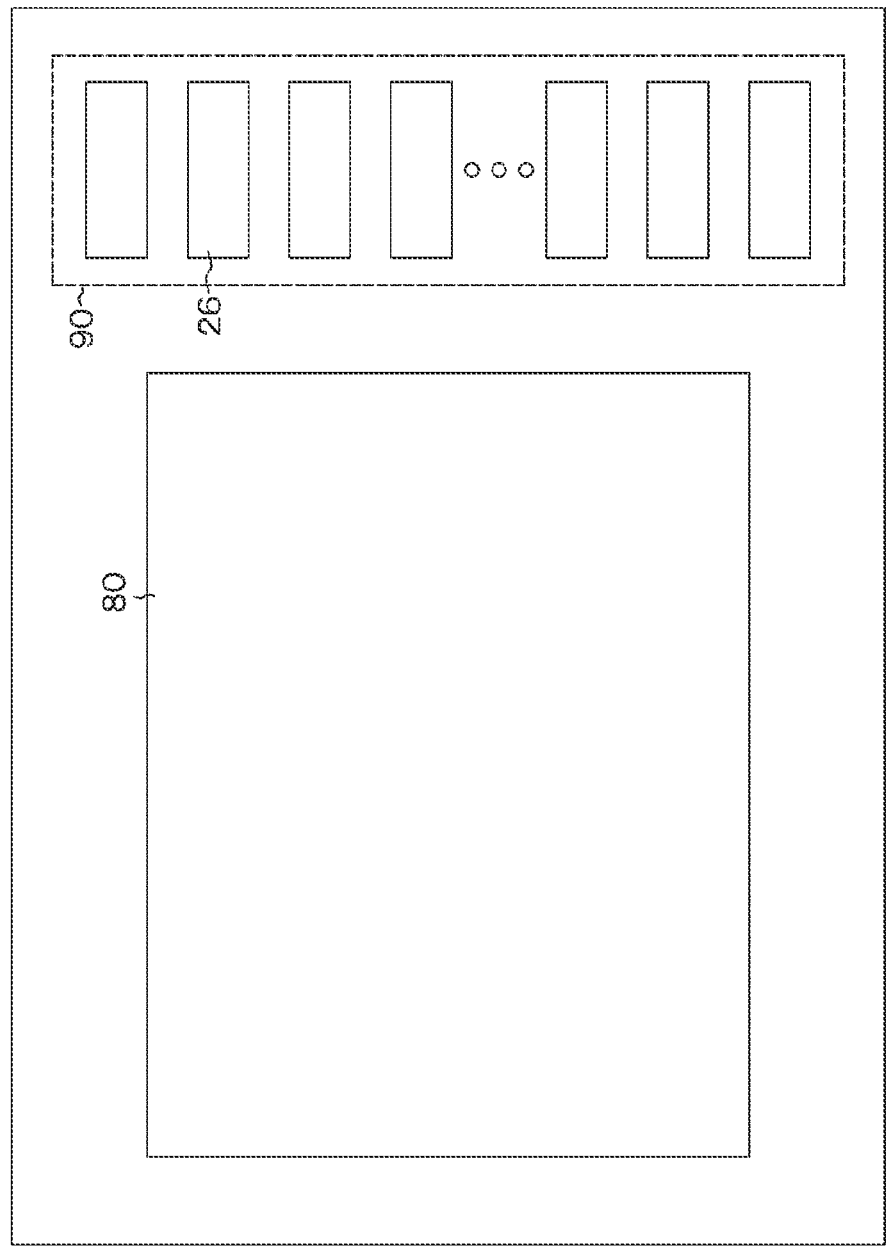
FIG. 2 is a schematic plan view for explaining a disposition relationship between a display region and a pad region.

FIG. 2 is a schematic plan view for explaining a disposition relationship between a display region and a pad region.

A pad region 90 is disposed, for example, along one end of the display region 80, in order not to hinder displaying an image. In the pad region 90, a plurality of pad electrodes 26 for connection is disposed to be spaced apart from each other, for example, at each predetermined interval.

Figure 3:
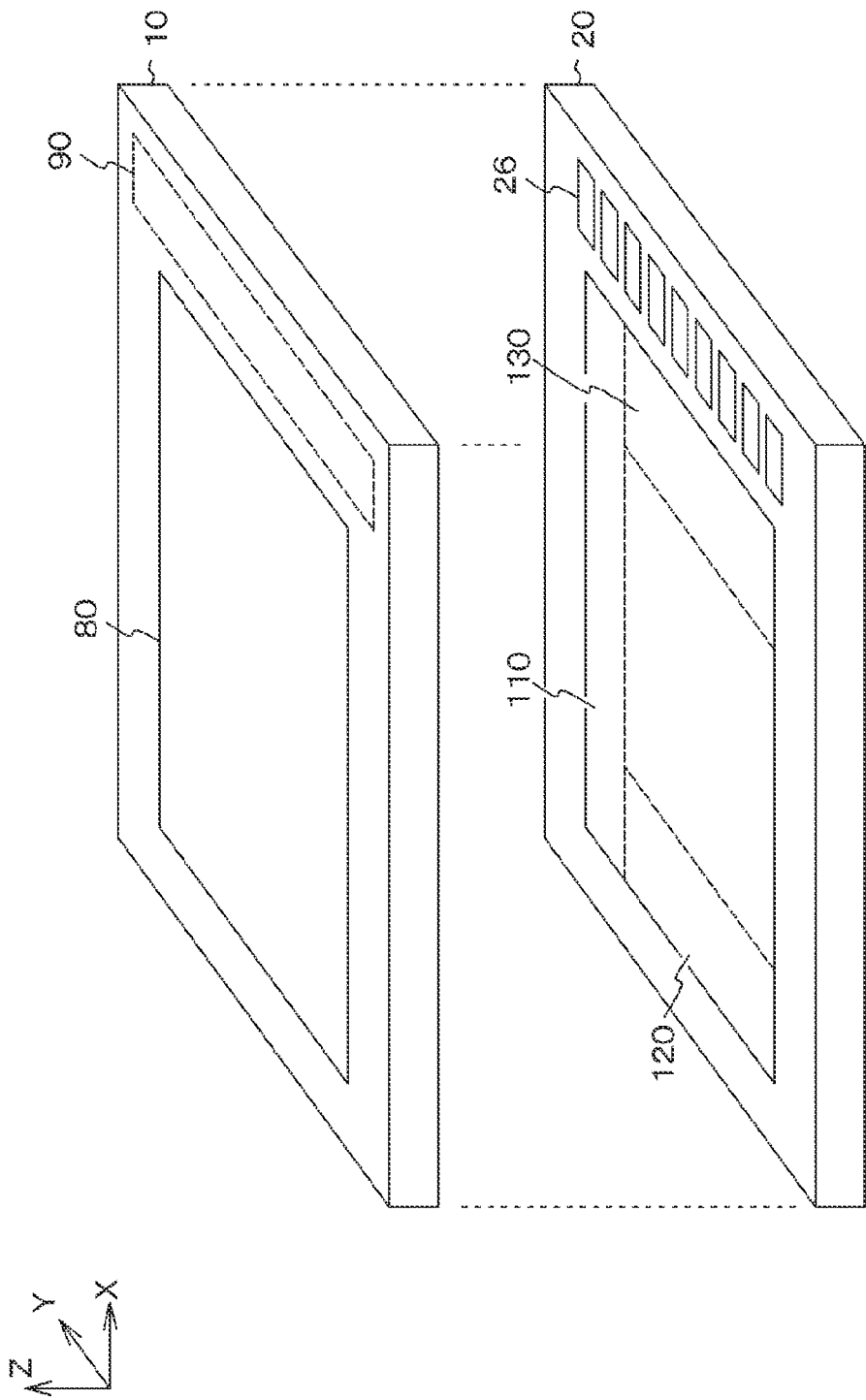
FIG. 3 is a schematic perspective view for explaining a stacked relationship between a first substrate and a second substrate.

FIG. 3 is a schematic perspective view for explaining a stacked relationship between a first substrate and a second substrate.

As illustrated in FIG. 3, the display region 80 has been formed in the first substrate 10, and a predetermined circuit, such as the source driver 110, the vertical scanner 120, or the power source 130, has been provided in the second substrate 20. Therefore, there is an advantage in which a suitable process relating to manufacturing of a transistor that drives a light-emitting part included in the pixel 70 can be selected as a semiconductor element manufacturing process of the first substrate 10, and a suitable process relating to manufacturing of a transistor that is included in a predetermined circuit such as the source driver 110 can be selected as a semiconductor element manufacturing process of the second substrate 20.

Basically, a signal such as a signal $LD_{Sig}$ that indicates grayscale, or a voltage needs to be supplied to a predetermined circuit in the second substrate 20. Therefore, basically, it is preferable that the pad electrode 26 be provided on a side of the second substrate 20. A pad opening is provided to face the pad electrode 26 from a side of the first substrate 10 in such a way that the pad electrode 26 provided in the second substrate 20 is exposed on a bottom surface, but this is omitted in FIG. 3. The pad opening will be described in detail later with reference to FIG. 5 described later, or the like.

An outline of the display device 1 has been described above. Next, details of the pixel 70 are described.

Figure 4:
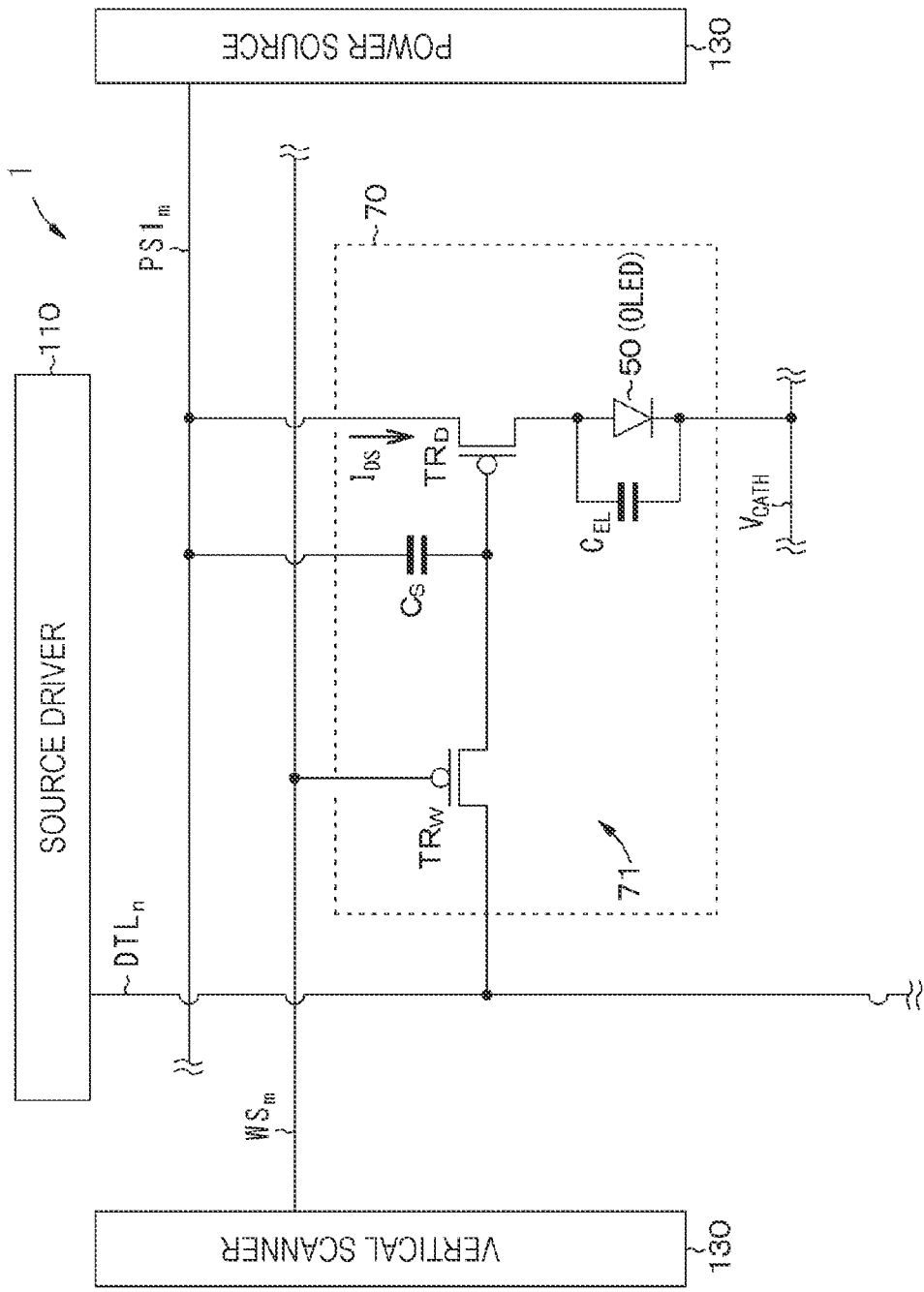
FIG. 4 is a schematic circuit diagram of a pixel.

First, a circuit configuration of the pixel 70 is described. FIG. 4 is a schematic circuit diagram of a pixel. Note that, for convenience of illustration, FIG. 4 illustrates a wire connection relationship of a single pixel 70, and more specifically, an (n, m)th pixel 70.

As illustrated in FIG. 4, the pixel (a display element) 70 includes a light-emitting part 50 of a current driven type and a driving circuit 71 that drives the light-emitting part 50. The driving circuit 71 includes at least a writing transistor $TR_W$ that writes a video signal, and a driving transistor $TR_D$ that causes a current to flow to the light-emitting part 50. These include a p-channel transistor.

The driving circuit 71 further includes a capacity part $C_S$. The capacity part $C_S$ is used to hold a voltage (what is called a gate-source voltage) of a gate electrode relative to a source region in the driving transistor $TR_D$. At the time of light emission of the pixel 70, one source/drain region (a side that is connected to a feeder line PS1 in FIG. 4) of the driving transistor $TR_D$ serves as a source region, and another source/drain region serves as a drain region.

One electrode and another electrode that are included in the capacity part $C_S$ are respectively connected to the one source/drain region and the gate electrode of the driving transistor $TR_D$. The other source/drain region of the driving transistor $TR_D$ is connected to an anode electrode of the light-emitting part 50.

The light-emitting part 50 is a current driven type light-emitting part that has a light emission luminance that changes according to a value of a current that flows. Specifically, the light-emitting part 50 includes an organic electroluminescence light-emitting part. The light-emitting part 50 has a well-known configuration or structure that includes a first electrode (an anode electrode), a hole transportation layer, a light-emitting layer, an electron transportation layer, a second electrode (a cathode electrode), and the like.

Another end (specifically, the second electrode) of the light-emitting part 50 is connected to a common feeder line. A predetermined voltage $V_{CATH}$ (for example, a ground potential) is supplied to the common feeder line. Note that a capacity of the light-emitting part 50 is denoted by the reference sign $C_{EL}$. In a case where the capacity $C_{EL}$ of the light-emitting part 50 is small and this hinders driving of the pixel 70, and other cases, it is sufficient if an auxiliary capacity that is connected in parallel to the light-emitting part 50 is provided, as needed.

The writing transistor $TR_W$ includes a gate electrode that is connected to a scanning line WS, one source/drain region that is connected to a data line DTL, and another source/drain region that is connected to the gate electrode of the driving transistor $TR_D$. As a result, a signal voltage from the data line DTL is written to the capacity part $C_S$ via the writing transistor $TR_W$.

As described above, the capacity part $C_S$ is connected between the one source/drain region and the gate electrode of the driving transistor $TR_D$. A power source voltage $V_{CC}$ is applied to the one source/drain region of the driving transistor $TR_D$ from the power source 130 via a feeder line $PS1_m$. If a video signal voltage $V_{Sig}$ from the data line DTL is written to the capacity part $C_S$ via the writing transistor $TR_W$, the capacity part $C_S$ holds a voltage such as $(V_{CC}-V_{Sig})$ as a gate-source voltage of the driving transistor $TR_D$. A drain current $I_{ds}$ expressed by Formula (1) described below flows through the driving transistor $TR_D$, and the light-emitting part 50 emits light at a luminance according to a current value.

$$I_{ds}=k\cdot\mu\cdot((V_{CC}-V_{Sig})-V_{th})^2 \quad (1)$$

Note that it is assumed that:
$\mu$: effective mobility;
L: channel length;
W: channel width;
$V_{th}$: threshold voltage;
$C_{ox}$: (relative permittivity of gate insulating layer)×(permittivity of vacuum)/(thickness of gate insulating layer); and $$k=(½)\cdot(W/L)\cdot C_{ox}.$$

Note that the configuration described above of the driving circuit 71 is only an example. In practice, the driving circuit can have a variety of configurations.

Figure 5:
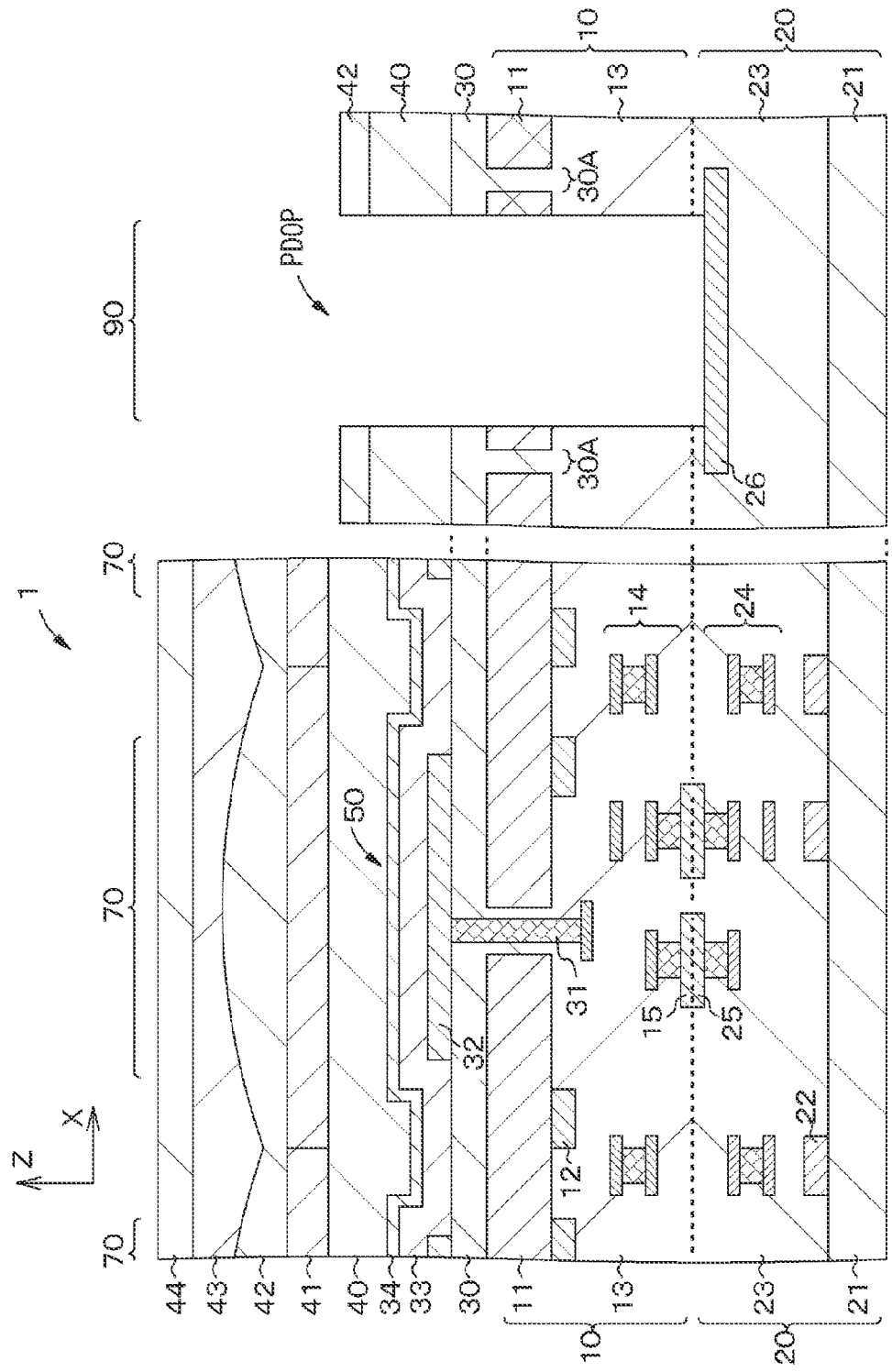
FIG. 5 is a schematic partial sectional view of a portion that includes a pixel in the display region, and a portion of the pad region.

The circuit configuration of the pixel 70 has been described above. Next, a stereoscopic disposition relationship among various components that are included in the display device 1 is described. FIG. 5 is a schematic partial sectional view of a portion that includes a pixel in the display region, and a portion of the pad region.

A first connection electrode 15 is provided on a joint surface JS of the first substrate 10, and a second connection electrode 25 is provided on a joint surface JS of the second substrate 20. Then, the first connection electrode 15 and the second connection electrode 25 are metal-jointed on the joint surfaces JS.

The second substrate 20 includes a semiconductor material layer 21, an interlayer insulating layer 23, a pad electrode 26, and the like. A transistor that is included in a predetermined circuit, such as the source driver 110, the vertical scanner 120, or the power source 130, has been formed on the semiconductor material layer 21. The reference sign 24 denotes a variety of wiring layers, and the reference sign 22 denotes a gate electrode or the like of a transistor that is included in a predetermined circuit. Note that a wiring layer 24 or an electrode 22 is schematically illustrated. Furthermore, in practice, the interlayer insulating layer 23 includes a plurality of layers. For convenience of illustration, in the drawing, the interlayer insulating layer 23 is illustrated as a single layer.

The first substrate 10 includes a semiconductor material layer 11, an interlayer insulating layer 13, and the like. Various transistors that are included in the driving circuit 71 described above have been formed in the semiconductor material layer 11. The reference sign 14 denotes a variety of wiring layers, and the reference sign 12 denotes a gate electrode or the like of a transistor that is included in the driving circuit 71. Note that a wiring layer 14 or an electrode 12 is schematically illustrated. Furthermore, in practice, the interlayer insulating layer 13 includes a plurality of layers. For convenience of illustration, in the drawing, the interlayer insulating layer 13 is illustrated as a single layer.

First, a configuration of a portion that includes the pixel 70 in the display region 80 is described. The pixel 70 has been formed on the first substrate 10. On the first substrate 10, an insulating film 30, a first electrode 32 that has been formed on the insulating film 30 and is disposed in a matrix shape, an organic layer 33 that has been formed over an entire surface including an upper side of the first electrode 32, and a second electrode 34 that has been formed over an entire surface including an upper side of the organic layer 33 have been formed to be stacked. Then, the light-emitting part 50 includes the first electrode 32, the organic layer 33, and the second electrode 34. The first electrode 32 is connected to a driving circuit provided in the first substrate 10 by a connecting plug 31. On the second electrode 34, a protective film 40, a color filter 41, and a microlens 42 are disposed. Moreover, a counter substrate 44 that includes, for example, glass or the like is disposed via sealing resin 43.

Next, a configuration of a portion of the pad region 90 is described. The first substrate 10 and the second substrate 20 have been stuck together in such a way that respective joint surfaces JS face each other. Then, the pad electrode 26 has been provided on a side of the joint surfaces JS, and has been formed, for example, in the interlayer insulating layer 23 of the second substrate 20. Furthermore, on the first substrate 10, the insulating film 30, the protective film 40, and an insulating material layer that is used to form the microlens (for convenience, the reference sign 42 is used with no change, and the similar is applied to other embodiments) have been stacked. A pad opening PDOP has been provided to face the pad electrode 26 from a side of the first substrate 10 in such a way that the pad electrode 26 provided in the second substrate 20 is exposed on a bottom surface.

The pad opening PDOP has been provided to penetrate the semiconductor material layer 11 of the first substrate 10, and the semiconductor material layer 11 that is located around the pad opening PDOP is sectioned by an insulating structure 30A that has been provided along a circumference of each of the pad openings PDOP to penetrate the semiconductor material layer 11. The insulating structure 30A has been formed by using an insulating material that is included in the insulating film 30, as described in detail with reference to FIGS. 7A, 7B, 8A, 8B, 9, 10, 11, 12, 13, 14, 15, 16, 17, and 18 described later.

Figure 6:
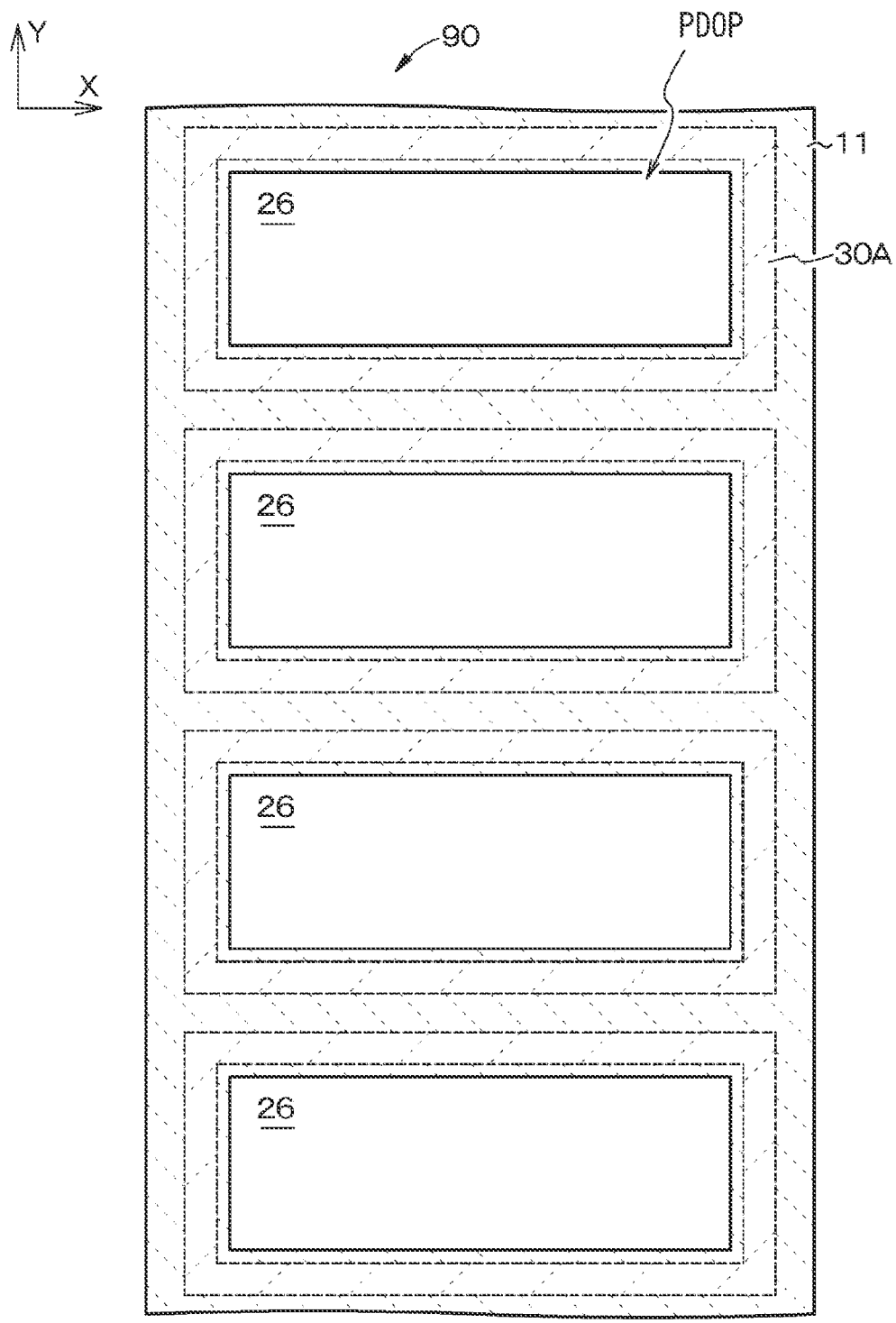
FIG. 6 is a schematic plan view for explaining a disposition relationship among components in the pad region.
Figure 9:
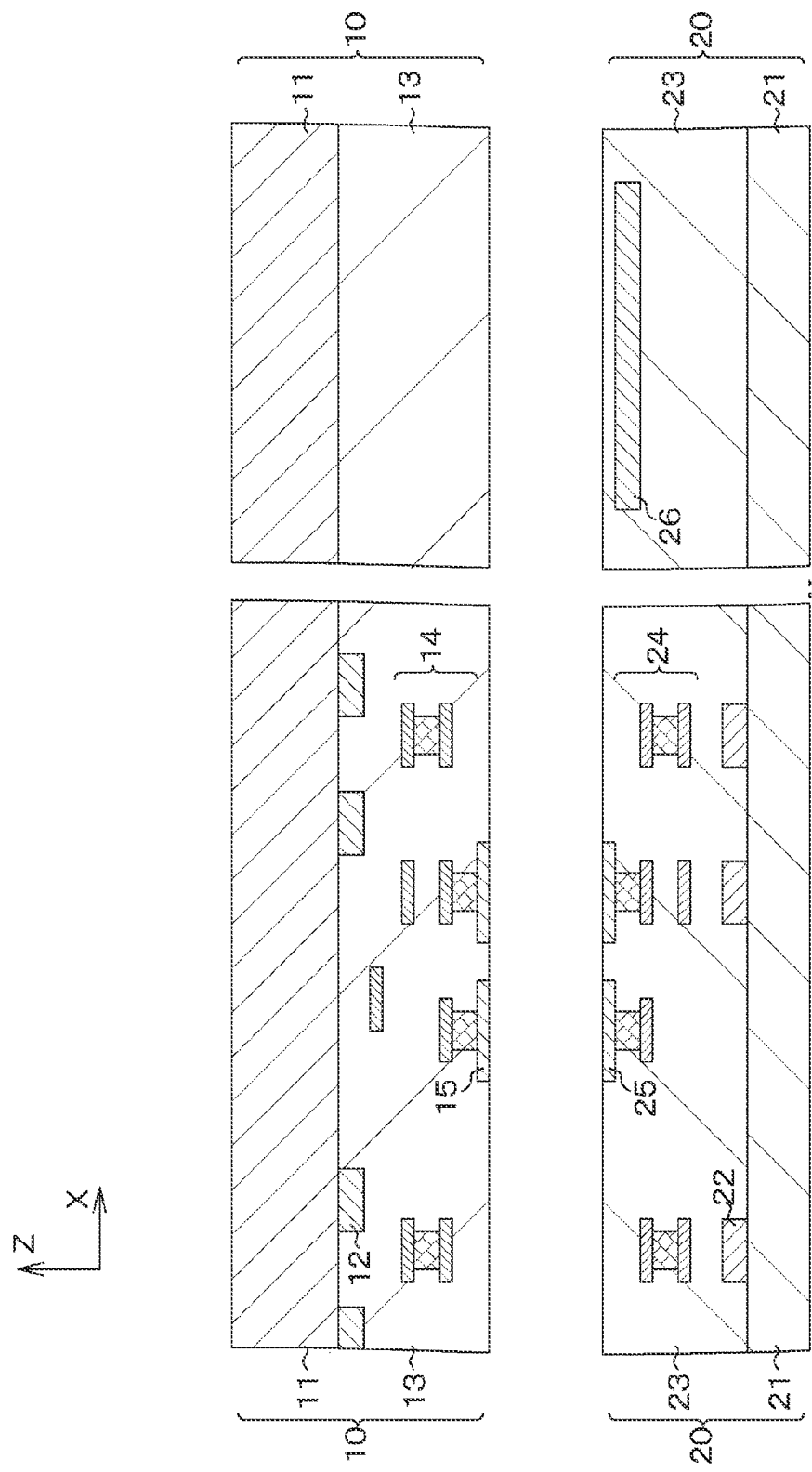
FIG. 9 is a schematic partial end face view that follows FIG. 8B for explaining the method for manufacturing the display device according to the first embodiment.
Figure 10:
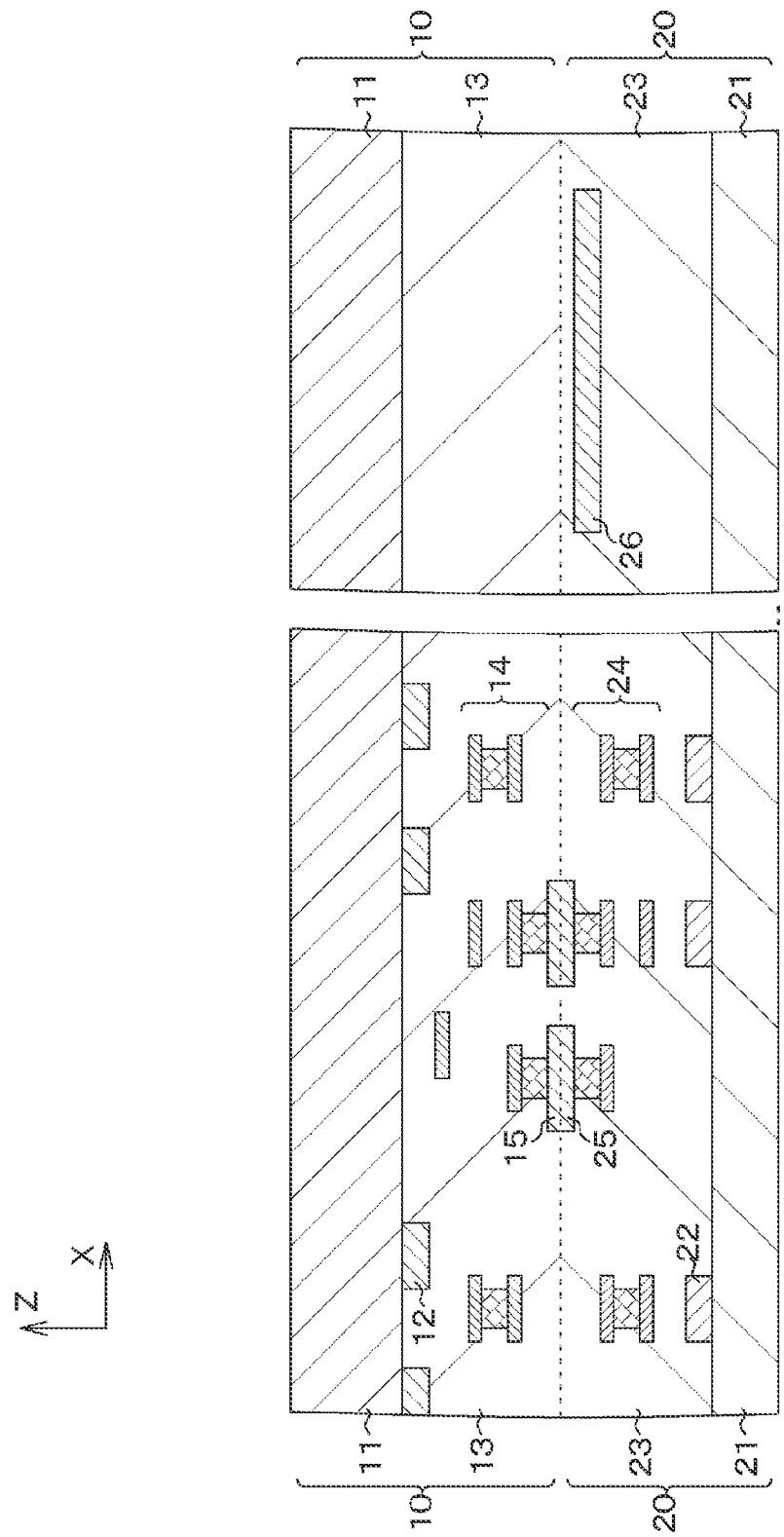
FIG. 10 is a schematic partial end face view that follows FIG. 9 for explaining the method for manufacturing the display device according to the first embodiment.

FIG. 6 is a schematic plan view for explaining a disposition relationship among components in the pad region.

As illustrated in FIG. 6, the insulating structure 30A has been formed to continuously surround the circumference of each of the pad openings PDOP. By doing this, even in a state where a section of the semiconductor material layer 11 is exposed to the opening PDOP, leakage between pad electrodes 26 that can be generated via the semiconductor material layer 11 can be avoided, and electrical reliability can be improved.

Furthermore, characteristics of the organic layer 33 deteriorate due to moisture infiltration or moisture absorption. The insulating structure 30A can prevent moisture infiltration or moisture absorption that can be generated via the semiconductor material layer 11, and therefore a deterioration of the organic layer 33 can be prevented.

The stereoscopic disposition relationship among various components that are included in the display device 1 has been described above. Next, a method for manufacturing the display device 1 is described with reference to FIGS. 7A, 7B, 8A, 8B, 9, 10, 11, 12, 13, 14, 15, 16, 17, and 18 that are schematic partial end face views of a substrate and the like.

A method for manufacturing the display device 1 includes:
a first process for sticking the first substrate 10 and the second substrate 20 together in such a way that respective joint surfaces JS face each other, the first substrate 10 including the semiconductor material layer 11 in which a transistor that drives the light-emitting part 50 has been formed, the second substrate 20 including a predetermined circuit; and
a second process for providing the pad opening PDOP to face the pad electrode 26 from a side of the first substrate 10 in such a way that the pad electrode 26 provided on a side of the respective joint surfaces JS is exposed on a bottom surface. Furthermore, the method for manufacturing the display device 1 includes:
a process for forming the light-emitting part 50 that includes the first electrode 32, the organic layer 33, and the second electrode 34, by stacking on the first substrate 10:
the insulating film 30;
the first electrode 32 that has been formed on the insulating film 30, and is arranged in a matrix shape;
the organic layer 33 that has been formed over an entire surface including an upper side of the first electrode 32; and
the second electrode 34 that has been formed over an entire surface including an upper side of the organic layer 33.

Then, in the method for manufacturing the display device 1, between the first process and the second process,
a process for sectioning the semiconductor material layer 11 that is located around the pad opening PDOP by using the insulating structure 30A that has been provided along a circumference of each of the pad openings PDOP to penetrate the semiconductor material layer 11
is performed. The similar is applied to a second embodiment to a fourth embodiment that are described later.

The method for manufacturing the display device 1 is described in detail below.

[Process-100]

An element required to drive the light-emitting part 50 is formed on the first substrate 10. For example, a transistor or the like is appropriately formed in a well that has been provided in the semiconductor material layer 11 that includes a semiconductor material such as silicon. The semiconductor material layer 11 can be formed by using, for example, polysilicon, and a channel region or a source/drain region can be formed by performing ion implantation or the like. Thereafter, a variety of electrodes 12 or wiring layers 14 are appropriately formed in the interlayer insulating layer 13 (see FIG. 7A).

A wiring line that is included in the electrode 12 or the wiring layer 14 can be formed by using a material such as aluminum (Al), and a connecting plug (a via) that connects wiring lines can be formed by using, for example, tungsten (W) or the like. Furthermore, in some cases, the wiring line or the connecting plug can also be formed by using copper (Cu). The similar is applied to the electrode 22, the wiring layer 24, or the like in the second substrate 20.

Next, the first connection electrode 15 that is used for connection to the second substrate 20 is formed (see FIG. 7B). Here, the first connection electrode 15 has been formed by using copper (Cu).

[Process-110]

A predetermined circuit, such as the source driver 110, the vertical scanner 120, or the power source 130, is formed in the second substrate 20. It is requested that an operation state of each of the circuits be reflected, and for example, transistors having threshold characteristics different from each other be appropriately formed. Similarly to the first substrate 10, for example, a transistor or the like is appropriately formed in a well that has been provided in the semiconductor material layer 21 that includes a semiconductor material such as silicon. Thereafter, a variety of electrodes 22 or wiring layers 24 are appropriately formed in the interlayer insulating layer 23. Furthermore, the pad electrode 26 that is connected to a predetermined circuit is also formed. (See FIG. 8A).

Next, the second connection electrode 25 that is used for connection to the first substrate 10 is formed (see FIG. 8B). Here, the second connection electrode 25 has been formed by using copper (Cu).

[Process-120]

The first substrate 10 and the second substrate 20 are joined. For example, activating using plasma treatment is performed in a state where the first substrate 10 and the second substrate 20 face each other, and therefore surfaces are hydrophilized (see FIG. 9). Then, heat treatment is performed after both have been brought into close contact with each other, and both are stuck together in such a way that respective joint surfaces JS face each other (see FIG. 10). The first connection electrode 15 and the second connection electrode 25 are metal-joined on the joint surfaces JS, and electrical connection or the like of a pixel circuit of the first substrate 10 and a driving circuit of the second substrate 20 is secured. Thereafter, for example, a chemical mechanical polishing (CMP) technique or the like is performed on the semiconductor material layer 11 of the first substrate 10, and film thinning is performed (see FIG. 11). Here, description is provided under the assumption that the semiconductor material layer 11 has been thinned to about 3 μm.

[Process-130]

Figure 12:
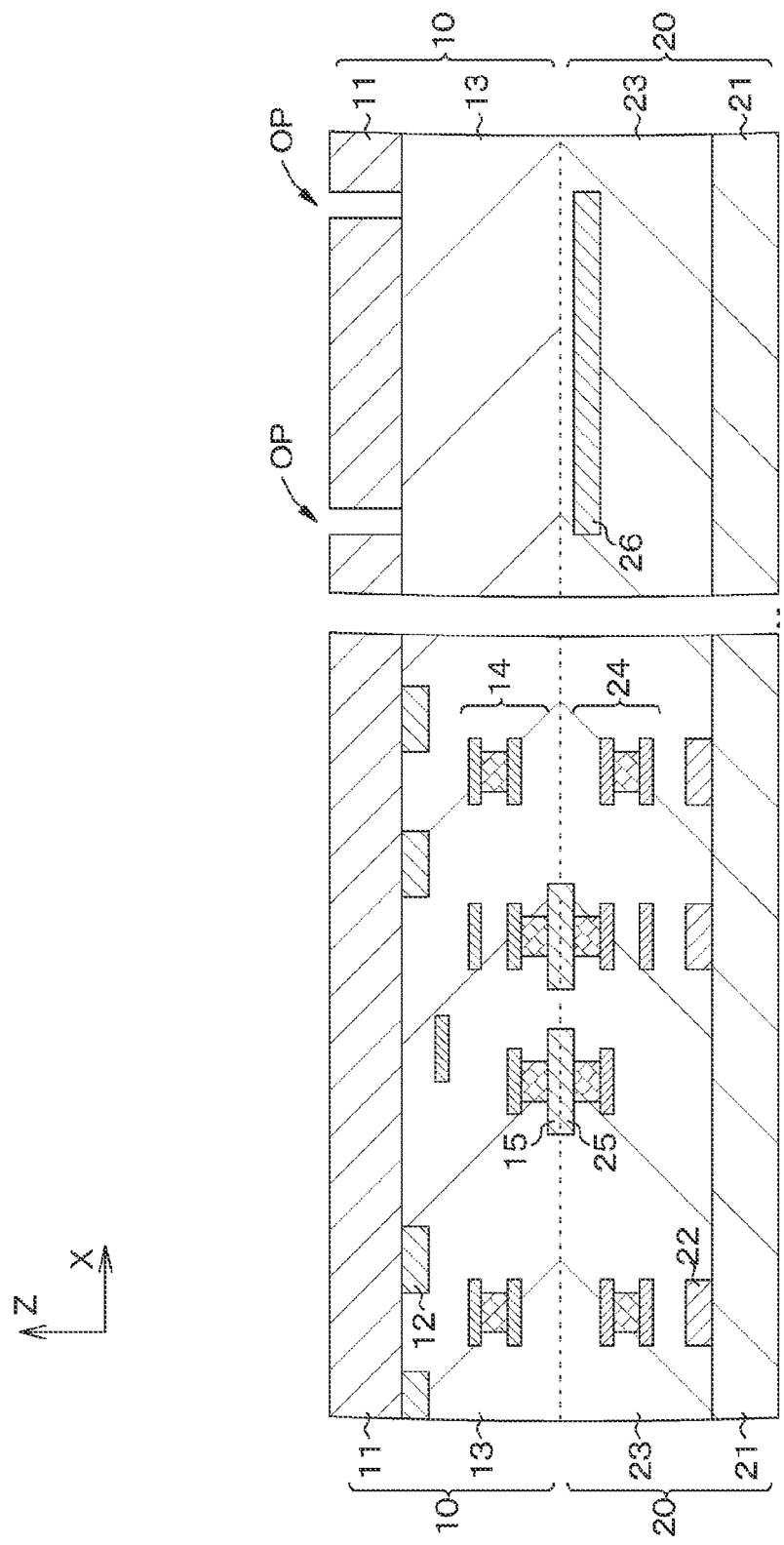
FIG. 12 is a schematic partial end face view that follows FIG. 11 for explaining the method for manufacturing the display device according to the first embodiment.
Figure 13:
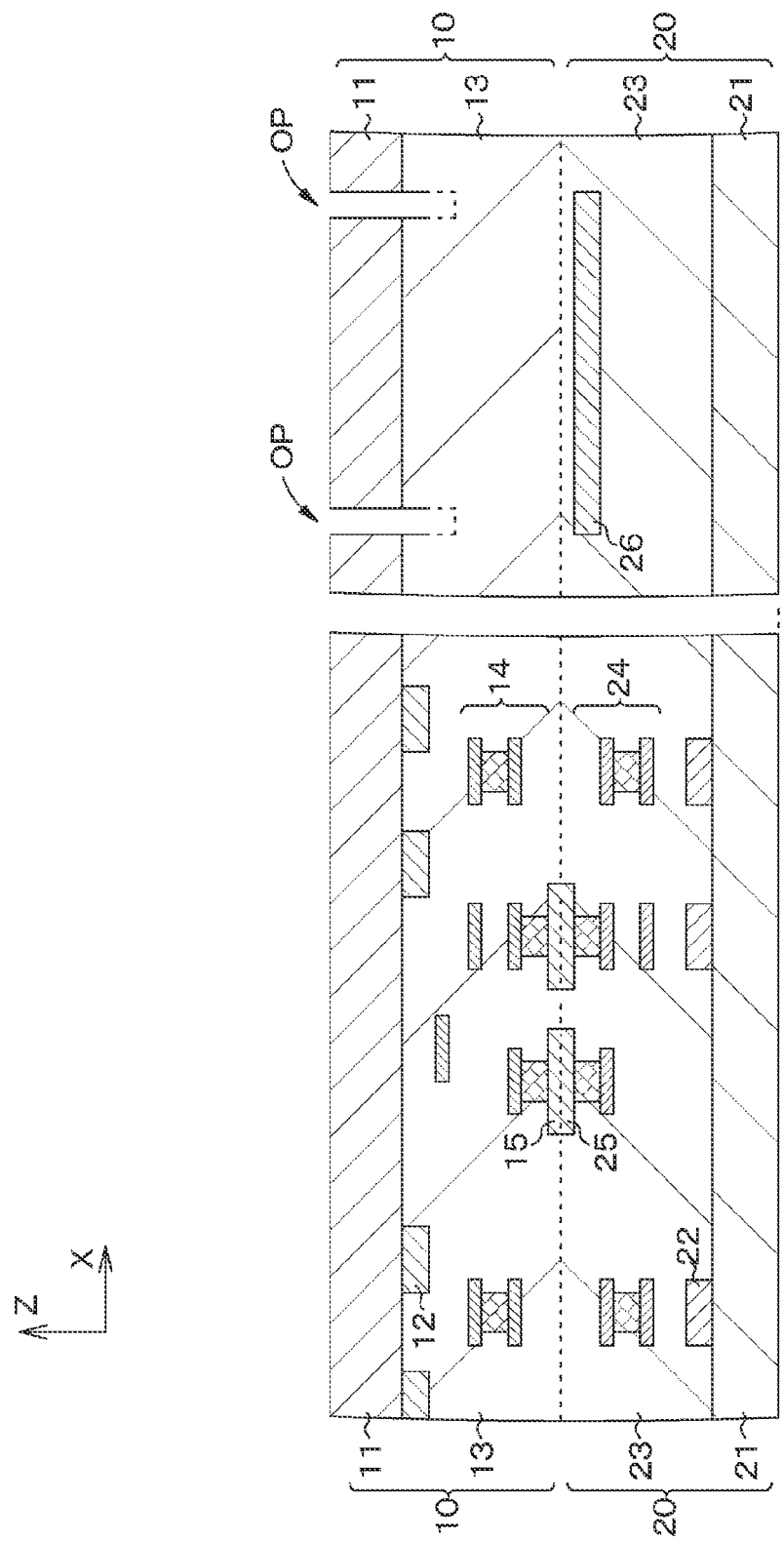
FIG. 13 is a schematic partial end face view that follows FIG. 12 for explaining the method for manufacturing the display device according to the first embodiment.
Figure 14:
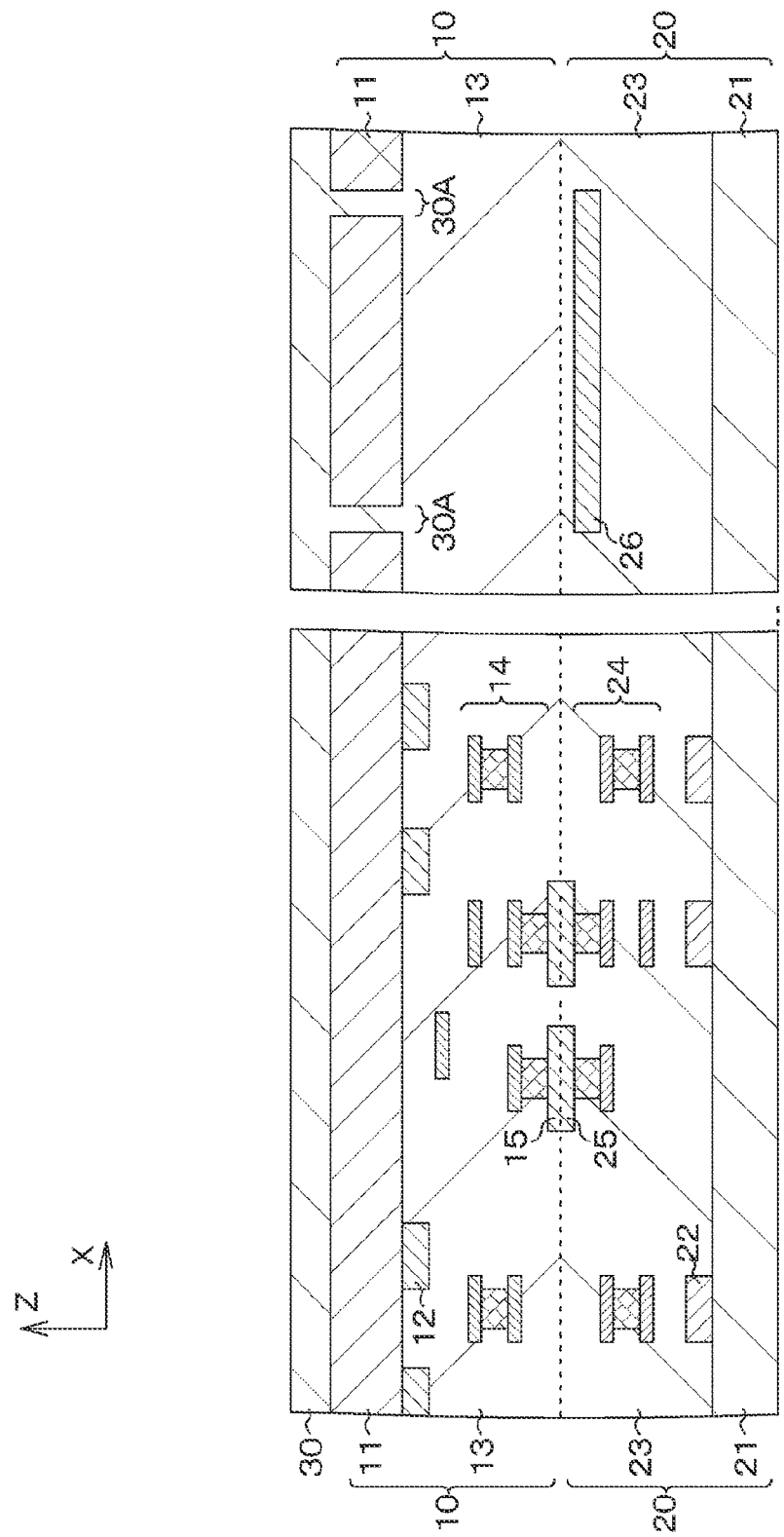
FIG. 14 is a schematic partial end face view that follows FIG. 13 for explaining the method for manufacturing the display device according to the first embodiment.
Figure 15:
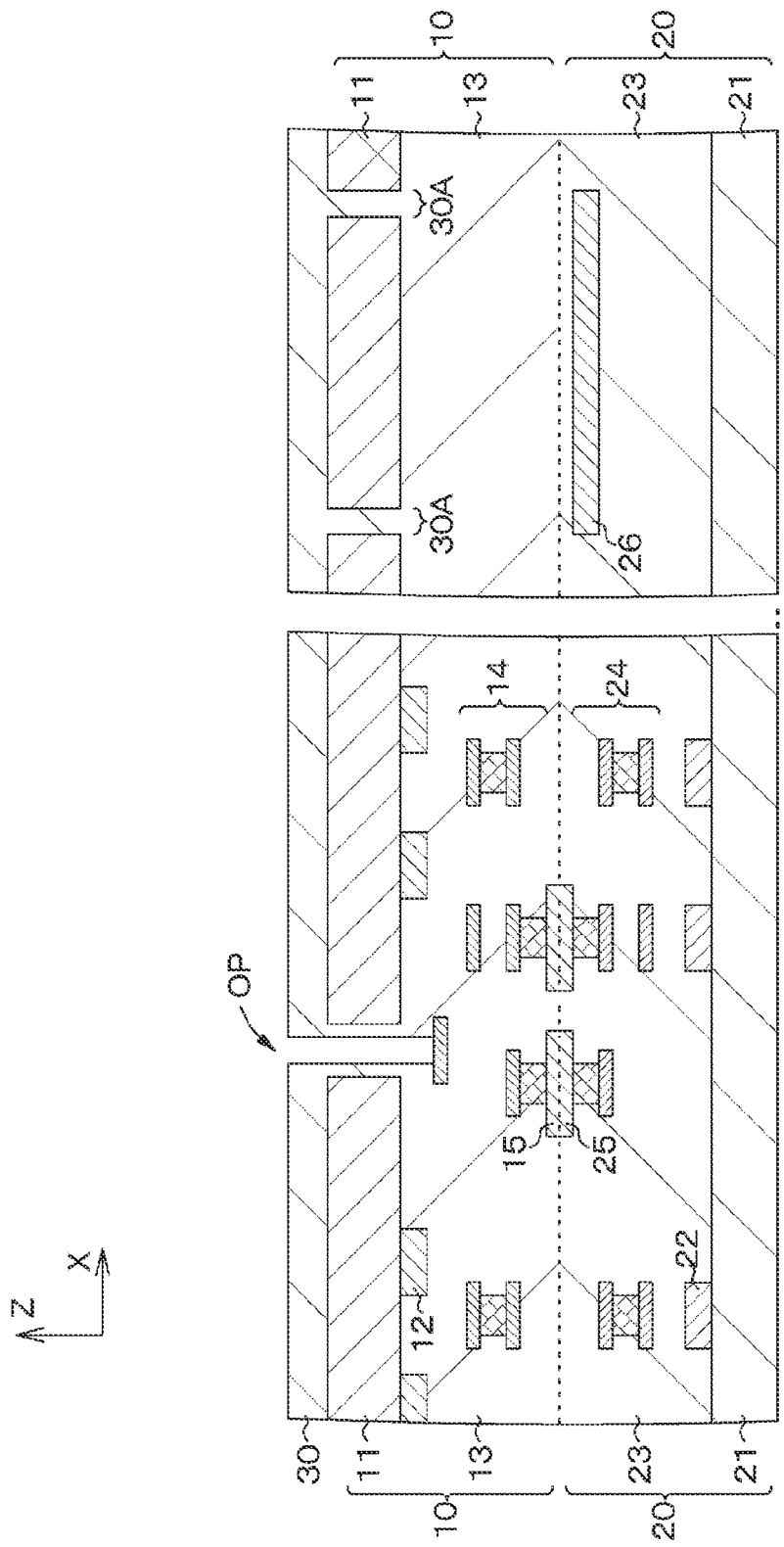
FIG. 15 is a schematic partial end face view that follows FIG. 14 for explaining the method for manufacturing the display device according to the first embodiment.

Next, an insulating structure is formed in a portion that corresponds to the pad region 90. First, a portion that surrounds a portion of the pad opening PDOP of the semiconductor material layer 11 is removed, and an annular opening OP is formed (see FIG. 12). The opening OP can be formed by using a method, such as forming a mask by using a lithographic technique, and then performing dry etching, for example. Here, it has been assumed that a width of a groove is about 200 nanometers. It is preferable that the width of the groove be about 100 to 1000 nanometers, but this depends on specifications of the display device 1. Note that FIG. 12 illustrates an aspect in which only the semiconductor material layer 11 has been removed. However, an aspect in which etching is also performed on the interlayer insulating layer 13 that is located in a lower layer may be employed (see FIG. 13).

Thereafter, the insulating film 30 is formed over an entire surface including an upper side of the semiconductor material layer 11. By doing this, a portion of the annular opening OP is also filled with an insulating material that is included in the insulating film 30, and the insulating structure 30A is formed (see FIG. 14). Due to this insulating structure 30A, not only insulation between the pad electrodes 26 but also insulation between the pad electrode 26 and the semiconductor material layer 11 or the organic layer 33 can be suitably secured.

[Process-140]

Next, the light-emitting part 50 is formed on the first substrate 10.

The connecting plug (the via) 31 that is used to connect the first electrode 32 to a transistor or the like that has been formed in the semiconductor material layer 11 is formed. First, an opening OP is formed in a portion in which the connecting plug 31 will be formed in the first substrate 10. The opening OP can be formed in a portion of the insulating film 30 and the semiconductor material layer 11, by using a method, such as forming a mask by using a lithographic technique, and then performing dry etching, for example. Here, it has been assumed that a diameter of the opening is about 500 nanometers. Thereafter, the insulating film 30 is filled back by about 100 nanometers. Then, for example, dry etching is performed, and a wiring line is exposed in a bottom of the opening OP (see FIG. 15).

Figure 16:
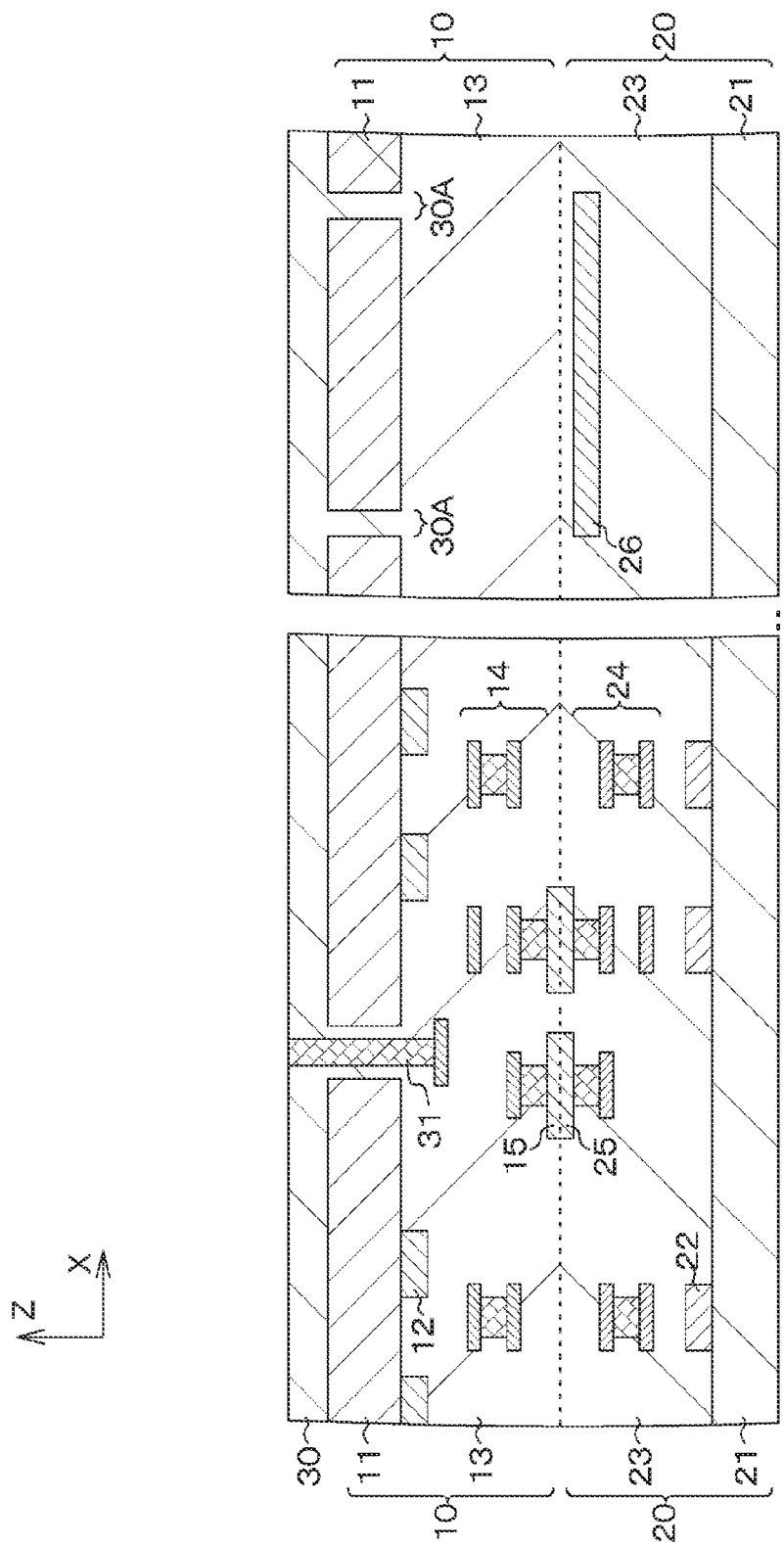
FIG. 16 is a schematic partial end face view that follows FIG. 15 for explaining the method for manufacturing the display device according to the first embodiment.

Next, after a conductive material layer has been formed over an entire surface including the opening OP, smoothing is performed by using the CMP technique or the like, and therefore the connecting plug 31 can be formed (see FIG. 16). Here, after titanium nitride ($TiN_x$) has been formed as barrier metal, tungsten (W) has been poured. Then, titanium nitride and tungsten in a surface layer portion have been removed.

Next, after a conductive material layer that is included in the first electrode 32 has been formed over an entire surface, a first electrode 32 that corresponds to each of the pixels 70 is formed, by using a method such as forming a mask by using the lithographic technique, and then performing dry etching. In the case of a top emission type, it is desirable that the first electrode 32 has a function of an anode electrode and a function of a reflective film, and include a material having a high reflectance and a high hole injection property. The first electrode 32 can be formed by using, for example, a conductive material layer that has been set to have a film thickness of 10 to 1000 nanometers, and includes chromium (Cr) or the like.

Next, in a portion that corresponds to the display region 80, the organic layer 33 including a light-emitting layer is formed over an entire surface including an upper side of the first electrode 32, and then the second electrode 34 is formed on the organic layer 33. Thereafter, in portions that correspond to the display region 80 and the pad region 90, the protective film 40 is formed over an entire surface (see FIG. 17). By performing the processes described above, the light-emitting part 50 in which the first electrode 32, the organic layer 33, and the second electrode 34 have been stacked is formed.

The organic layer 33 can be formed, for example, by sequentially stacking a hole injection layer, a hole transportation layer, a light-emitting layer, an electron transportation layer, and an electron injection layer from a side of the first electrode 32.

The light-emitting layer of the organic layer 33 can be formed, for example, as a light-emitting layer for white light emission. In this case, a combination with a color filter enables a color display to be conducted. A white-light emitting layer can be formed, for example, by sequentially stacking a red-light emitting layer, a light emission separating layer, a blue-light emitting layer, and a green-light emitting layer. Alternatively, the white-light emitting layer can also be formed to have a layered structure that includes the blue-light emitting layer and a yellow-light emitting layer or a layered structure that includes the blue-light emitting layer and an orange-light emitting layer. In these layered structures, white light as a whole is emitted. A material that is included in the organic layer 33 is not particularly limited, and the organic layer 33 can be configured by using a well-known material.

[Process-150]

Next, in a portion that corresponds to the display region 80, the color filter 41 is formed on the protective film 40, and then the microlens 42 is formed over an entire surface. Thereafter, in the portion that corresponds to the display region 80, the counter substrate 44 is stuck via the sealing resin 43 (see FIG. 18).

Figure 18:
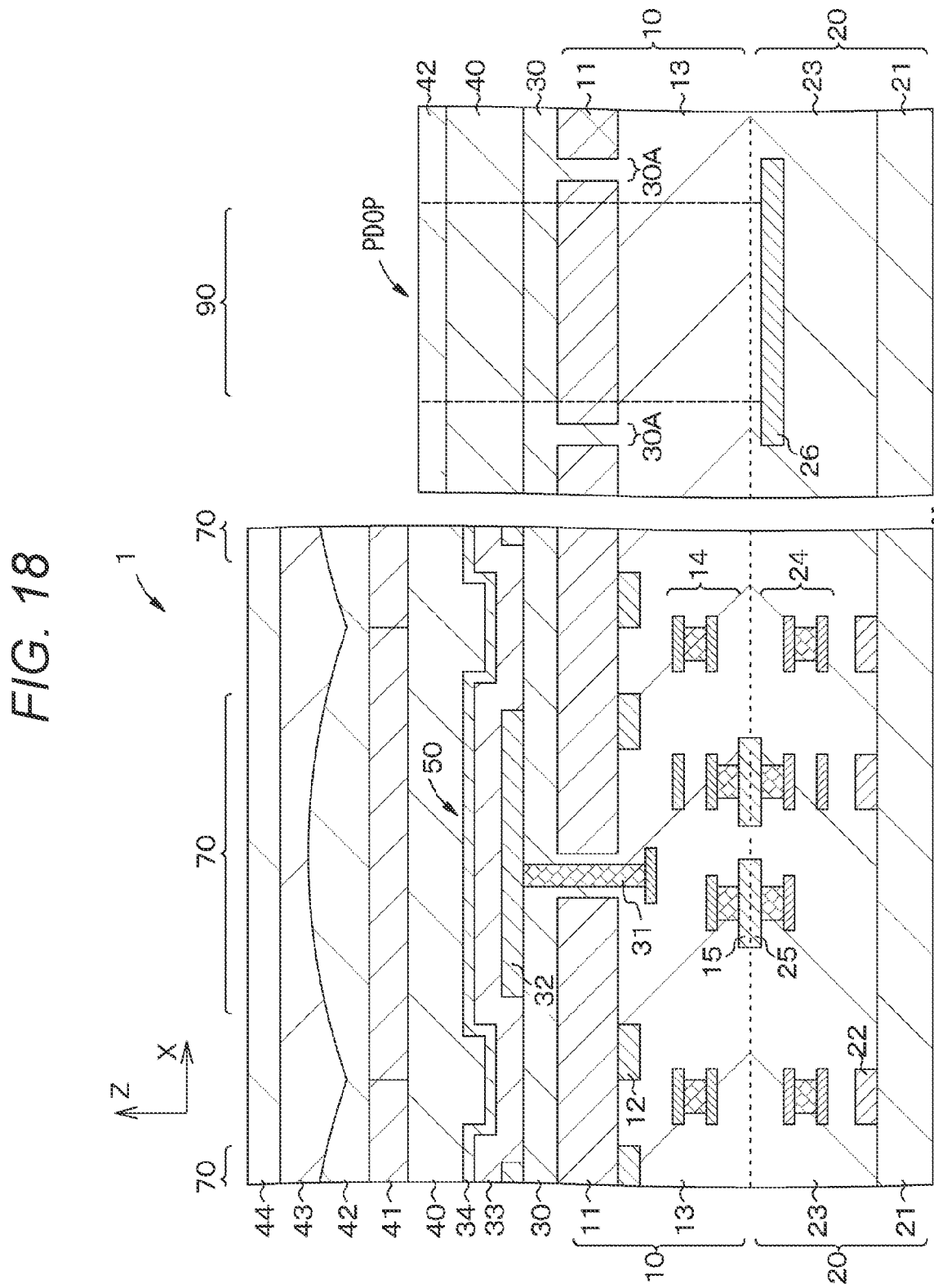
FIG. 18 is a schematic partial end face view that follows FIG. 17 for explaining the method for manufacturing the display device according to the first embodiment.

Next, a portion illustrated with a broken line in FIG. 18 is opened, by using a method, such as forming a mask by using a lithographic technique, and then performing dry etching, and the pad electrode 26 is exposed. By performing the processes described above, the display device 1 illustrated in FIG. 5 can be obtained.

Note that description has been provided under the assumption that the pad electrode 26 is provided on a side of the second substrate 20, but the pad electrode 26 may be provided on a side of the first substrate 10. For example, the pad electrode 26 may be formed in the interlayer insulating layer 13 of the first substrate 10.

Second Embodiment

A second embodiment also relates to a display device and a method for manufacturing the display device, and an electronic device according to the present disclosure.

Figure 19:
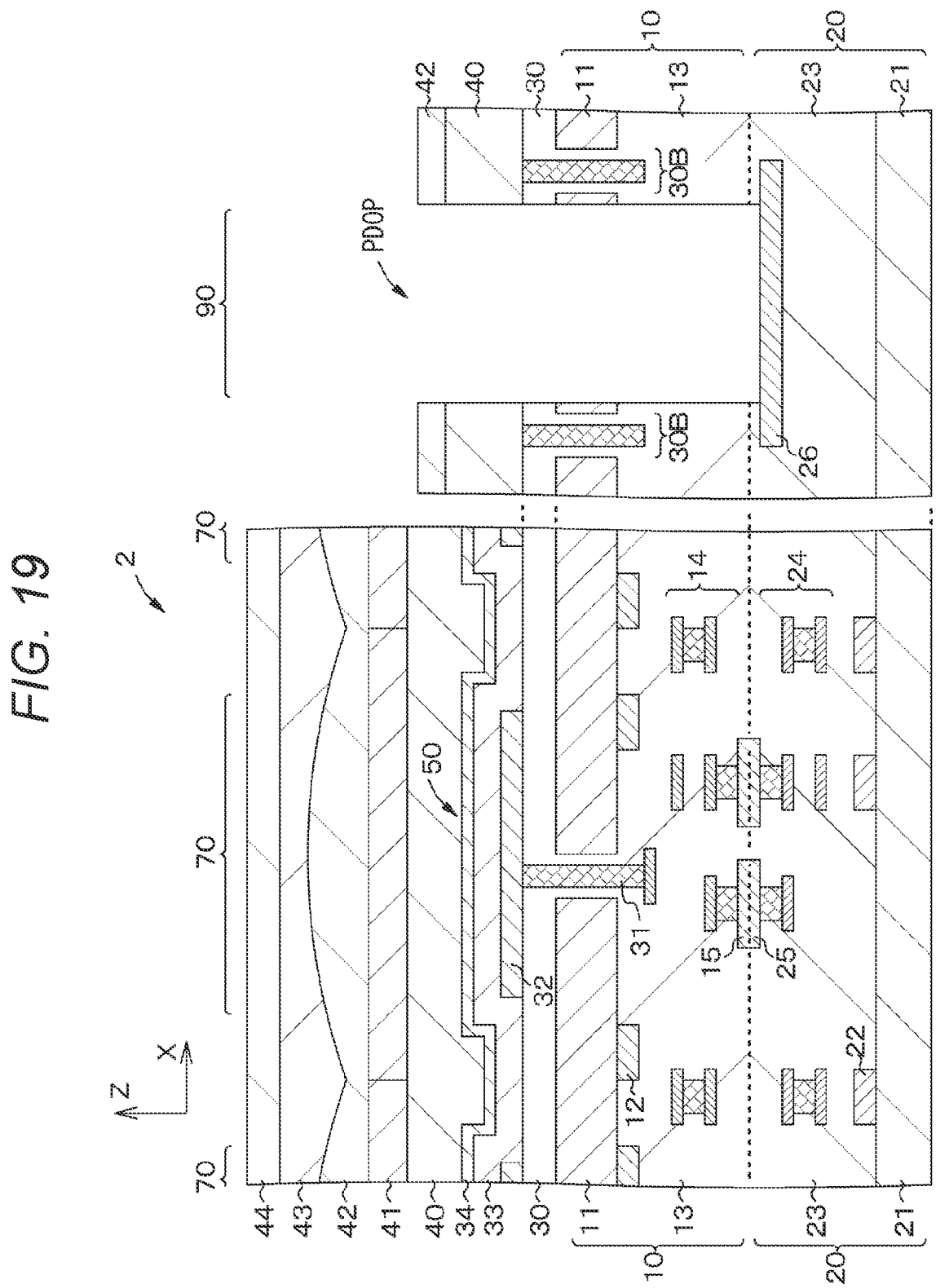
FIG. 19 is a schematic partial sectional view of a portion that includes a pixel in a display region, and a portion of a pad region in a display device according to a second embodiment.

FIG. 19 is a schematic partial sectional view of a portion that includes a pixel in a display region, and a portion of a pad region in a display device according to the second embodiment. A conceptual diagram of the display device according to the second embodiment is obtained by replacing the display device 1 with a display device 2 in FIG. 1. In other embodiments described later, it is sufficient if similar replacement is performed appropriately.

Similarly to the first embodiment, in the display device 2 according to the second embodiment, an insulating structure 30B is formed by using an insulating material that is included in the insulating film 30. However, a difference is that the insulating structure 30B is formed by using a process of forming the connecting plug 31. Therefore, some processes can be omitted in comparison with the first embodiment.

A method for manufacturing the display device 2 is described in detail below.

[Process-200]

Figure 11:
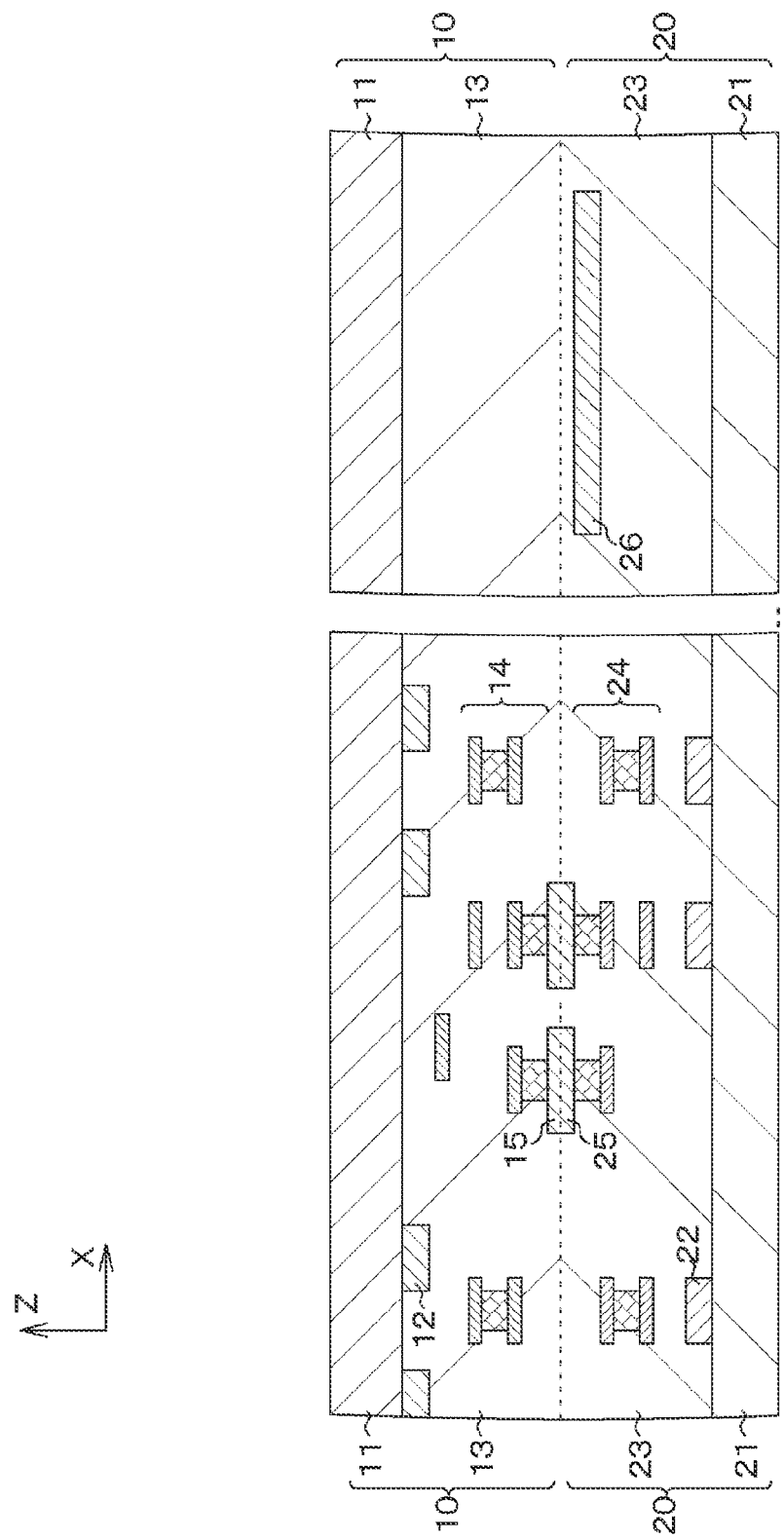
FIG. 11 is a schematic partial end face view that follows FIG. 10 for explaining the method for manufacturing the display device according to the first embodiment.

First, [Process-100] to [Process-120] that have been described in the first embodiment are performed (see FIG. 11). Thereafter, the insulating film 30 is formed over an entire surface (see FIG. 20).

[Process-210]

Figure 21:
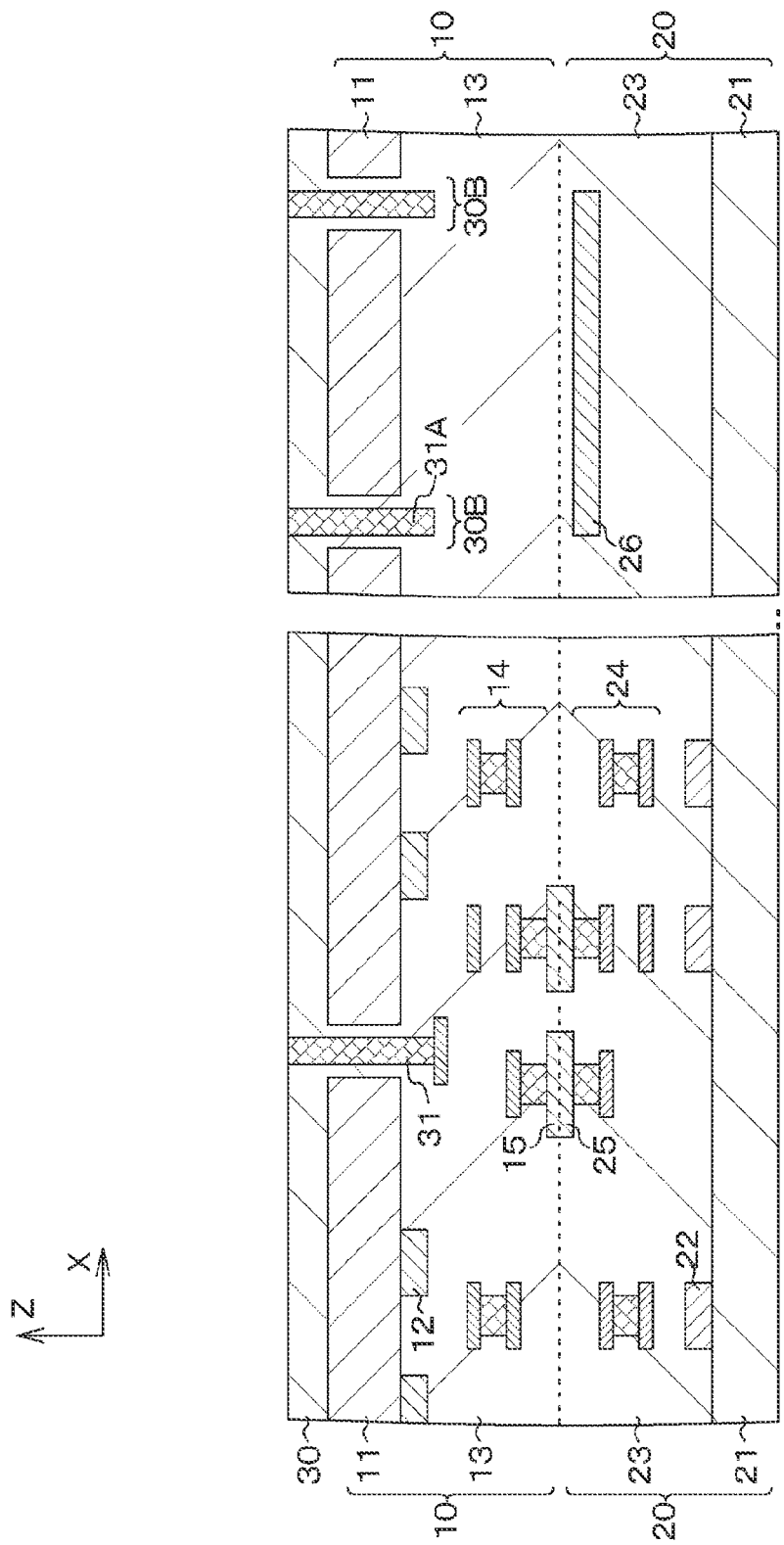
FIG. 21 is a schematic partial end face view that follows FIG. 20 for explaining the method for manufacturing the display device according to the second embodiment.

Next, the connecting plug 31 is formed, and the insulating structure 30B is also formed. First, an opening OP is formed in a portion in which the connecting plug 31 will be formed and a portion in which the insulating structure 30B will be formed in the first substrate 10 (the drawing is omitted). Thereafter, after the insulating film 30 has been filled back by about 100 nanometers, for example, dry etching is performed. Then, after a conductive material layer has been formed over an entire surface including the opening, smoothing is performed by using the CMP technique or the like. Therefore, the connecting plug 31 can be formed, and in addition, the insulating structure 30B into which a plug 31A has been embedded can be formed (see FIG. 21).

[Process-220]

Figure 17:
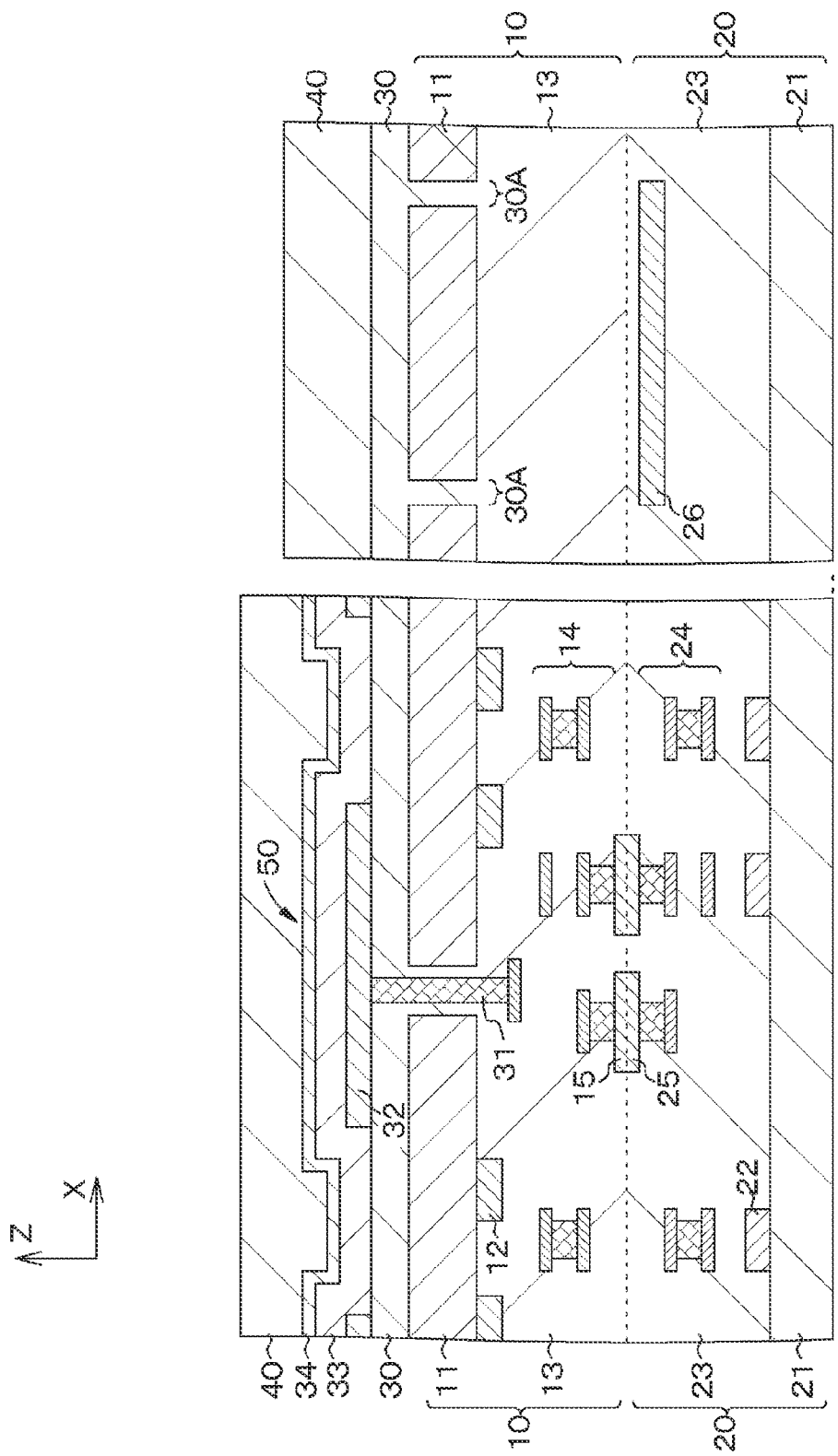
FIG. 17 is a schematic partial end face view that follows FIG. 16 for explaining the method for manufacturing the display device according to the first embodiment.

Next, the display device 2 can be obtained by performing processes that are similar to processes that have been described with reference to FIGS. 17 and 18 in the first embodiment.

Third Embodiment

A third embodiment also relates to a display device and a method for manufacturing the display device, and an electronic device according to the present disclosure.

Figure 22:
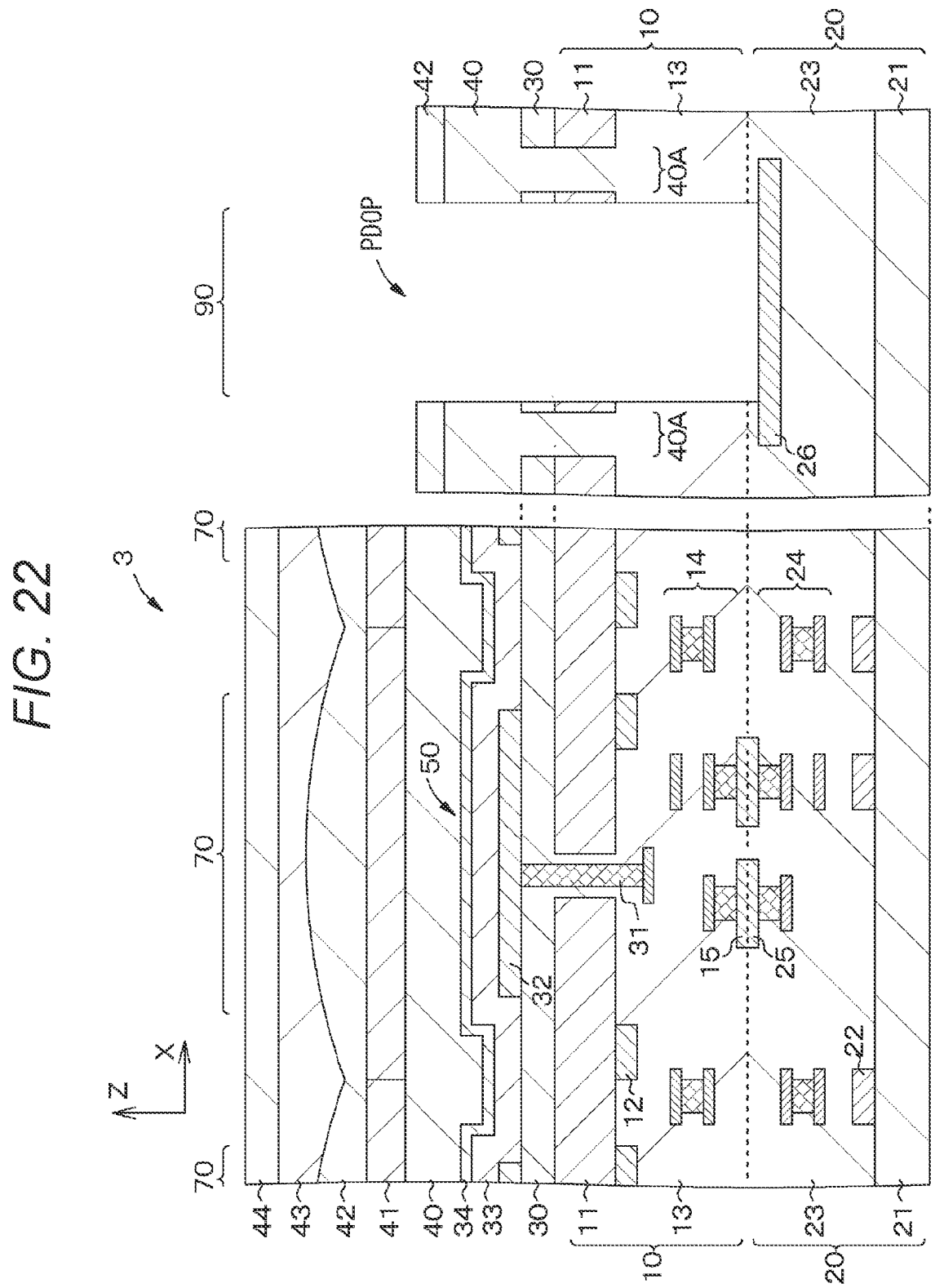
FIG. 22 is a schematic partial sectional view of a portion that includes a pixel in a display region, and a portion of a pad region in a display device according to a third embodiment.

FIG. 22 is a schematic partial sectional view of a portion that includes a pixel in a display region, and a portion of a pad region in a display device according to the third embodiment.

In the first embodiment and the second embodiment, the insulating structures 30A and 30B have been formed by using an insulating material that is included in the insulating film 30. The third embodiment is different from this in that an insulating structure 40A is formed by using an insulating material that is included in the protective film 40 on the second electrode 34.

A method for manufacturing a display device 3 is described in detail below.

[Process-300]

Figure 20:
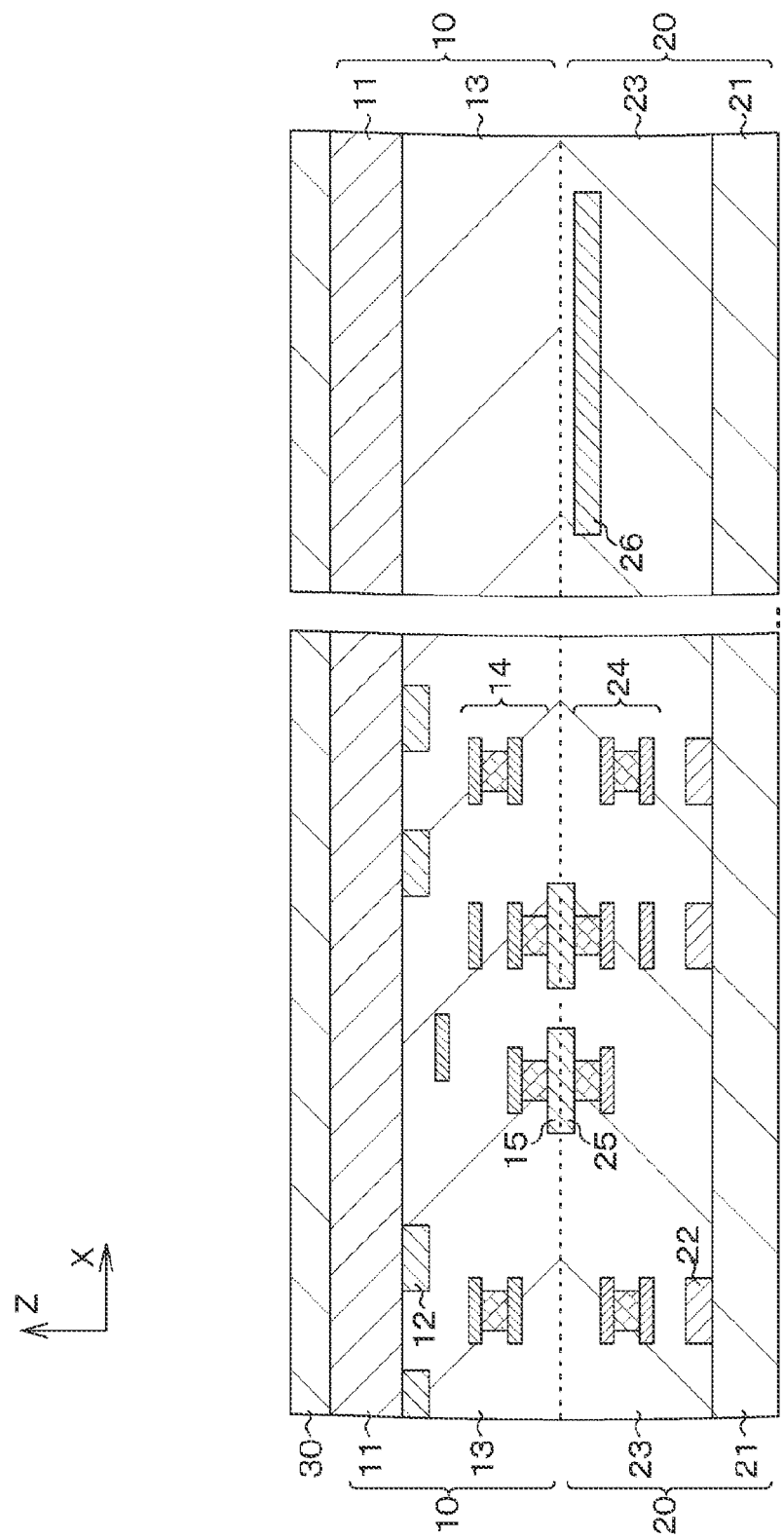
FIG. 20 is a schematic partial end face view for explaining a method for manufacturing the display device according to the second embodiment.

First, [Process-200] described in the second embodiment is performed (see FIG. 20).

[Process-310]

Figure 23:
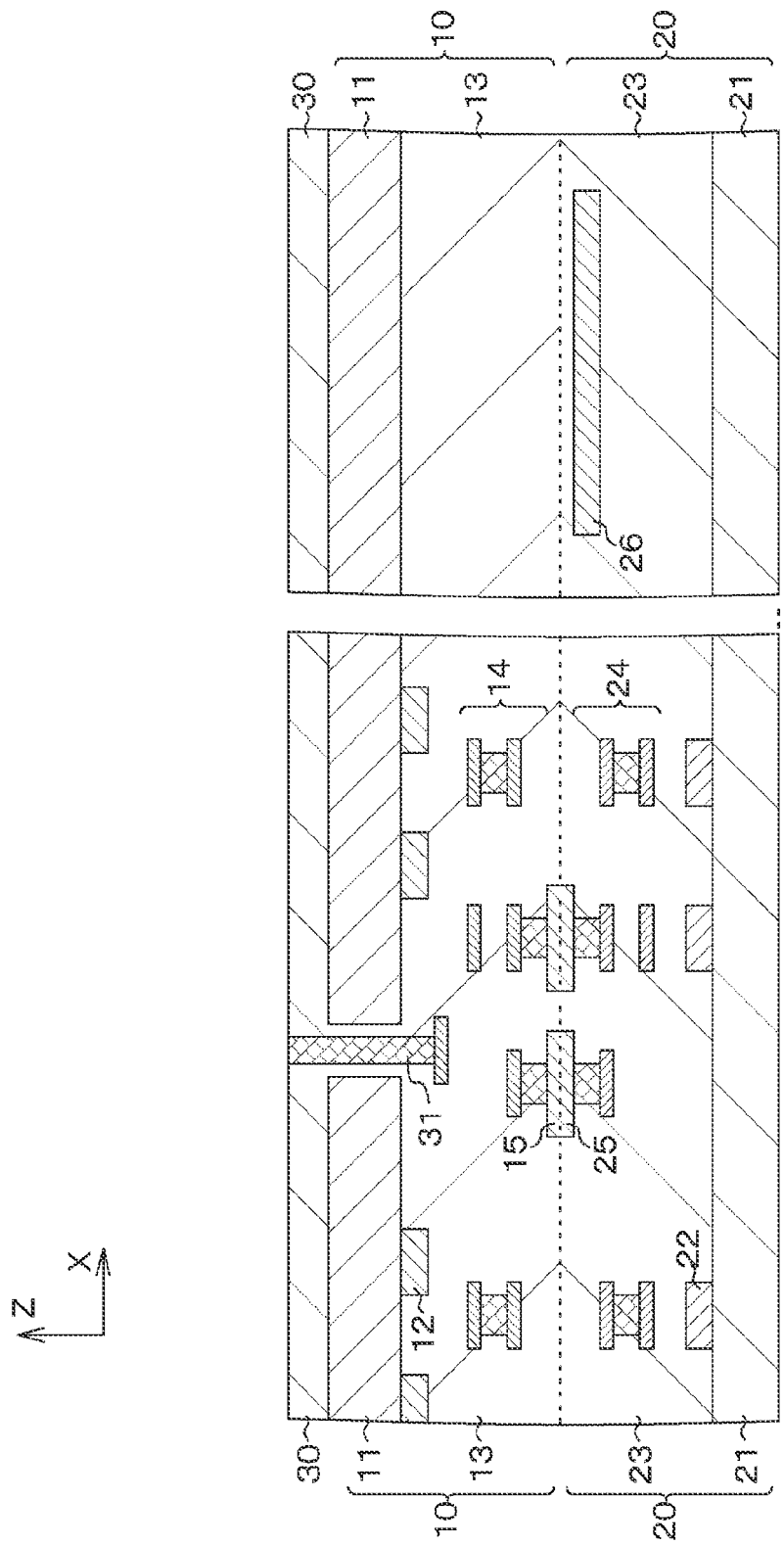
FIG. 23 is a schematic partial end face view for explaining a method for manufacturing the display device according to the third embodiment.

Thereafter, the light-emitting part 50 is formed on the first substrate 10. Similarly to [Process-140] described in the first embodiment, the connecting plug 31 is formed (see FIG. 23). Next, the first electrode 32 that corresponds to each of the pixels 70 is formed. Thereafter, in a portion that corresponds to the display region 80, the organic layer 33 including a light-emitting layer is formed over an entire surface including an upper side of the first electrode 32, and the second electrode 34 is formed on the organic layer 33. By performing the processes described above, the light-emitting part 50 in which the first electrode 32, the organic layer 33, and the second electrode 34 have been stacked is formed (see FIG. 24).

[Process-320]

Figure 25:
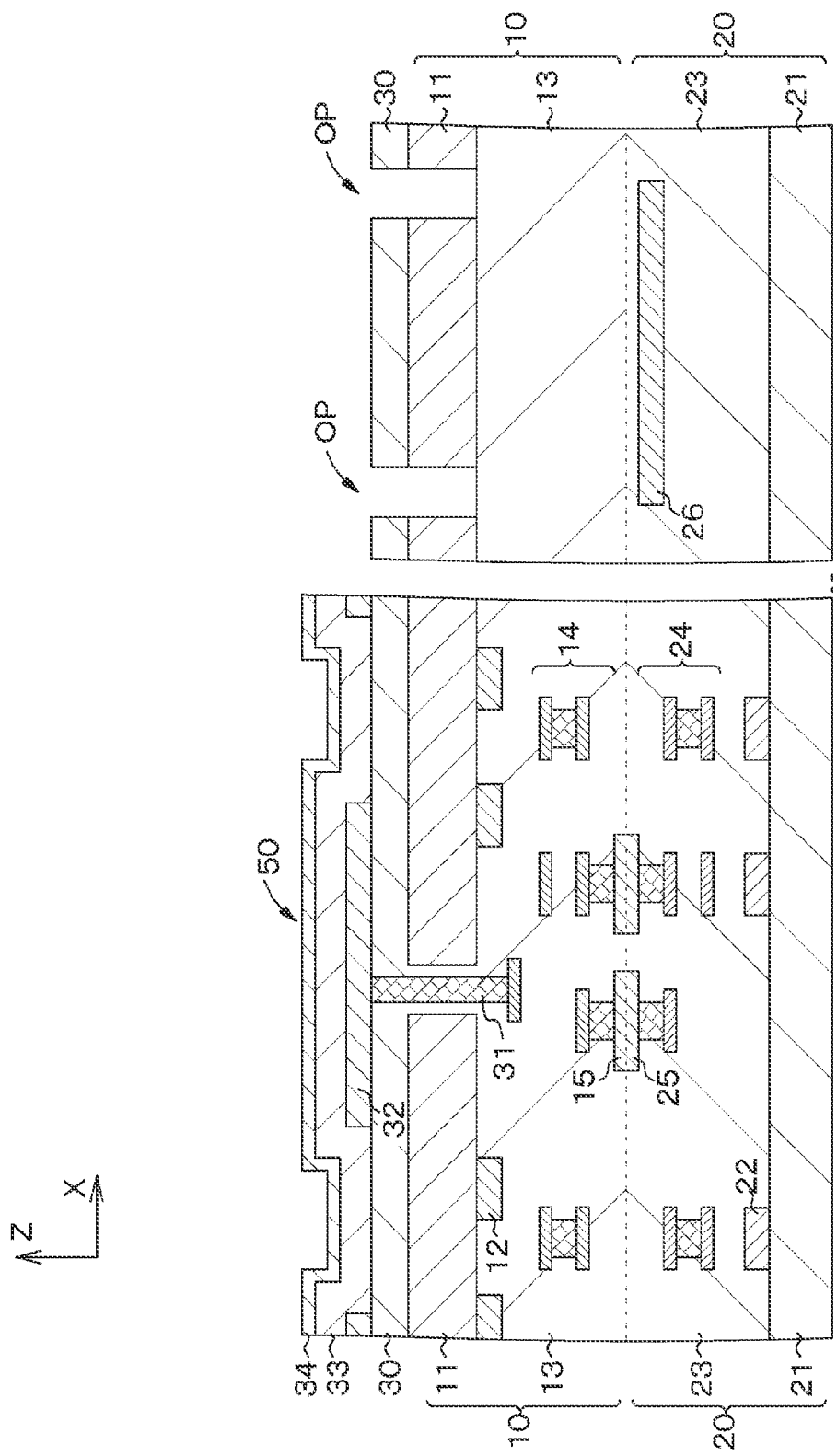
FIG. 25 is a schematic partial end face view that follows FIG. 24 for explaining the method for manufacturing the display device according to the third embodiment.
Figure 26:
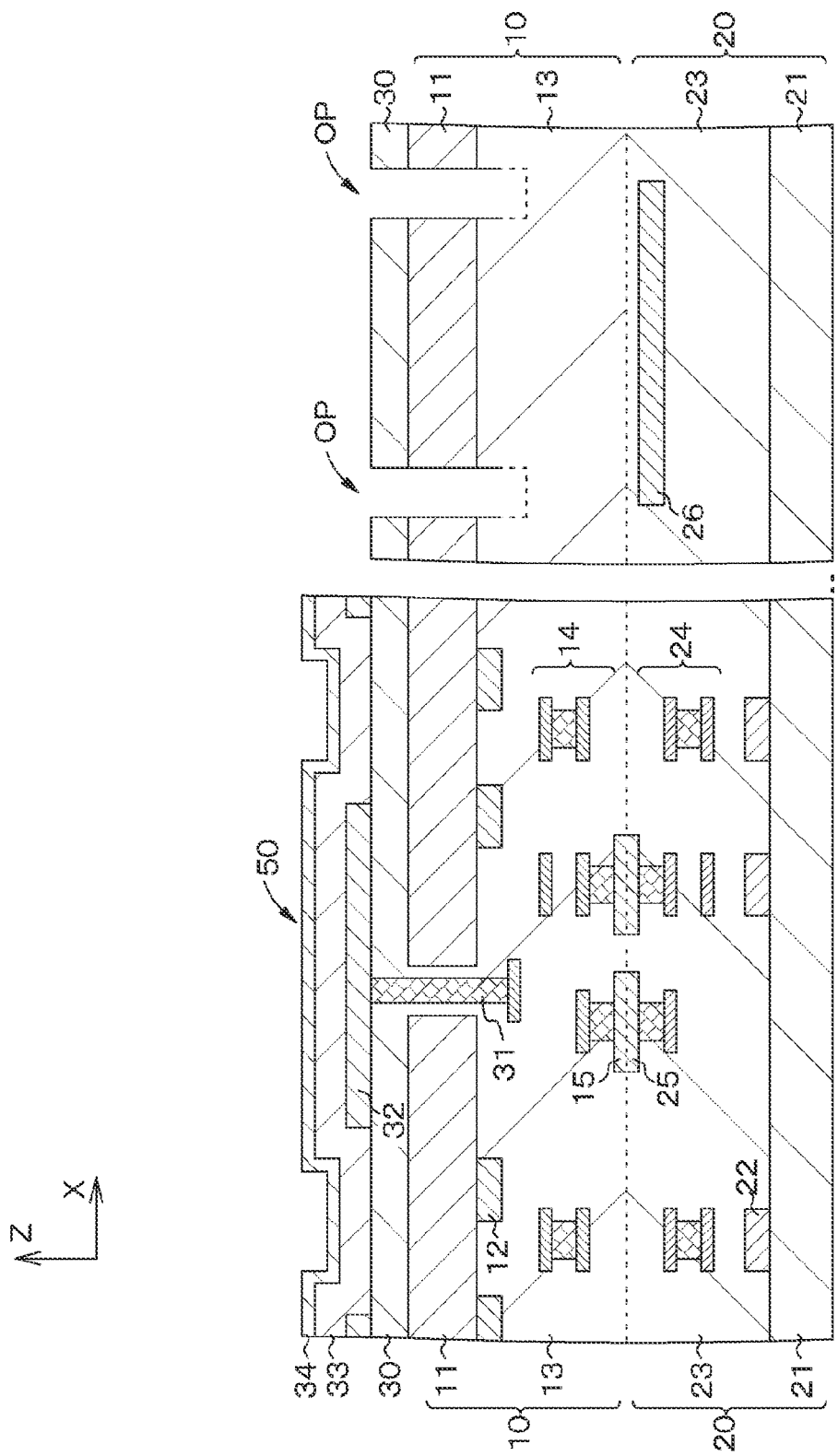
FIG. 26 is a schematic partial end face view that follows FIG. 25 for explaining the method for manufacturing the display device according to the third embodiment.

Next, an insulating structure is formed in a portion that corresponds to the pad region 90. First, a portion that surrounds a portion of the pad opening PDOP of the insulating film 30 and the semiconductor material layer 11 is removed, and an annular opening OP is formed (see FIG. 25). Note that FIG. 25 illustrates an aspect in which only the insulating film 30 and the semiconductor material layer 11 have been removed. However, an aspect in which etching is also performed on the interlayer insulating layer 13 that is located in a lower layer may be employed (see FIG. 26).

[Process-330]

Figure 27:
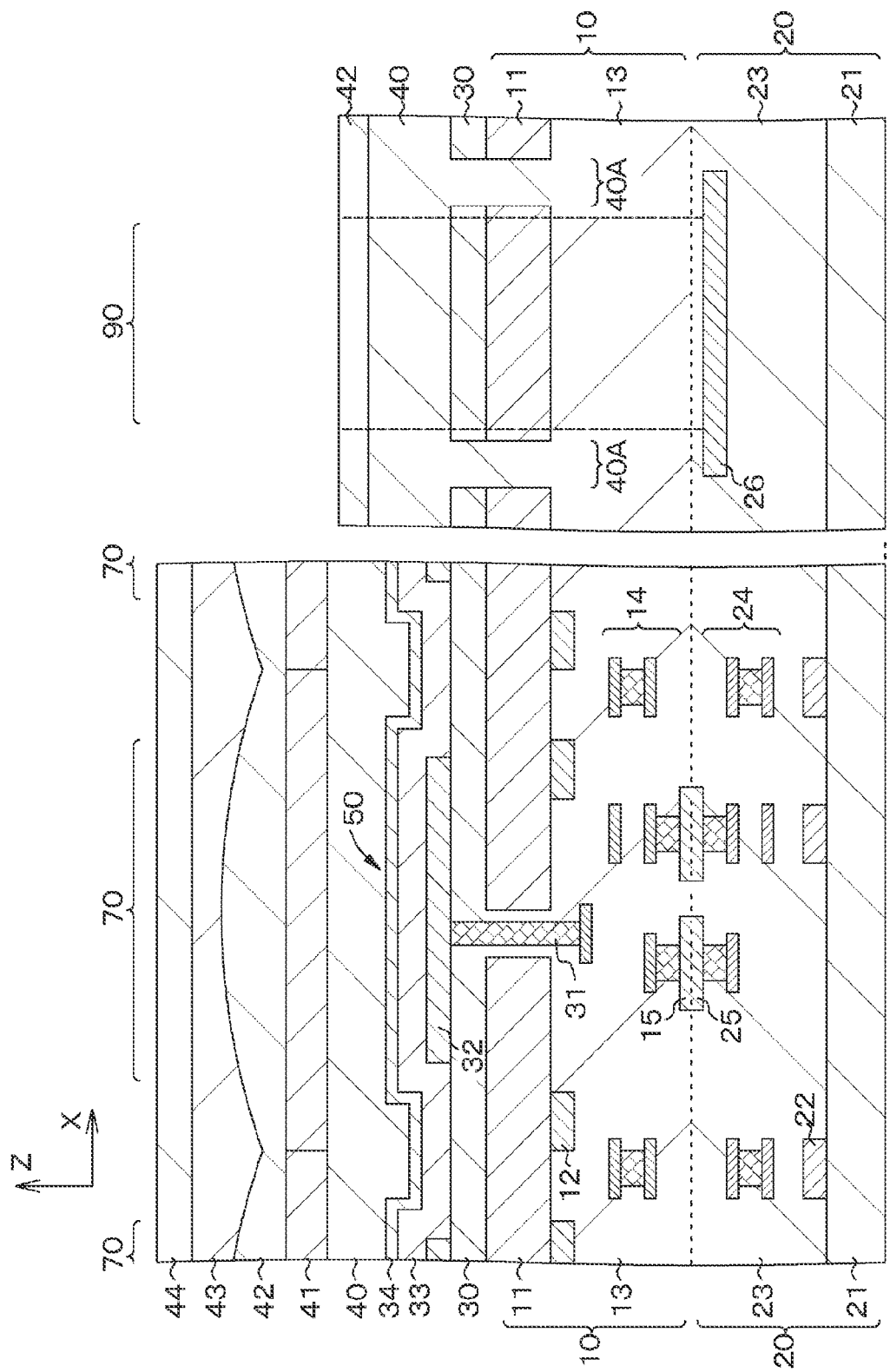
FIG. 27 is a schematic partial end face view that follows FIG. 26 for explaining the method for manufacturing the display device according to the third embodiment.

Thereafter, in portions that correspond to the display region 80 and the pad region 90, the protective film 40 is formed over an entire surface. By doing this, the insulating structure 40A is formed by using an insulating material that is included in the protective film 40 on the second electrode 34. Next, [Process-150] described in the first embodiment is performed, a portion illustrated with a broken line in FIG. 27 is opened, and the pad electrode 26 is exposed. By performing the processes described above, the display device 3 illustrated in FIG. 22 can be obtained.

Fourth Embodiment

A fourth embodiment also relates to a display device and a method for manufacturing the display device, and an electronic device according to the present disclosure.

Figure 28:
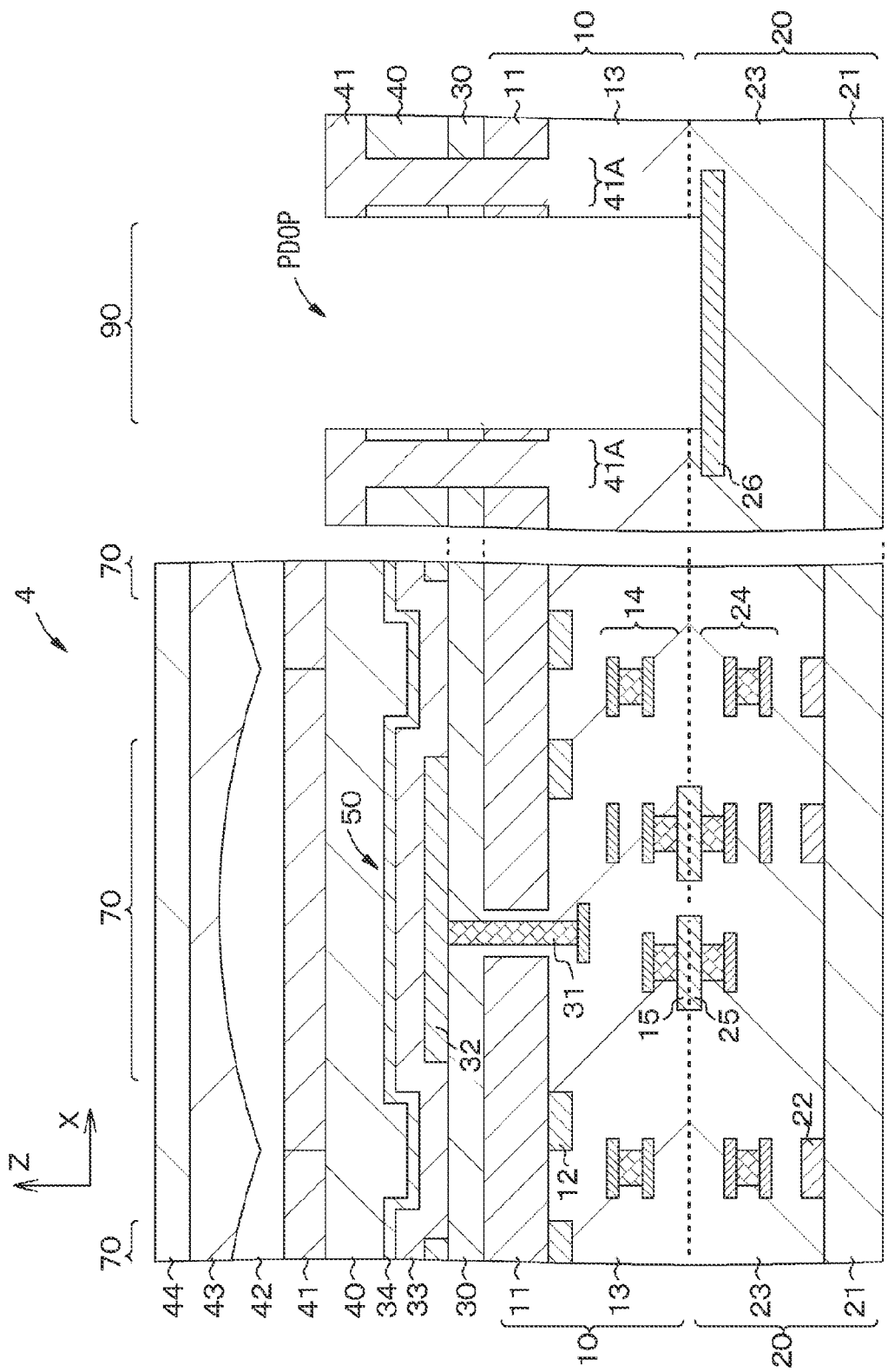
FIG. 28 is a schematic partial sectional view of a portion that includes a pixel in a display region, and a portion of a pad region in a display device according to a fourth embodiment.

FIG. 28 is a schematic partial sectional view of a portion that includes a pixel in a display region, and a portion of a pad region in a display device according to the fourth embodiment.

In the third embodiment, the insulating structure 40A has been formed by using an insulating material that is included in the protective film. The third embodiment is different from this in that an insulating structure 41A is formed by using an insulating material that is included in the color filter 41 on the second electrode 34.

A method for manufacturing a display device 4 is described in detail below.

[Process-400]

Figure 24:
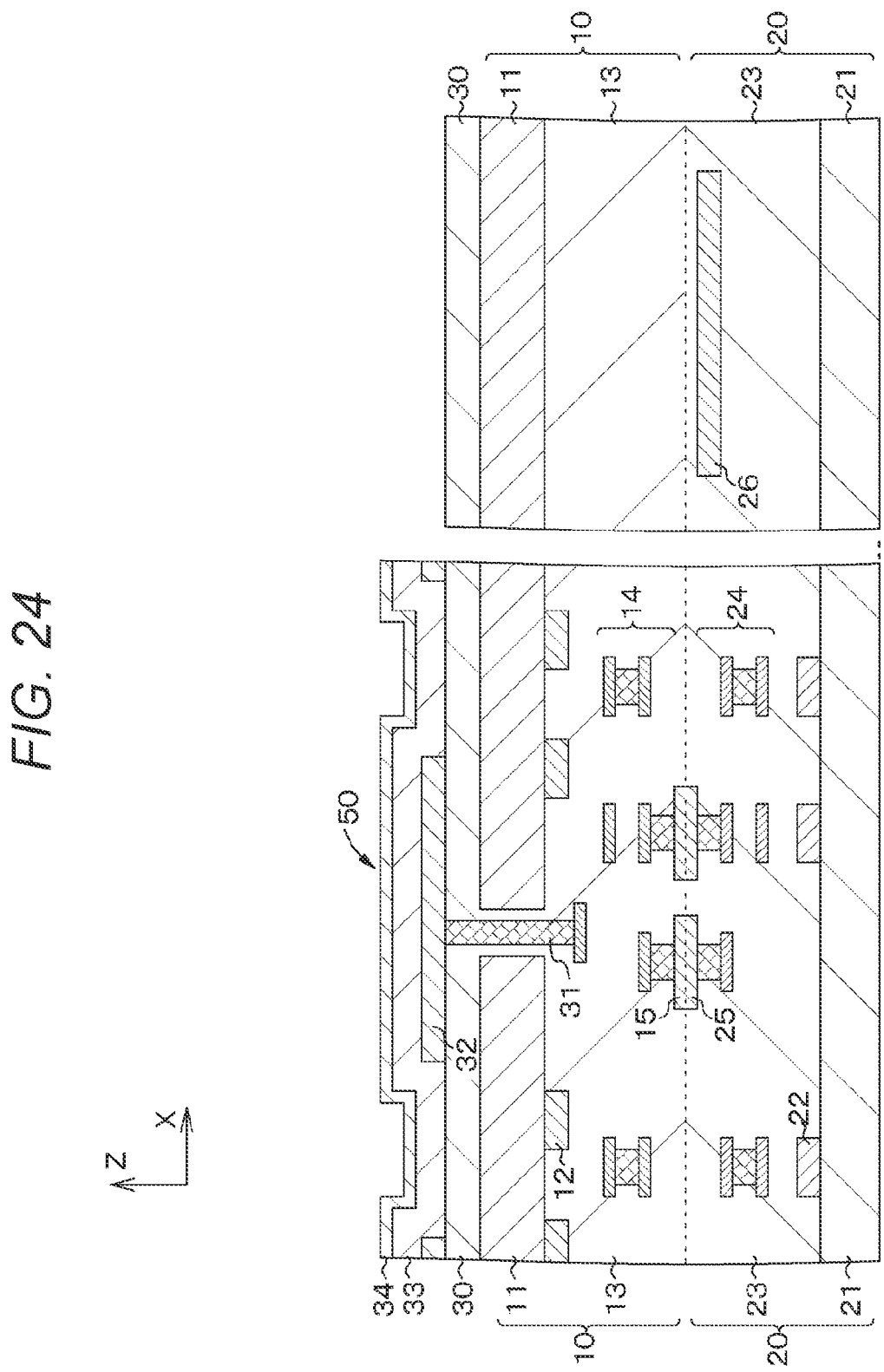
FIG. 24 is a schematic partial end face view that follows FIG. 23 for explaining the method for manufacturing the display device according to the third embodiment.

First, [Process-300] and [Process-310] that have been described in the third embodiment are performed (see FIG. 24).

[Process-410]

Figure 29:
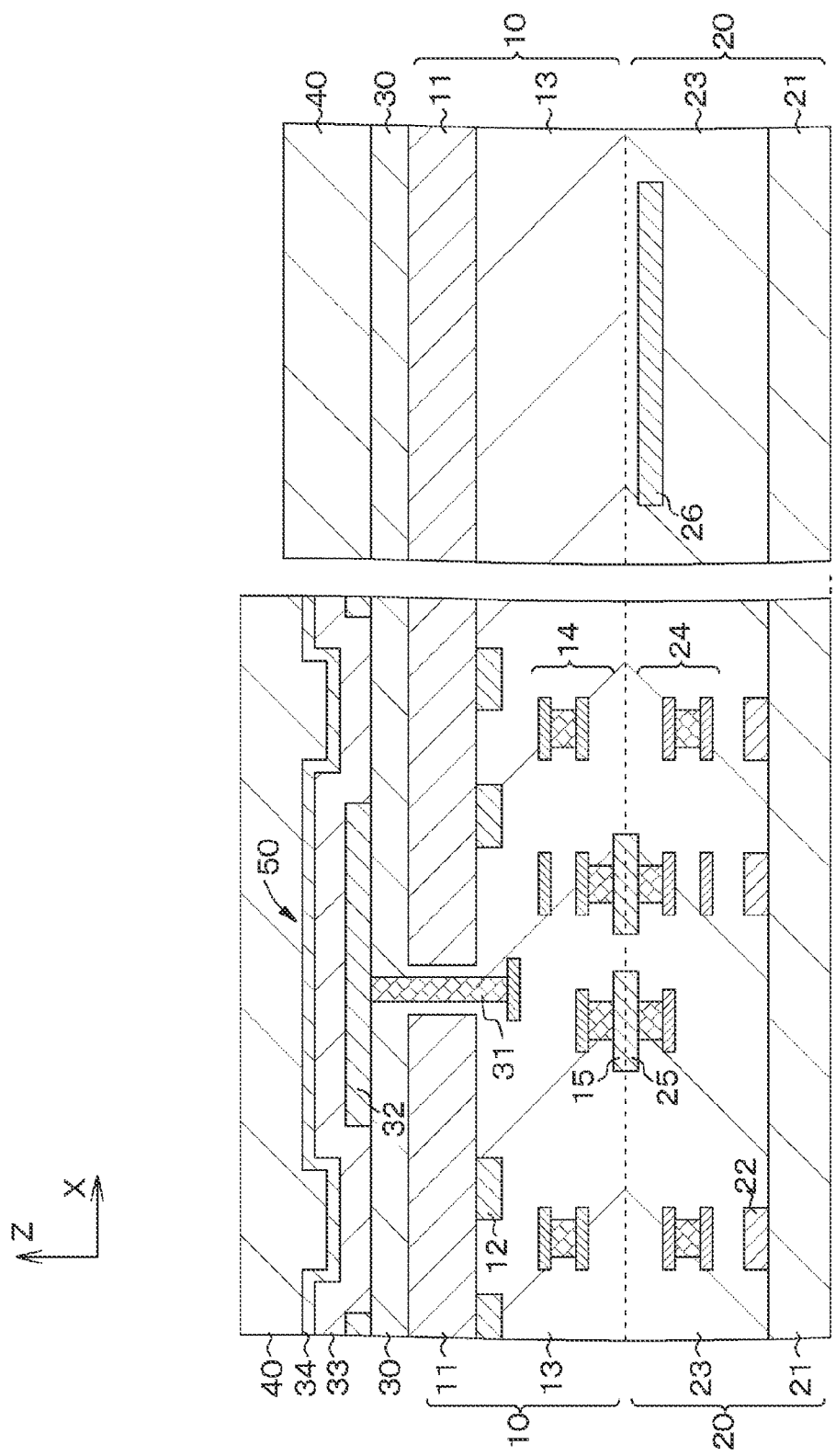
FIG. 29 is a schematic partial end face view for explaining a method for manufacturing the display device according to the fourth embodiment.

Thereafter, in portions that correspond to the display region 80 and the pad region 90, the protective film 40 is formed over an entire surface (see FIG. 29).

[Process-420]

Figure 30:
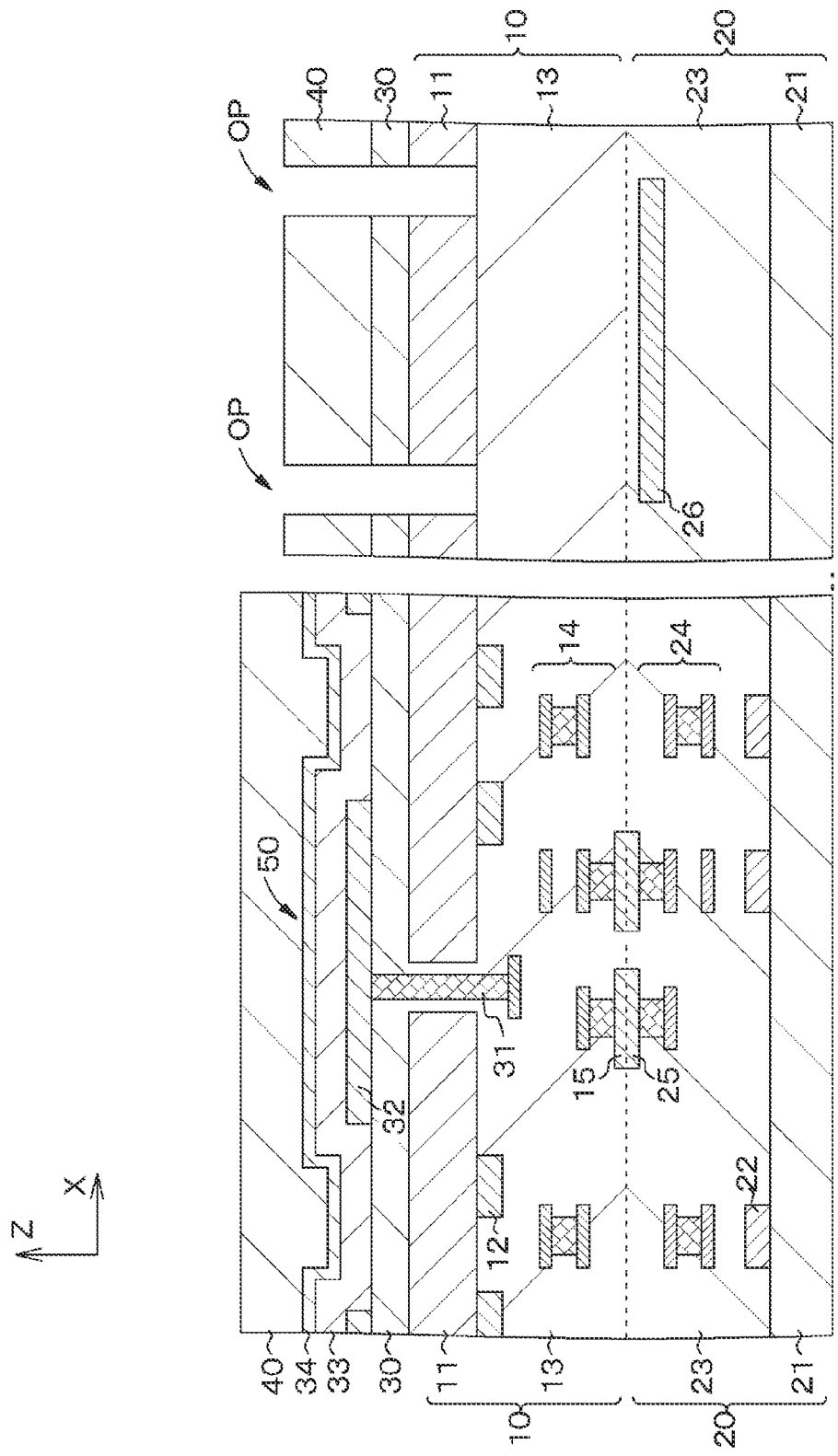
FIG. 30 is a schematic partial end face view that follows FIG. 29 for explaining the method for manufacturing the display device according to the fourth embodiment.
Figure 31:
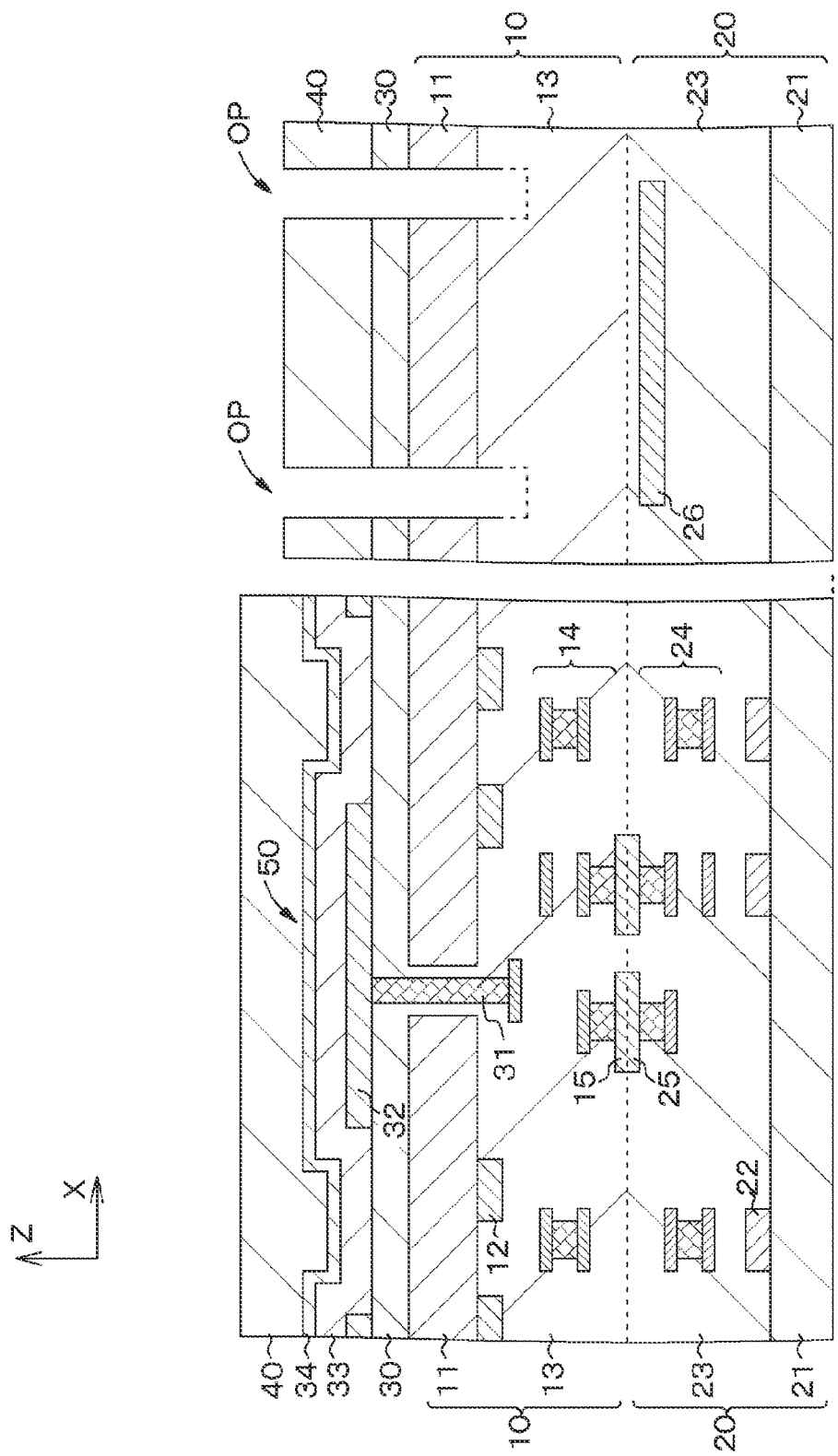
FIG. 31 is a schematic partial end face view that follows FIG. 30 for explaining the method for manufacturing the display device according to the fourth embodiment.

Next, an insulating structure is formed in a portion that corresponds to the pad region 90. First, a portion that surrounds a portion of the pad opening PDOP of the protective film 40, the insulating film 30, and the semiconductor material layer 11 is removed, and an annular opening OP is formed (see FIG. 30). Note that FIG. 30 illustrates an aspect in which only the protective film 40, the insulating film 30, and the semiconductor material layer 11 have been removed. However, an aspect in which etching is also performed on the interlayer insulating layer 13 that is located in a lower layer may be employed (see FIG. 31).

[Process-430]

Figure 32:
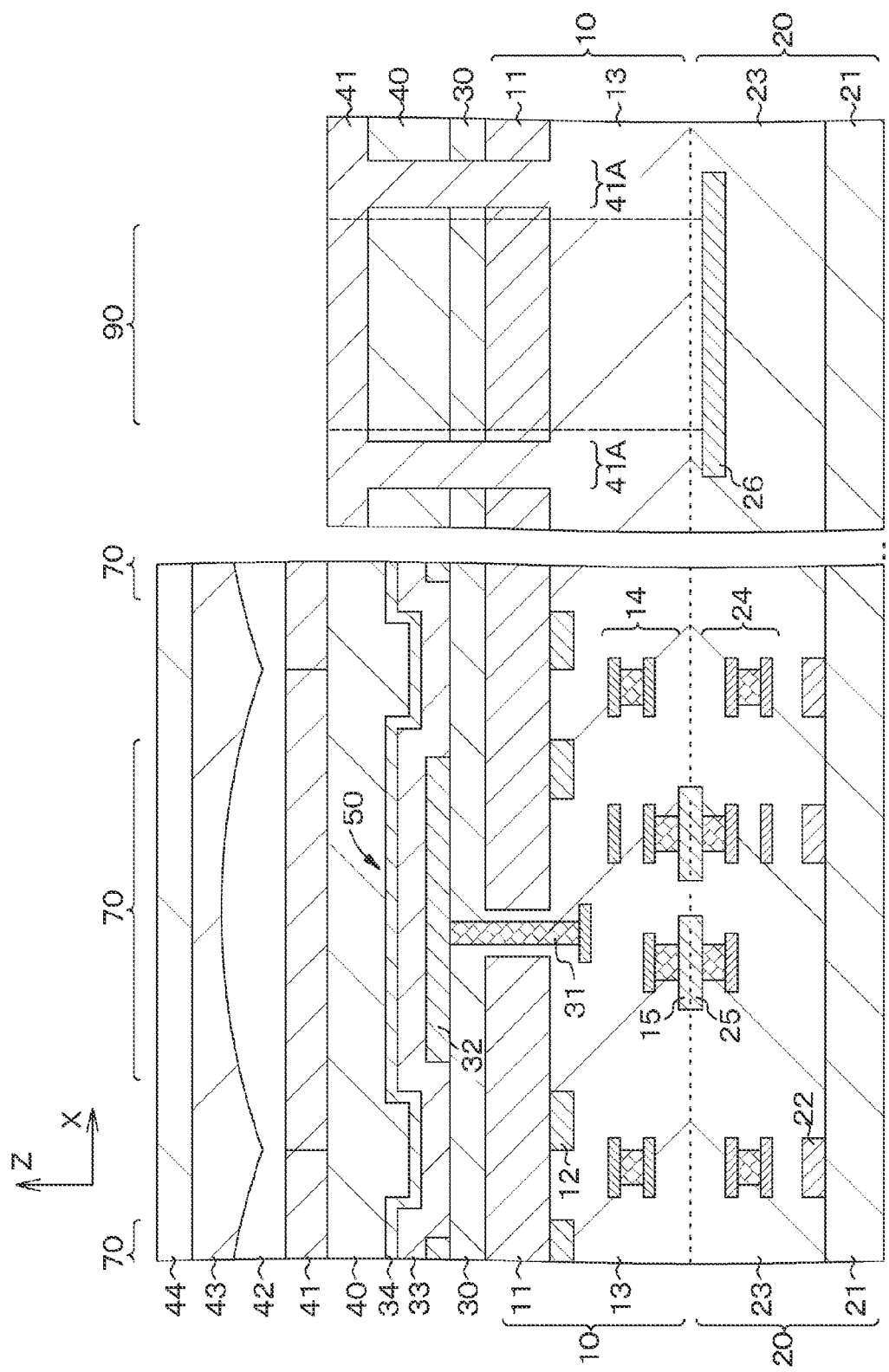
FIG. 32 is a schematic partial end face view that follows FIG. 31 for explaining the method for manufacturing the display device according to the fourth embodiment.

Thereafter, in portions that correspond to the display region 80 and the pad region 90, the color filter 41 is formed over an entire surface. By doing this, the insulating structure 41A is formed by using an insulating material that is included in the color filter 41 on the second electrode 34. Next, [Process-150] described in the first embodiment is performed, a portion illustrated with a broken line in FIG. 32 is opened, and the pad electrode 26 is exposed. By performing the processes described above, the display device 4 illustrated in FIG. 28 can be obtained.

Fifth Embodiment

A fifth embodiment also relates to a display device and a method for manufacturing the display device, and an electronic device according to the present disclosure.

Figure 33:
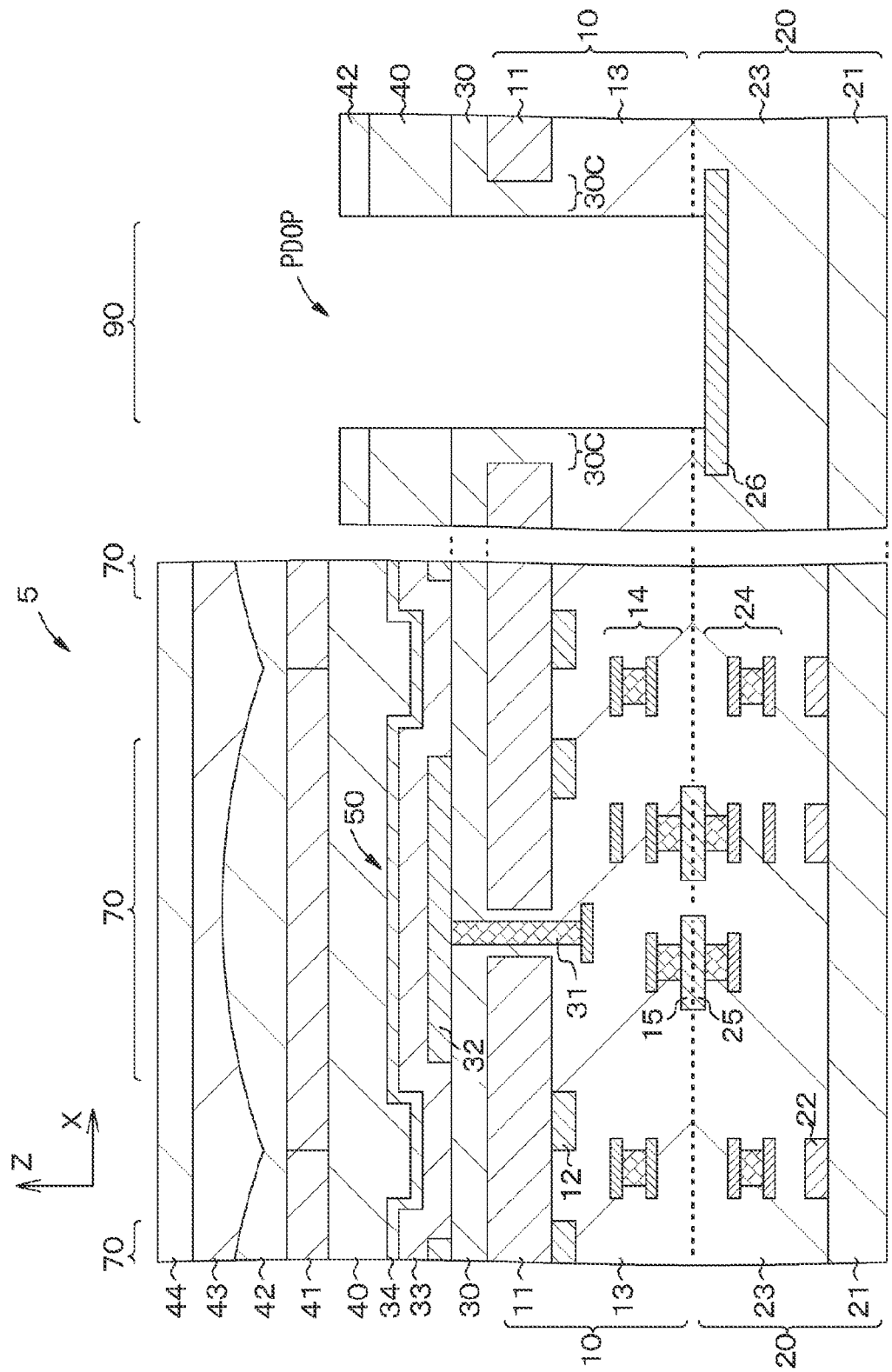
FIG. 33 is a schematic partial sectional view of a portion that includes a pixel in a display region, and a portion of a pad region in a display device according to a fifth embodiment.
Figure 34:
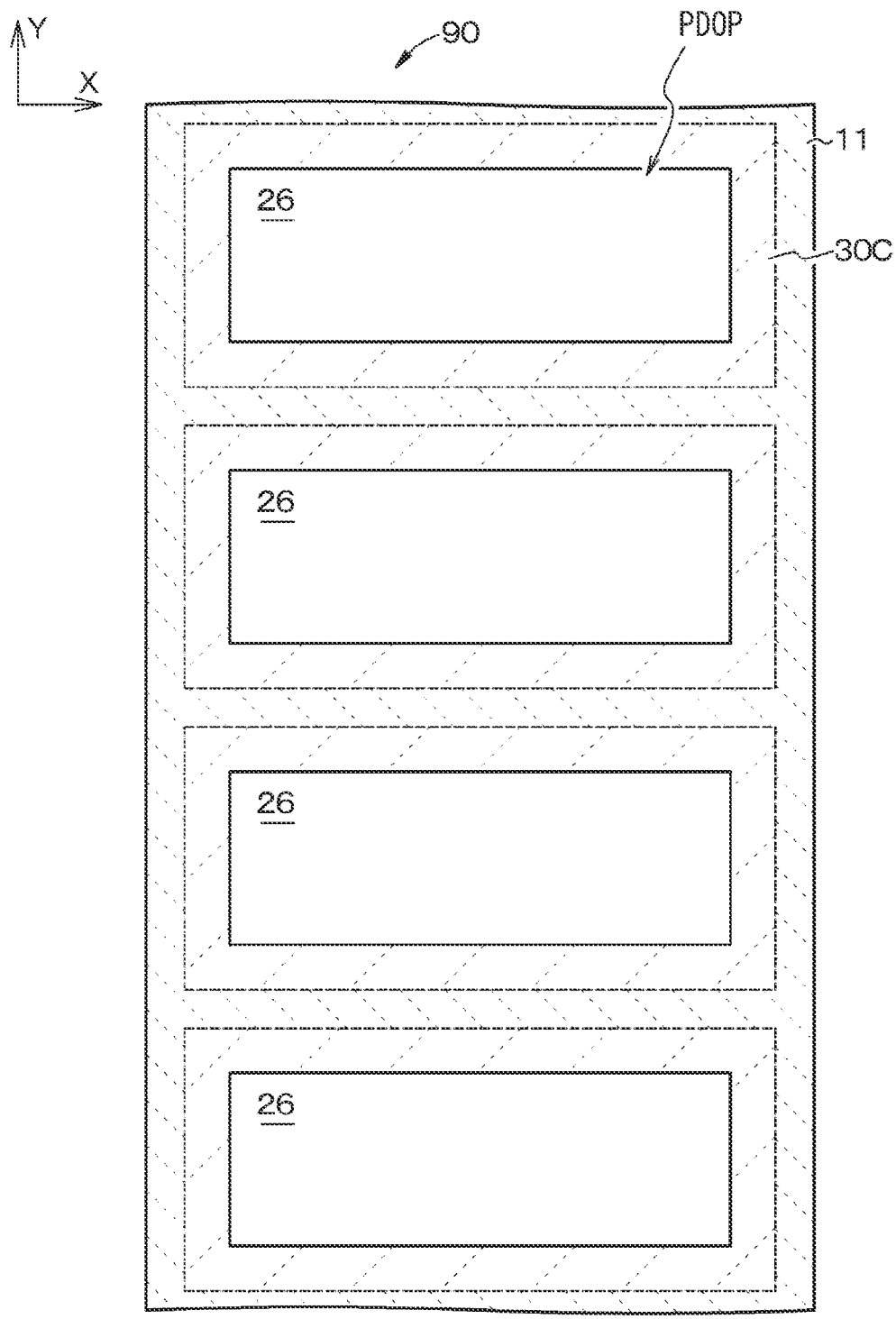
FIG. 34 is a schematic plan view for explaining a disposition relationship among components in the pad region.

FIG. 33 is a schematic partial sectional view of a portion that includes a pixel in a display region, and a portion of a pad region in a display device according to the fifth embodiment. FIG. 34 is a schematic plan view for explaining a disposition relationship among components in the pad region.

In the first embodiment to the fourth embodiment, a section of the semiconductor material layer 11 is exposed to the opening PDOP. In the fifth embodiment, the pad opening PDOP is provided to penetrate the semiconductor material layer 11 of the first substrate 10, and a penetration surface of the semiconductor material layer 11 is covered with an insulating material that is included in the insulating film 30. A portion that covers the penetration surface is denoted by the reference sign 30C.

In the display device 5, a section of the semiconductor material layer 11 is not exposed to the pad opening PDOP. Accordingly, leakage between pad electrodes 26 that can be generated via the semiconductor material layer 11 can be avoided, and electrical reliability can be improved. Furthermore, moisture infiltration or moisture absorption that can be generated via the semiconductor material layer 11 can be prevented, and therefore a deterioration of the organic layer 33 can also be prevented.

A method for manufacturing the display device 5 also includes:
a first process for sticking the first substrate 10 and the second substrate 20 together in such a way that respective joint surfaces JS face each other, the first substrate 10 including the semiconductor material layer 11 in which a transistor that drives the light-emitting part 50 has been formed, the second substrate 20 including a predetermined circuit; and
a second process for providing the pad opening PDOP to face the pad electrode 26 from a side of the first substrate 10 in such a way that the pad electrode 26 provided on a side of the respective joint surfaces JS is exposed on a bottom surface. Furthermore, the method for manufacturing the display device 5 also includes:
a process for forming the light-emitting part 50 that includes the first electrode 32, the organic layer 33, and the second electrode 34, by stacking on the first substrate 10:
the insulating film 30;
the first electrode 32 that has been formed on the insulating film 30, and is arranged in a matrix shape;
the organic layer 33 that has been formed over an entire surface including an upper side of the first electrode 32; and
the second electrode 34 that has been formed over an entire surface including an upper side of the organic layer 33.

Then, in the method for manufacturing the display device 5, between the first process and the second process,
a process for providing an opening to penetrate the semiconductor material layer 11 of the first substrate 10 in such a way that a region in which the pad opening PDOP will be formed is included, and
a process for forming an insulating material layer over an entire surface including the opening
are performed. The similar is applied to a sixth embodiment to an eighth embodiment described later.

The method for manufacturing the display device 5 is described in detail below.

[Process-500]

Figure 35:
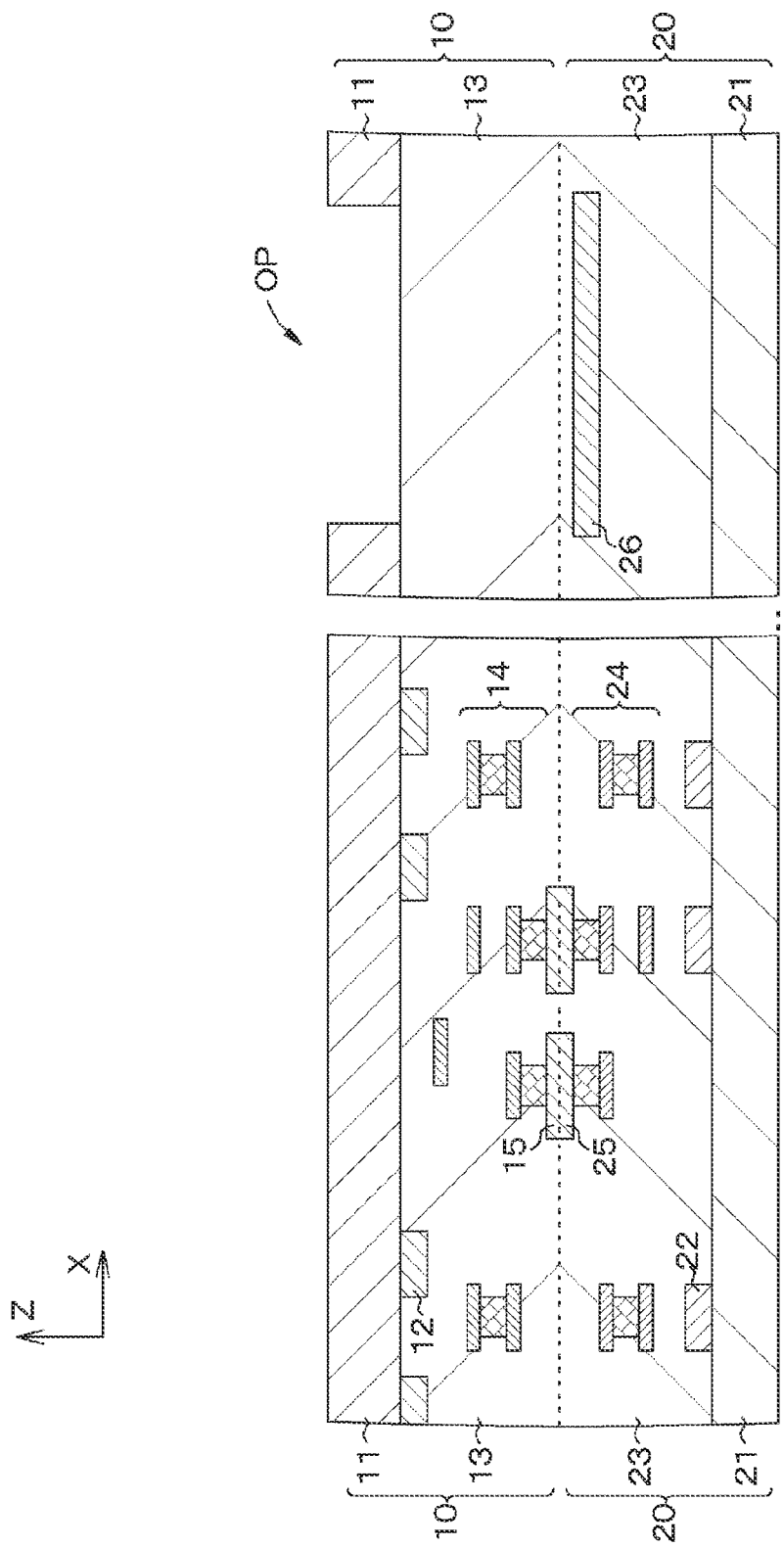
FIG. 35 is a schematic partial end face view for explaining a method for manufacturing the display device according to the fifth embodiment.
Figure 36:
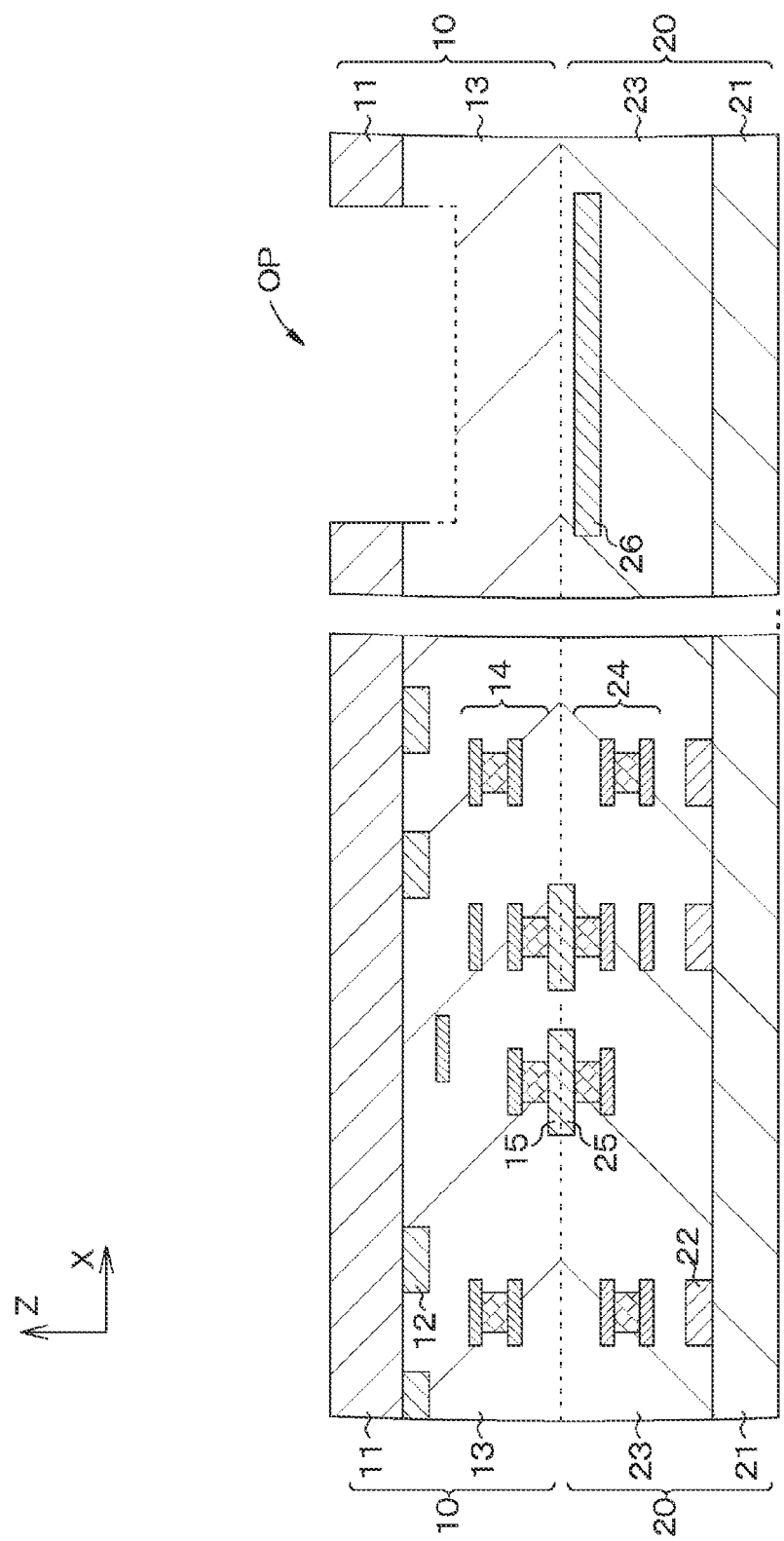
FIG. 36 is a schematic partial end face view that follows FIG. 35 for explaining the method for manufacturing the display device according to the fifth embodiment.
Figure 37:
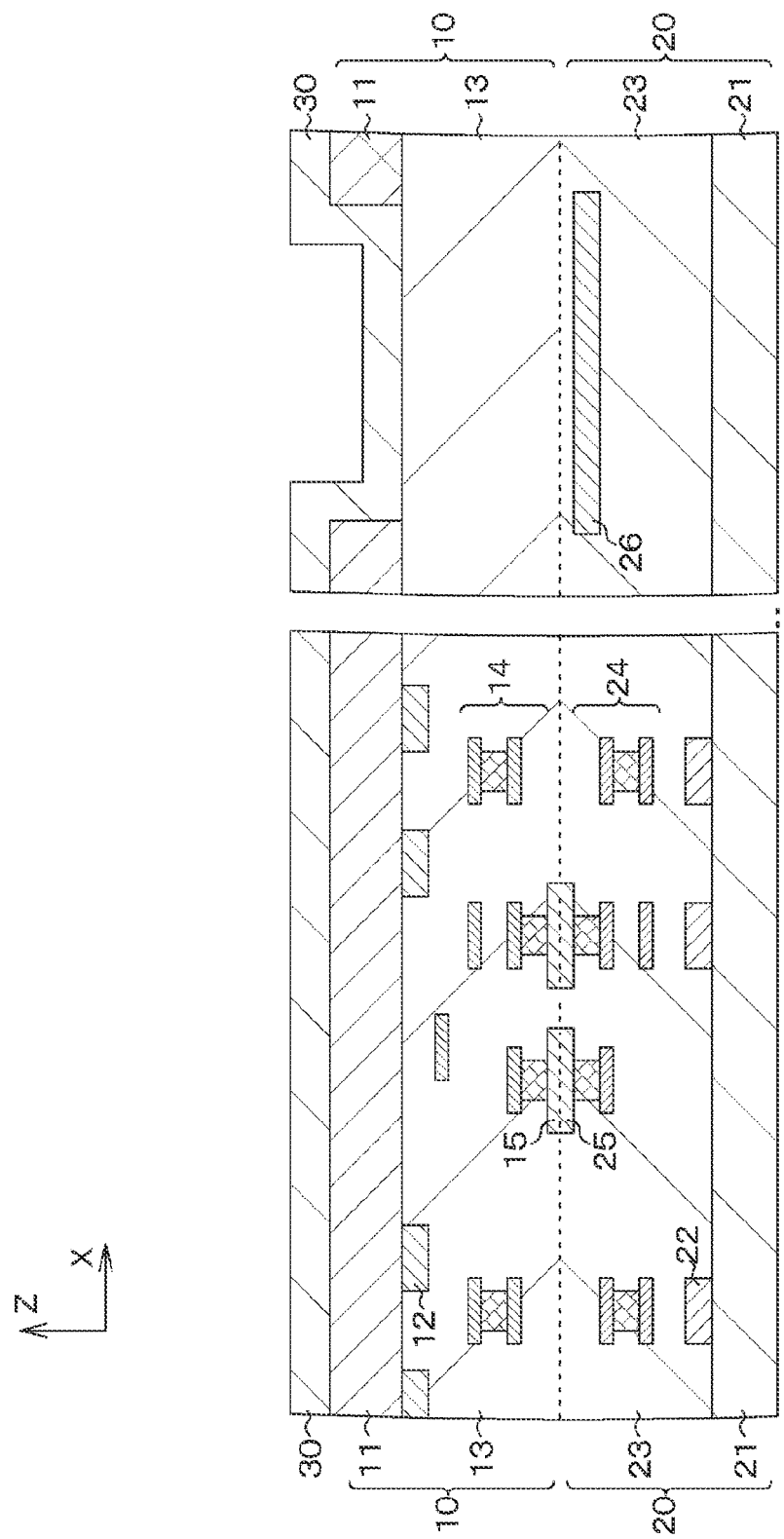
FIG. 37 is a schematic partial end face view that follows FIG. 36 for explaining the method for manufacturing the display device according to the fifth embodiment.

First, [Process-100] to [Process-120] that have been described in the first embodiment are performed (see FIG. 11). Next, the opening OP is provided to penetrate the semiconductor material layer 11 of the first substrate 10 in such a way that a region in which the pad opening PDOP will be formed is included (see FIG. 35). Note that FIG. 35 illustrates an aspect in which only the semiconductor material layer 11 has been removed. However, an aspect in which etching is also performed on the interlayer insulating layer 13 that is located in a lower layer may be employed (see FIG. 36). Thereafter, the insulating film 30 is formed over an entire surface including an upper side of the semiconductor material layer 11 (see FIG. 37). By doing this, a section of the semiconductor material layer 11 is also covered with an insulating material that is included in the insulating film 30.

[Process-510]

Figure 38:
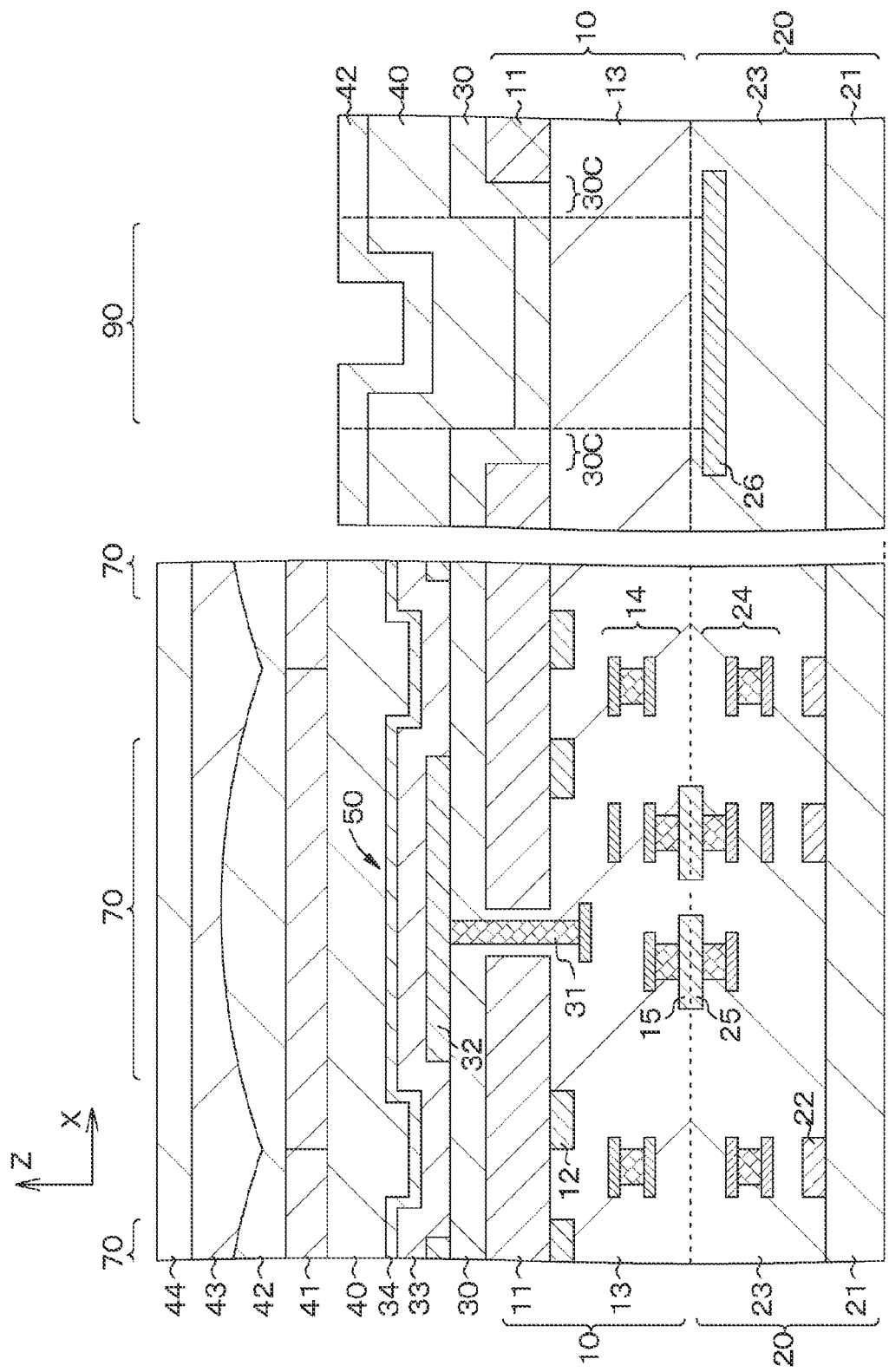
FIG. 38 is a schematic partial end face view that follows FIG. 37 for explaining the method for manufacturing the display device according to the fifth embodiment.

Next, [Process-140] to [Process-150] that have been described in the first embodiment are performed (see FIG. 38). Thereafter, a portion illustrated with a broken line in FIG. 38 is opened, and the pad electrode 26 is exposed. By performing the processes described above, the display device 5 illustrated in FIG. 33 can be obtained.

Sixth Embodiment

A sixth embodiment also relates to a display device and a method for manufacturing the display device, and an electronic device according to the present disclosure.

Figure 39:
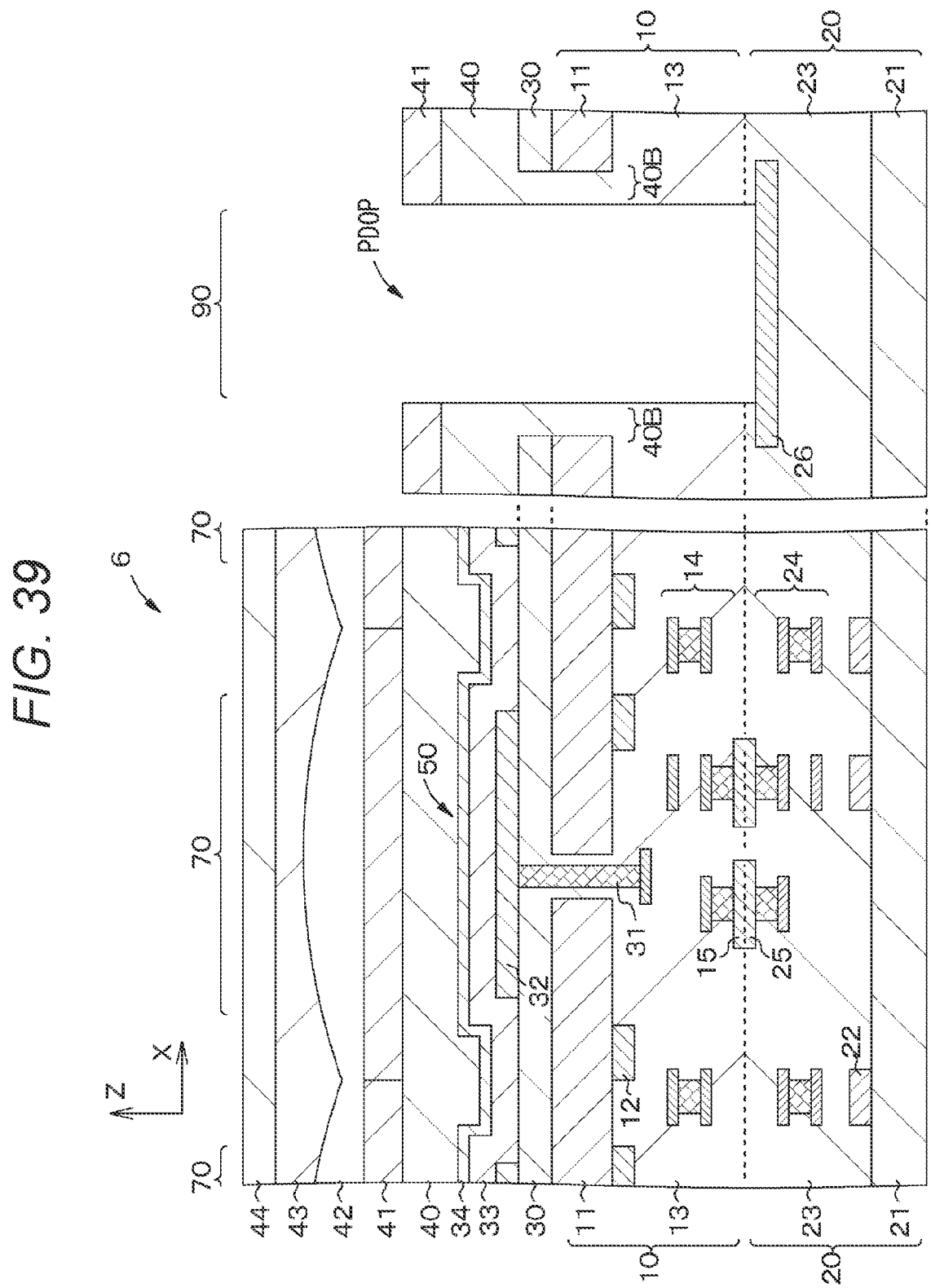
FIG. 39 is a schematic partial sectional view of a portion that includes a pixel in a display region, and a portion of a pad region in a display device according to a sixth embodiment.

FIG. 39 is a schematic partial sectional view of a portion that includes a pixel in a display region, and a portion of a pad region in a display device according to the sixth embodiment.

In the fifth embodiment, the penetration surface of the semiconductor material layer 11 is covered with an insulating material that is included in the insulating film 30. The sixth embodiment is different from this in that the penetration surface of the semiconductor material layer 11 is covered with an insulating material that is included in the protective film 40. A portion that covers the penetration surface is denoted by the reference sign 40B.

A method for manufacturing a display device 6 is described in detail below.

[Process-600]

First, [Process-300] and [Process-310] that have been described in the third embodiment are performed (see FIG. 24).

[Process-610]

Figure 40:
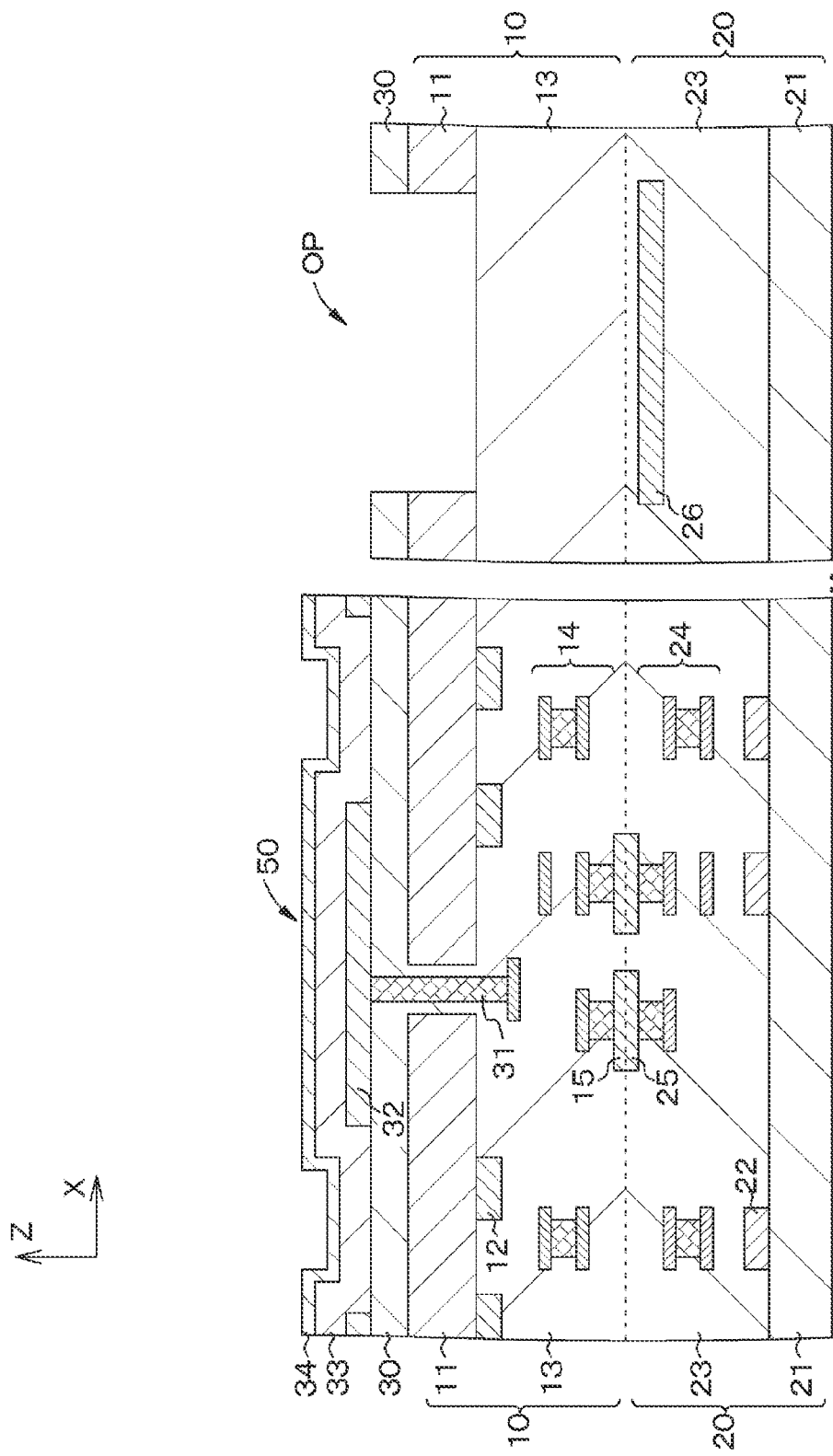
FIG. 40 is a schematic partial end face view for explaining a method for manufacturing the display device according to the sixth embodiment.
Figure 41:
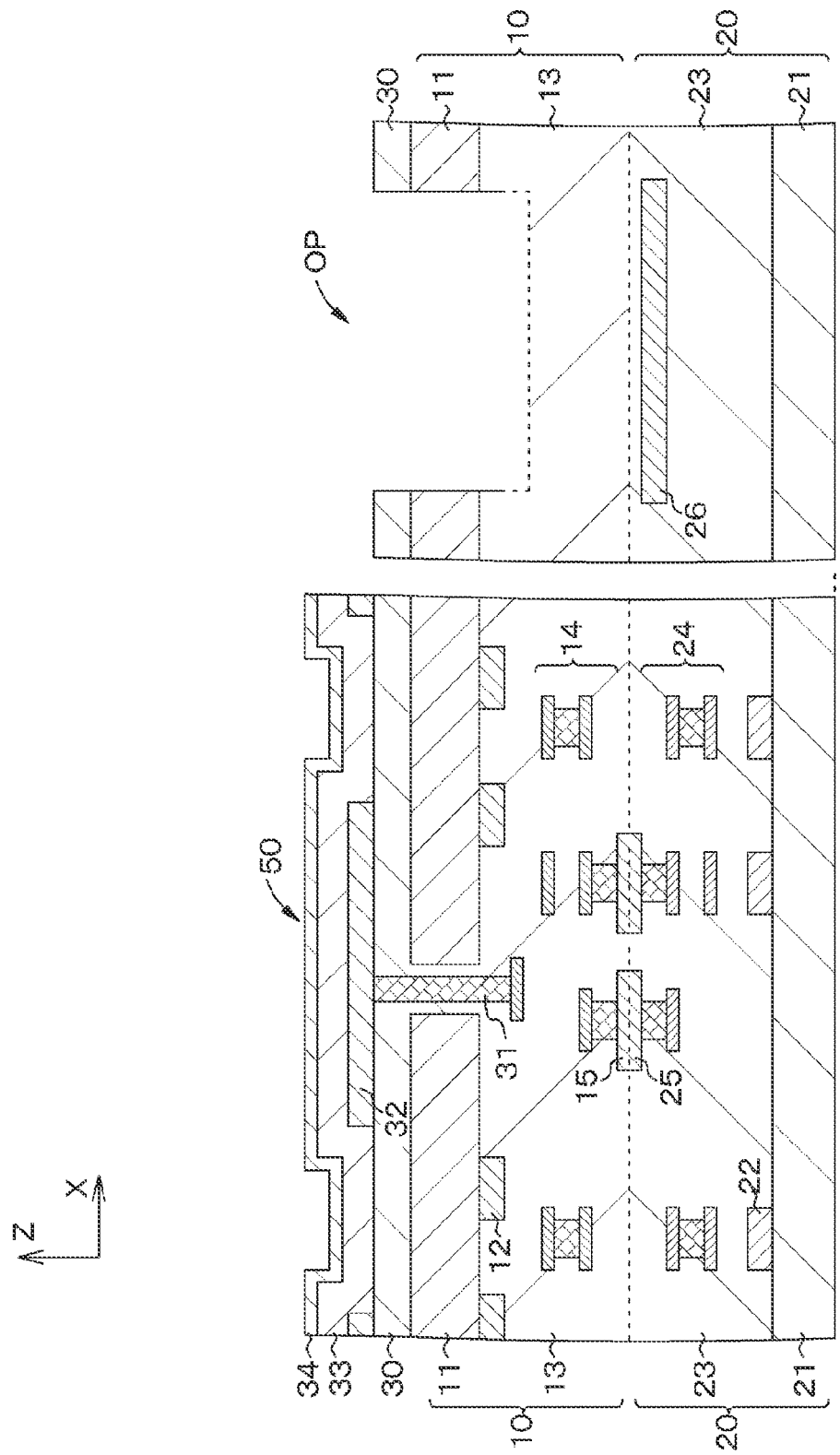
FIG. 41 is a schematic partial end face view that follows FIG. 40 for explaining the method for manufacturing the display device according to the sixth embodiment.
Figure 42:
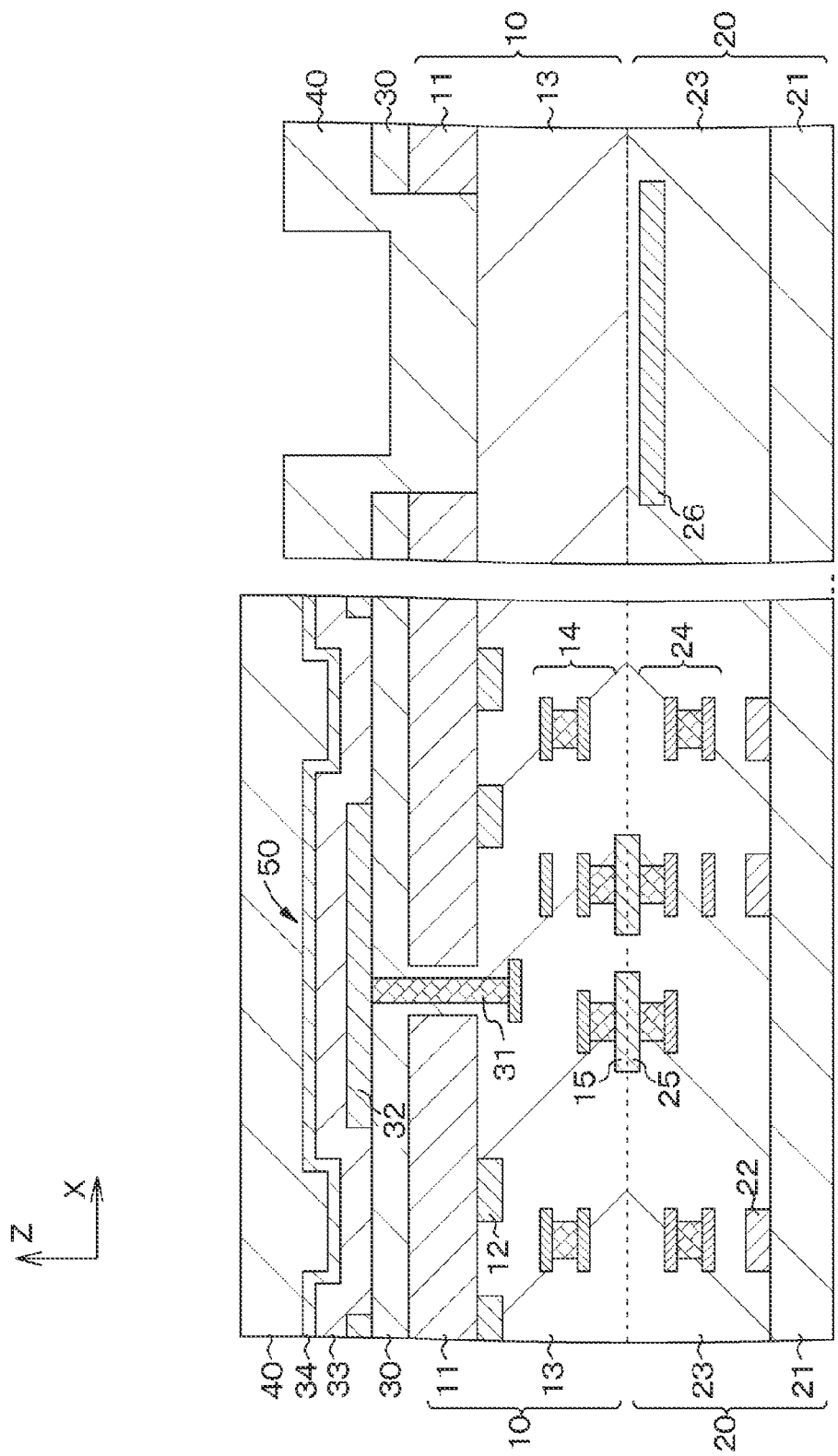
FIG. 42 is a schematic partial end face view that follows FIG. 41 for explaining the method for manufacturing the display device according to the sixth embodiment.

Next, the opening OP is provided to penetrate the semiconductor material layer 11 of the first substrate 10 in such a way that a region in which the pad opening PDOP will be formed is included (see FIG. 40). Note that FIG. 40 illustrates an aspect in which only the insulating film 30 and the semiconductor material layer 11 have been removed. However, an aspect in which etching is also performed on the interlayer insulating layer 13 that is located in a lower layer may be employed (see FIG. 41). Thereafter, the protective film 40 is formed over an entire surface including an upper side of the insulating film 30 (see FIG. 42). By doing this, a section of the semiconductor material layer 11 is also covered with an insulating material that is included in the protective film 40.

[Process-620]

Figure 43:
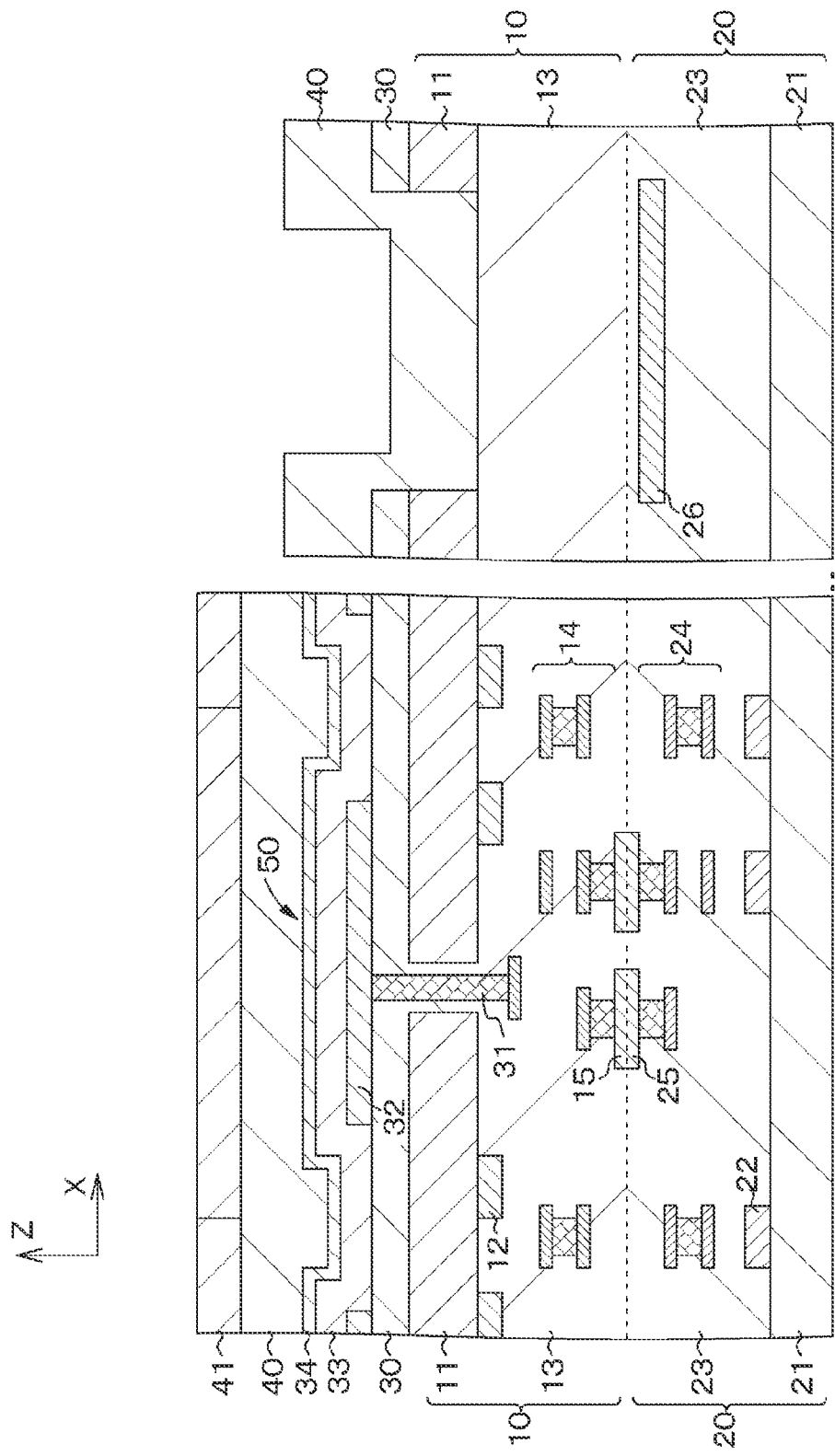
FIG. 43 is a schematic partial end face view that follows FIG. 42 for explaining the method for manufacturing the display device according to the sixth embodiment.
Figure 44:
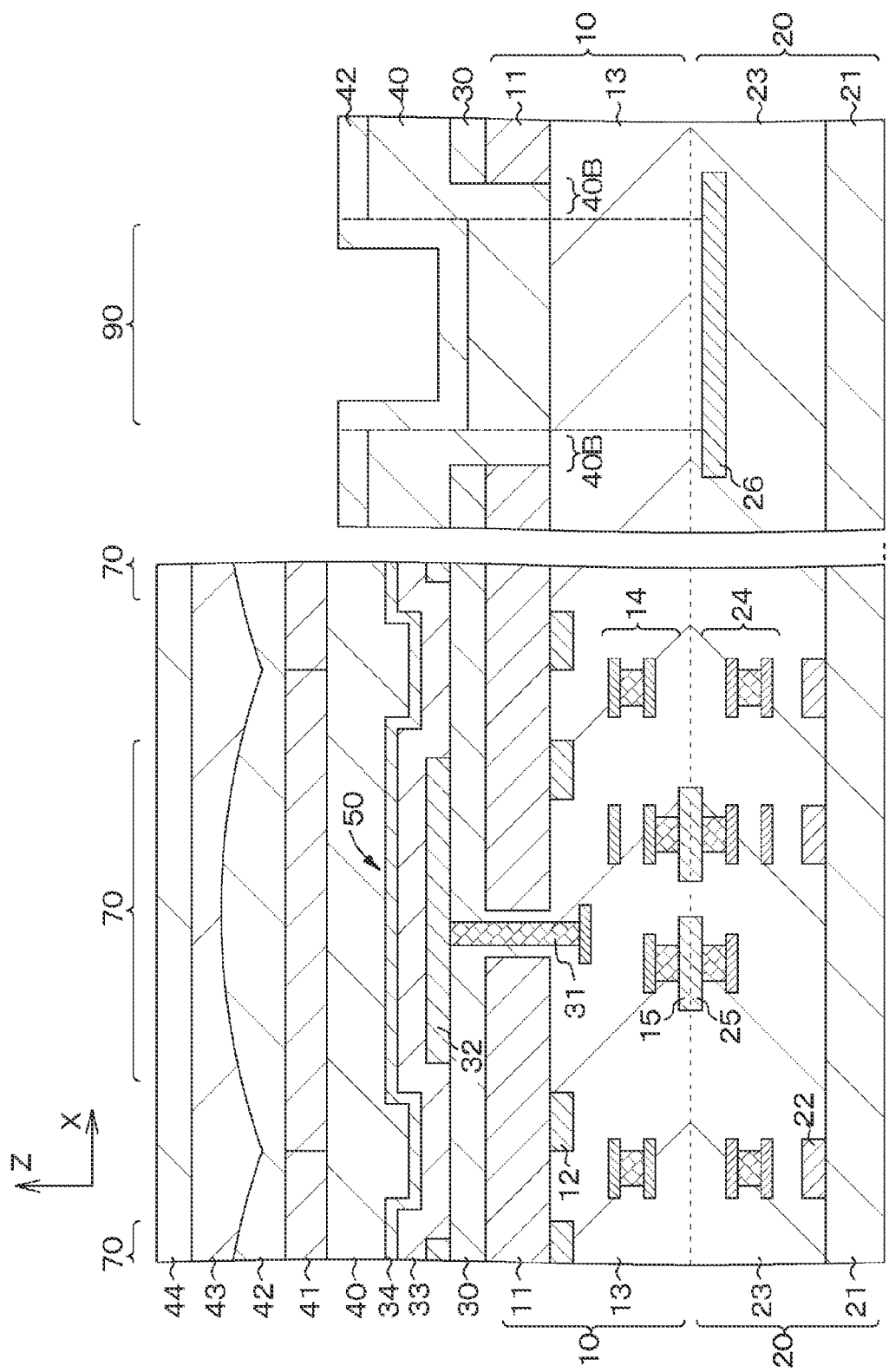
FIG. 44 is a schematic partial end face view that follows FIG. 43 for explaining the method for manufacturing the display device according to the sixth embodiment.

Next, [Process-150] described in the first embodiment is performed (see FIGS. 43 and 44). Thereafter, a portion illustrated with a broken line in FIG. 44 is opened, and the pad electrode 26 is exposed. By performing the processes described above, the display device 6 illustrated in FIG. 39 can be obtained.

Seventh Embodiment

A seventh embodiment also relates to a display device and a method for manufacturing the display device, and an electronic device according to the present disclosure.

Figure 45:
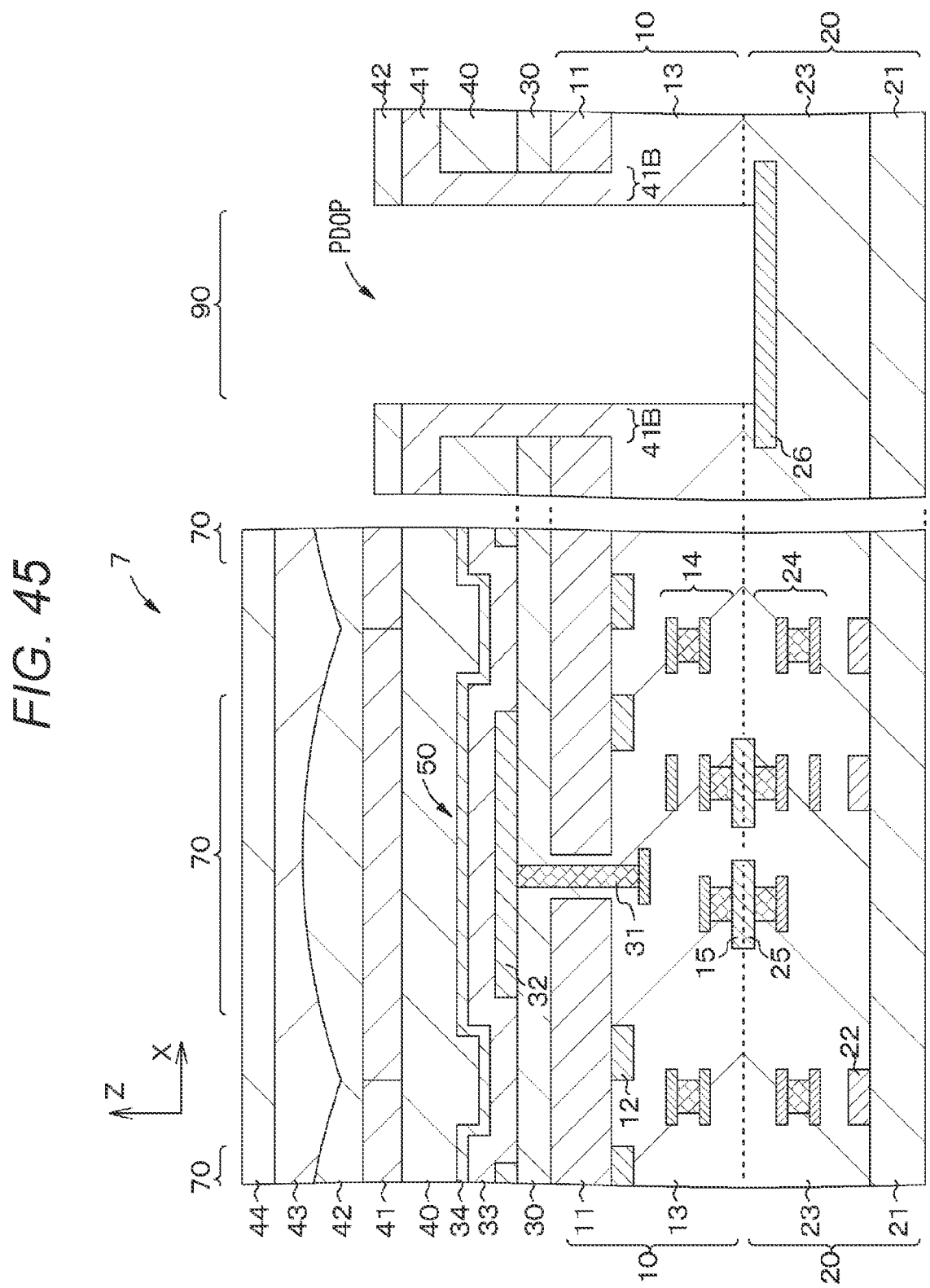
FIG. 45 is a schematic partial sectional view of a portion that includes a pixel in a display region, and a portion of a pad region in a display device according to a seventh embodiment.

FIG. 45 is a schematic partial sectional view of a portion that includes a pixel in a display region, and a portion of a pad region in a display device according to the seventh embodiment.

In the sixth embodiment, the penetration surface of the semiconductor material layer 11 is covered with an insulating material that is included in the protective film 40. The sixth embodiment is different from this in that the penetration surface of the semiconductor material layer 11 is covered with an insulating material that is included in the color filter 41. A portion that covers the penetration surface is denoted by the reference sign 41B.

A method for manufacturing a display device 7 is described in detail below.

[Process-700]

First, [Process-400] and [Process-410] that have been described in the fourth embodiment are performed (see FIG. 29).

[Process-710]

Figure 46:
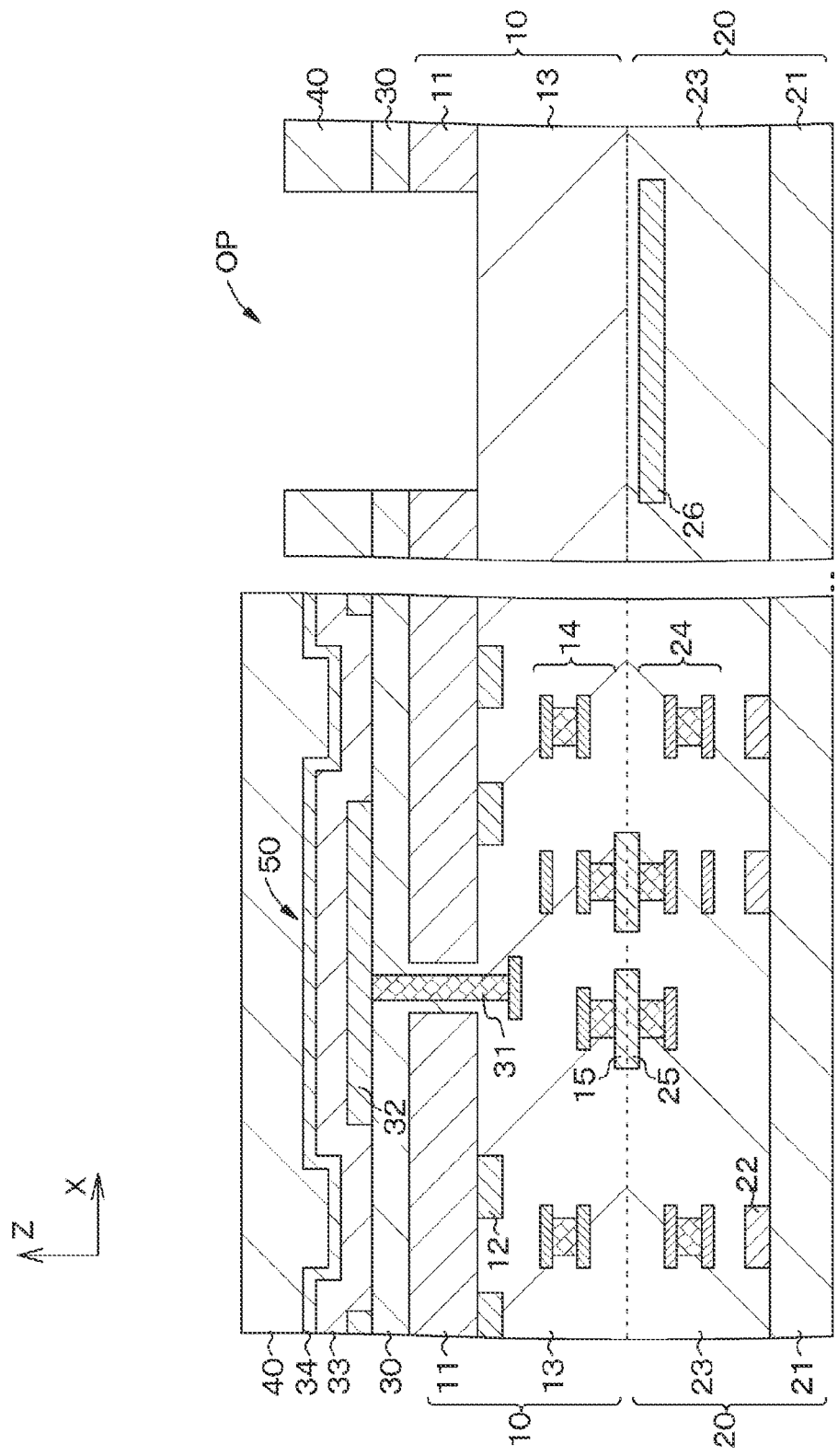
FIG. 46 is a schematic partial end face view for explaining a method for manufacturing the display device according to the seventh embodiment.
Figure 47:
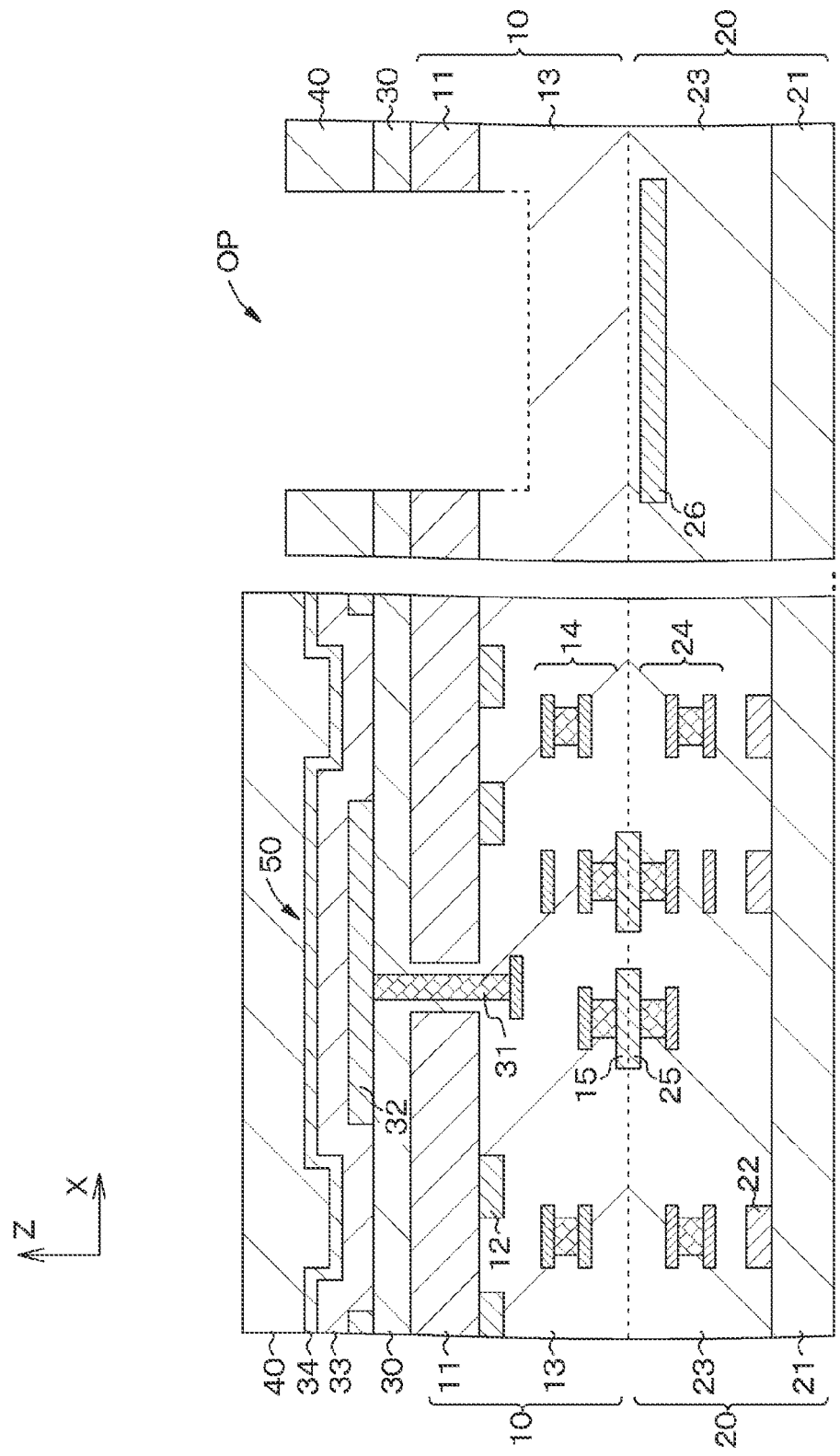
FIG. 47 is a schematic partial end face view that follows FIG. 46 for explaining the method for manufacturing the display device according to the seventh embodiment.

Next, the opening OP is provided to penetrate the semiconductor material layer 11 of the first substrate 10 in such a way that a region in which the pad opening PDOP will be formed is included (see FIG. 46). Note that FIG. 46 illustrates an aspect in which only the protective layer 40, the insulating film 30, and the semiconductor material layer 11 have been removed. However, an aspect in which etching is also performed on the interlayer insulating layer 13 that is located in a lower layer may be employed (see FIG. 47). Thereafter, the protective film 40 is formed over an entire surface including an upper side of the insulating film 30 (see FIG. 42). By doing this, a section of the semiconductor material layer 11 is also covered with an insulating material that is included in the protective film 40.

[Process-720]

Figure 48:
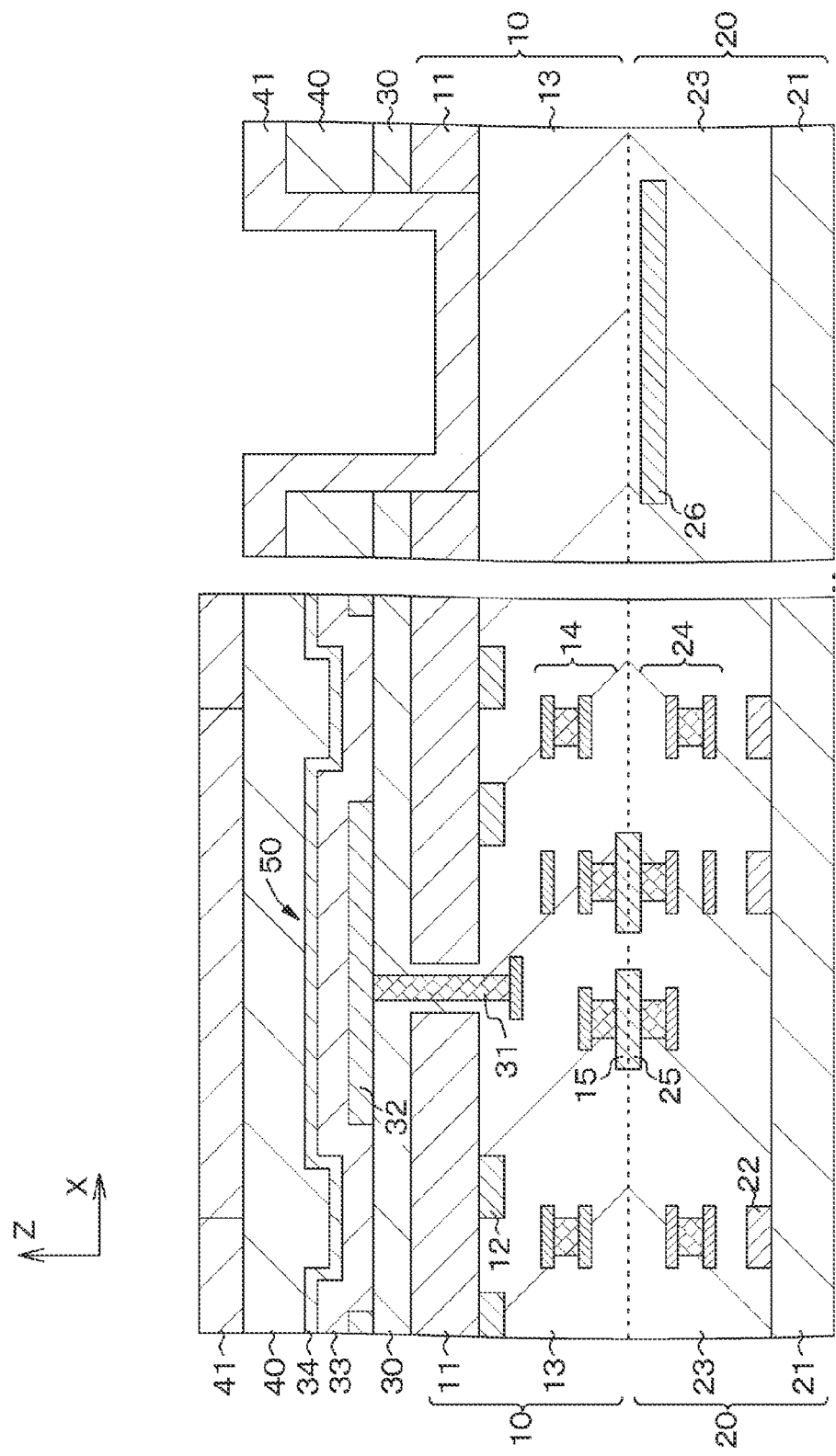
FIG. 48 is a schematic partial end face view that follows FIG. 47 for explaining the method for manufacturing the display device according to the seventh embodiment.
Figure 49:
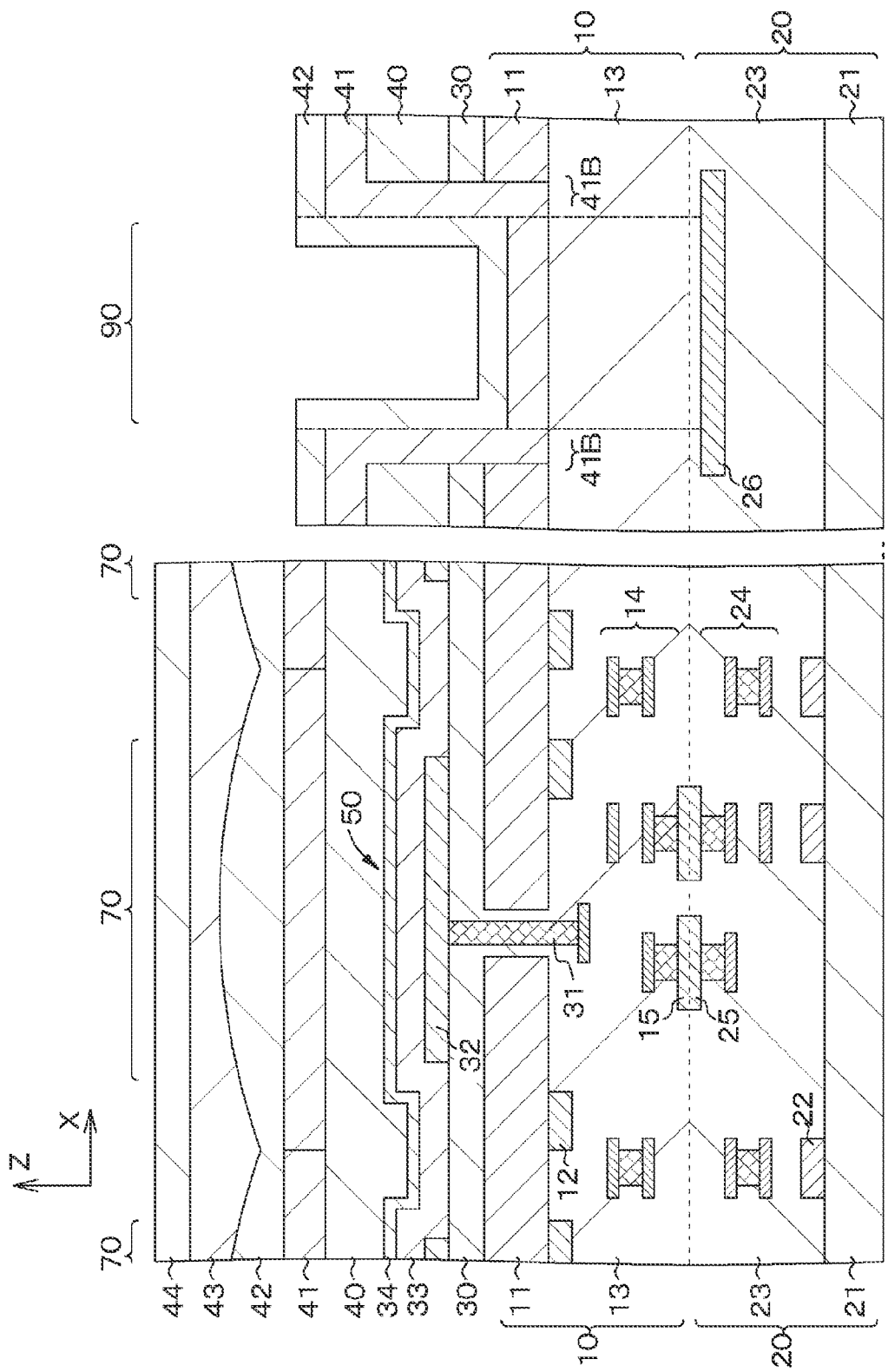
FIG. 49 is a schematic partial end face view that follows FIG. 48 for explaining the method for manufacturing the display device according to the seventh embodiment.

Next, the color filter 41 is formed over an entire surface including the display region 80 and the pad region 90 (see FIG. 48). Thereafter, after the microlens 42 has been formed over an entire surface, in a portion that corresponds to the display region 80, the counter substrate 44 is stuck via the sealing resin 43 (see FIG. 49). Next, a portion illustrated with a broken line in FIG. 49 is opened, and the pad electrode 26 is exposed. By performing the processes described above, the display device 7 illustrated in FIG. 45 can be obtained.

Eighth Embodiment

An eighth embodiment also relates to a display device and a method for manufacturing the display device, and an electronic device according to the present disclosure.

Figure 50:
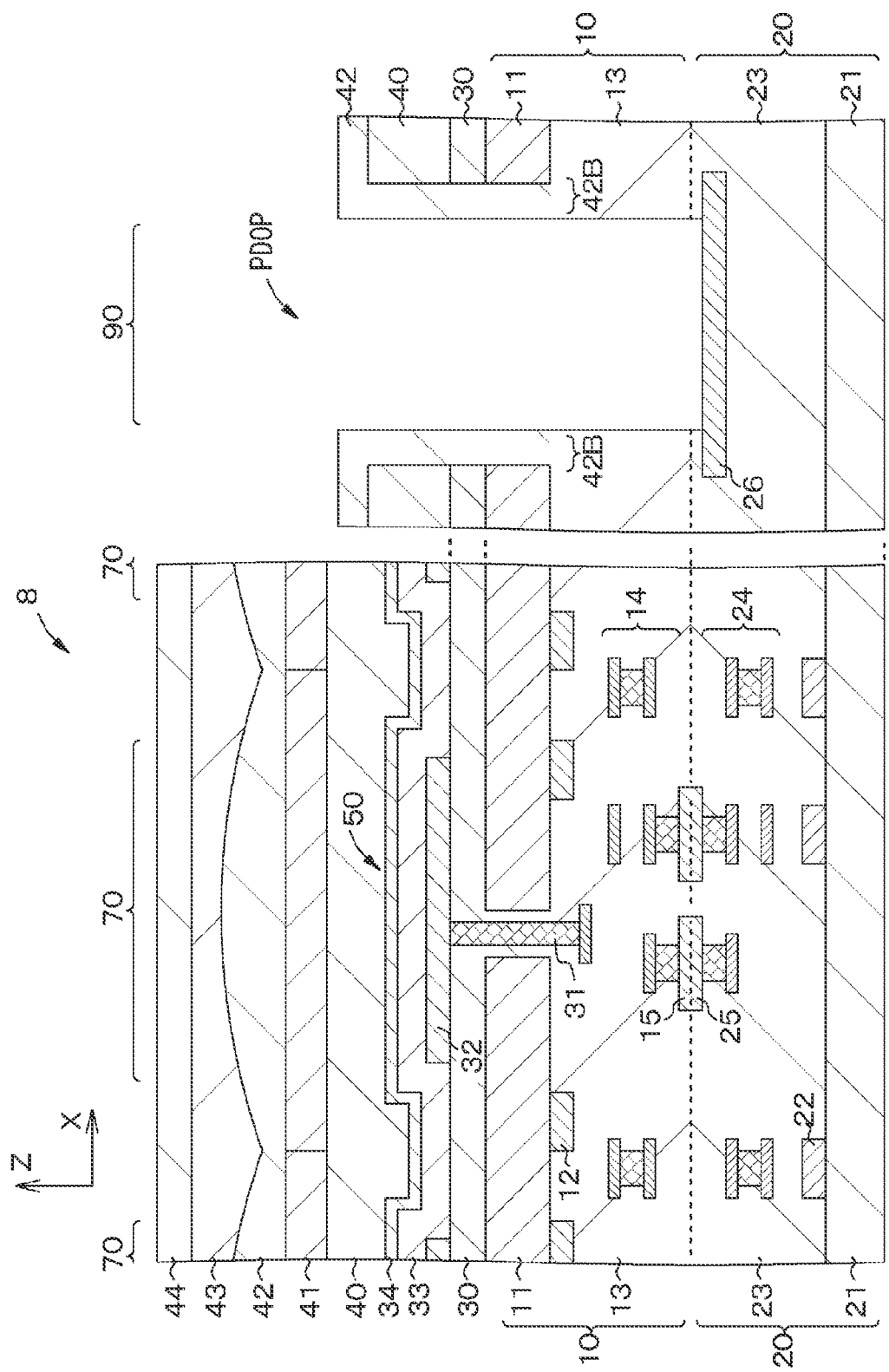
FIG. 50 is a schematic partial end face view for explaining a method for manufacturing a display device according to an eighth embodiment.

FIG. 50 is a schematic partial sectional view of a portion that includes a pixel in a display region, and a portion of a pad region in a display device according to the eighth embodiment.

In the seventh embodiment, the penetration surface of the semiconductor material layer 11 is covered with an insulating material that is included in the color filter 41. The eighth embodiment is different from this in that the penetration surface of the semiconductor material layer 11 is covered with an insulating material that is included in the microlens 42. A portion that covers the penetration surface is denoted by the reference sign 42B.

A method for manufacturing a display device 8 is described in detail below.

[Process-800]

Figure 51:
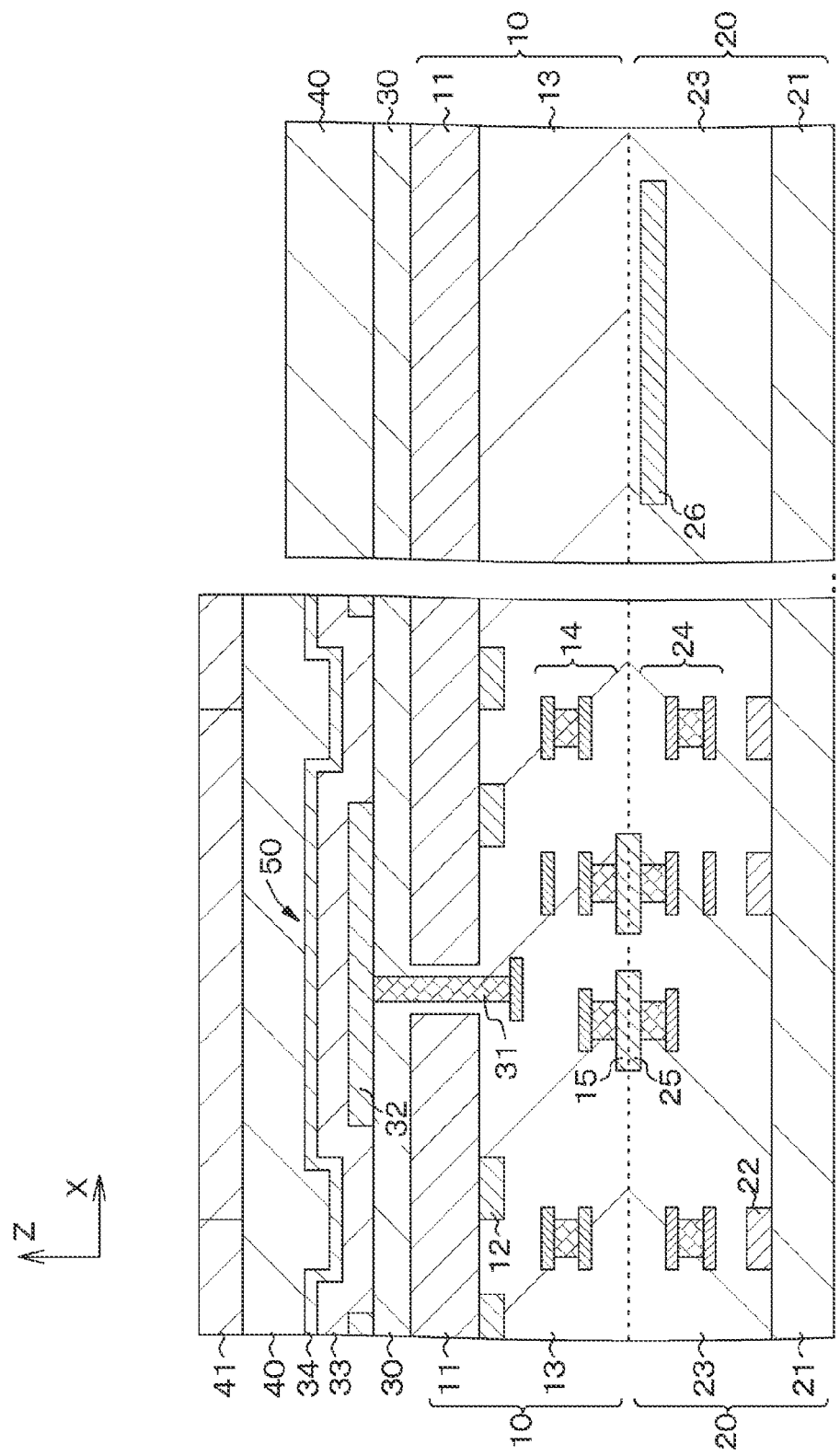
FIG. 51 is a schematic partial end face view for explaining a method for manufacturing the display device according to the eighth embodiment.

First, [Process-400] and [Process-410] that have been described in the fourth embodiment are performed (see FIG. 29). Next, in a portion that corresponds to the display region 80, the color filter 41 is formed over an entire surface (see FIG. 51).

[Process-810]

Figure 52:
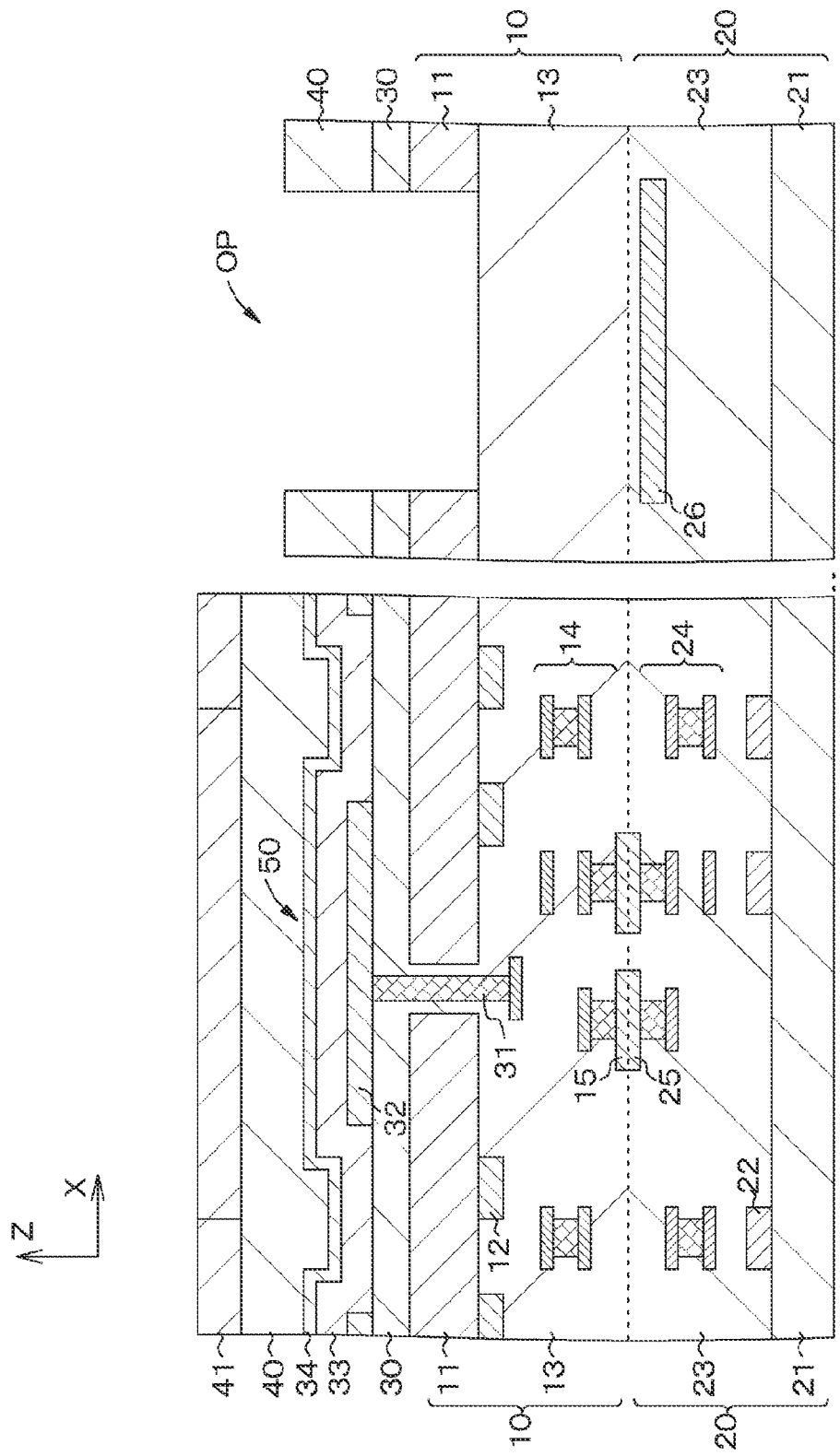
FIG. 52 is a schematic partial end face view that follows FIG. 51 for explaining the method for manufacturing the display device according to the eighth embodiment.
Figure 53:
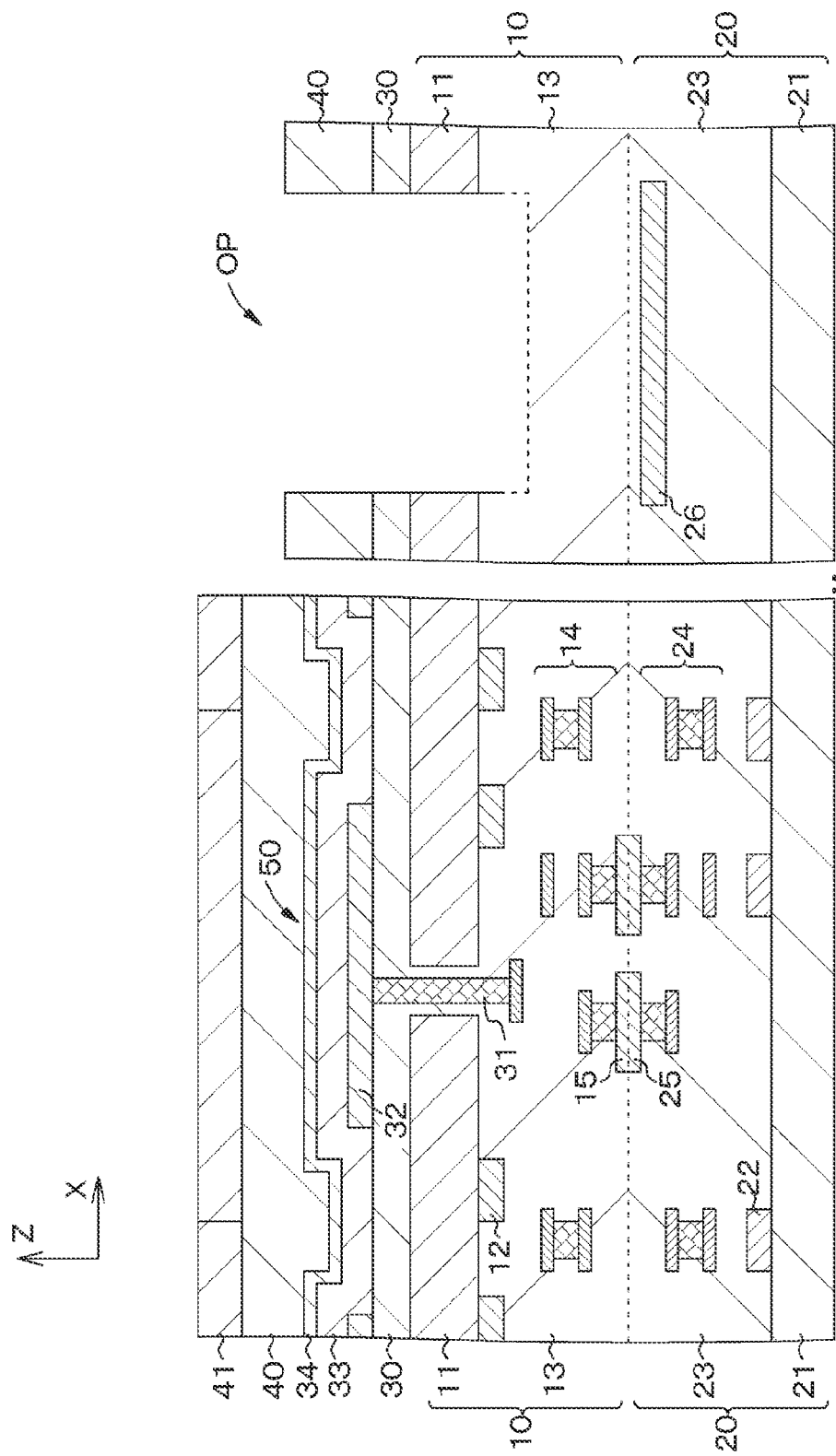
FIG. 53 is a schematic partial end face view that follows FIG. 52 for explaining the method for manufacturing the display device according to the eighth embodiment.

Thereafter, the opening OP is provided to penetrate the semiconductor material layer 11 of the first substrate 10 in such a way that a region in which the pad opening PDOP will be formed is included (see FIG. 52). Note that FIG. 46 illustrates an aspect in which only the protective layer 40, the insulating film 30, and the semiconductor material layer 11 have been removed. However, an aspect in which etching is also performed on the interlayer insulating layer 13 that is located in a lower layer may be employed (see FIG. 53).

[Process-820]

Figure 54:
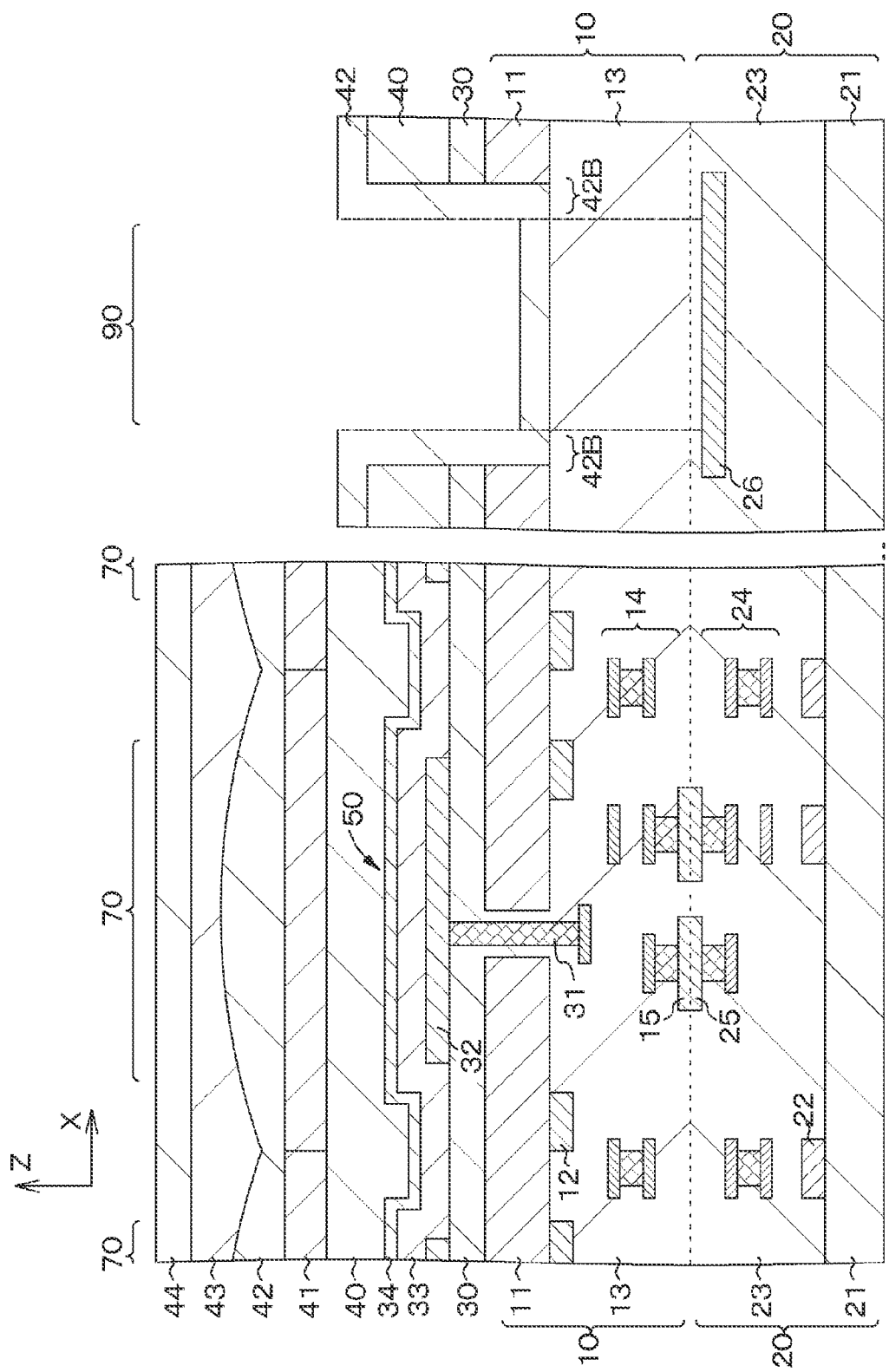
FIG. 54 is a schematic partial end face view that follows FIG. 53 for explaining the method for manufacturing the display device according to the eighth embodiment.

Next, after the microlens 42 has been formed over an entire surface including the display region 80 and the pad region 90, in a portion that corresponds to the display region 80, the counter substrate 44 is stuck via the sealing resin 43 (see FIG. 54). By doing this, a section of the semiconductor material layer 11 is also covered with an insulating material that is included in the microlens 42. Thereafter, a portion illustrated with a broken line in FIG. 54 is opened, and the pad electrode 26 is exposed. By performing the processes described above, the display device 8 illustrated in FIG. 50 can be obtained.

Ninth Embodiment

A ninth embodiment also relates to a display device and a method for manufacturing the display device, and an electronic device according to the present disclosure.

Figure 55:
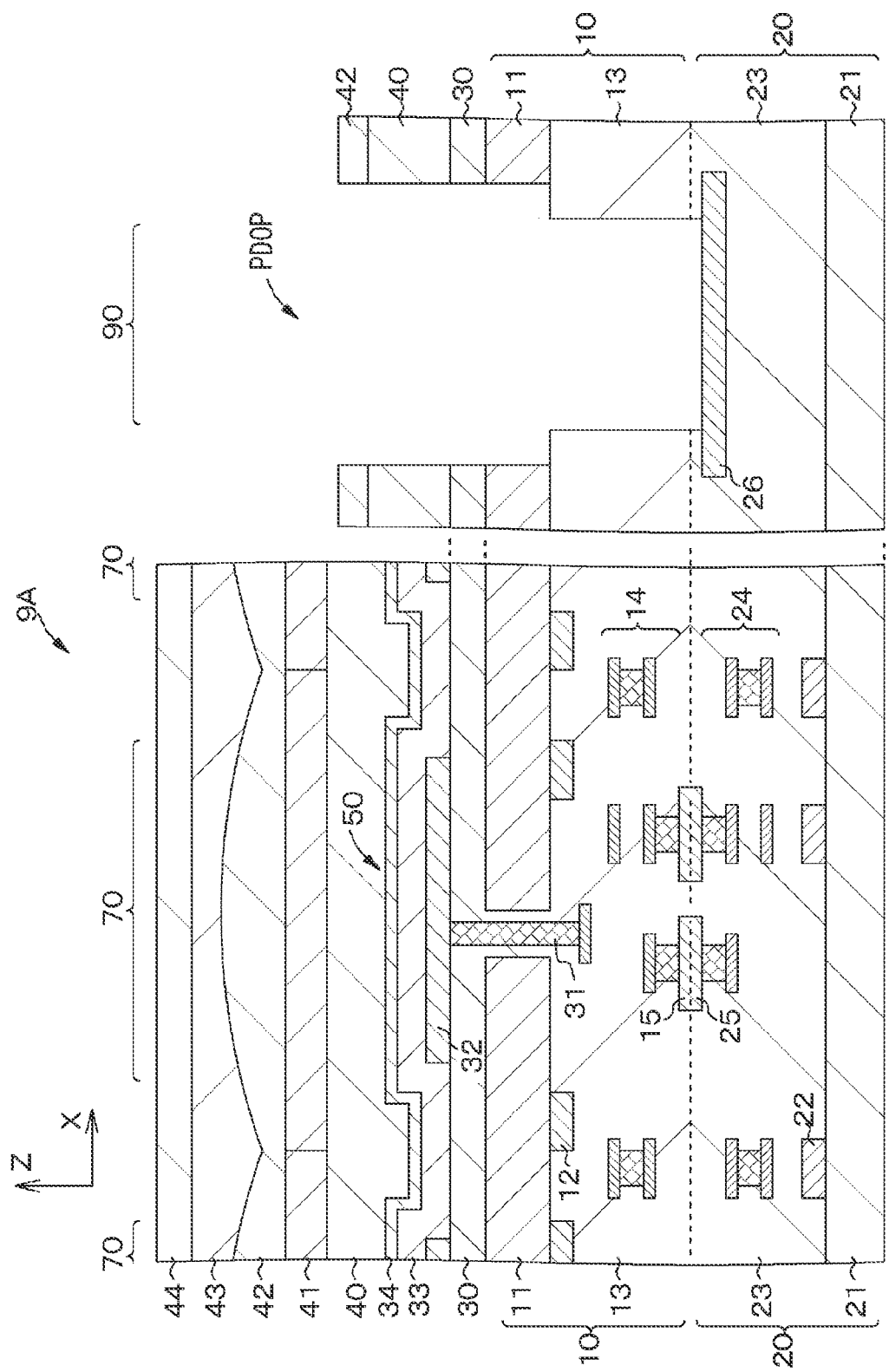
FIG. 55 is a schematic partial end face view for explaining a method for manufacturing a display device according to a ninth embodiment.

FIG. 55 is a schematic partial sectional view of a portion that includes a pixel in a display region, and a portion of a pad region in a display device according to the ninth embodiment.

A display device 9A has a configuration in which a section of the semiconductor material layer 11 is exposed in the pad opening PDOP. However, in the semiconductor material layer, an opening having a region that is wider than an exposed region of the pad electrode 26 has been provided.

A method for manufacturing the display device 9A also includes:
- a first process for sticking the first substrate 10 and the second substrate 20 together in such a way that respective joint surfaces JS face each other, the first substrate 10 including the semiconductor material layer 11 in which a transistor that drives the light-emitting part 50 has been formed, the second substrate 20 including a predetermined circuit; and
- a second process for providing the pad opening PDOP to face the pad electrode 26 from a side of the first substrate 10 in such a way that the pad electrode 26 provided on a side of the respective joint surfaces JS is exposed on a bottom surface. Then, between the first process and the second process,
- a process for providing, in the semiconductor material layer 11, an opening having a region that is wider than an exposed region of the pad electrode 26 is performed.

For example, when the connecting plug 31 is formed, an opening is provided in the semiconductor material layer 11 in the pad region 90. Thereafter, an opening that is smaller than this is provided, and the pad electrode 26 is exposed in a bottom. It is assumed that an offset fee of the two openings described above is, for example, about 5 µm. In the pad opening PDOP, a section of the semiconductor material layer 11 is retreated. Therefore, damage to the semiconductor material layer 11 due to measurement in proping, a wire donding process, or the like is reduced. As a result, leak between pad electrodes 26 is also prevented.

Tenth Embodiment

A tenth embodiment also relates to a display device and a method for manufacturing the display device, and an electronic device according to the present disclosure.

Figure 56:
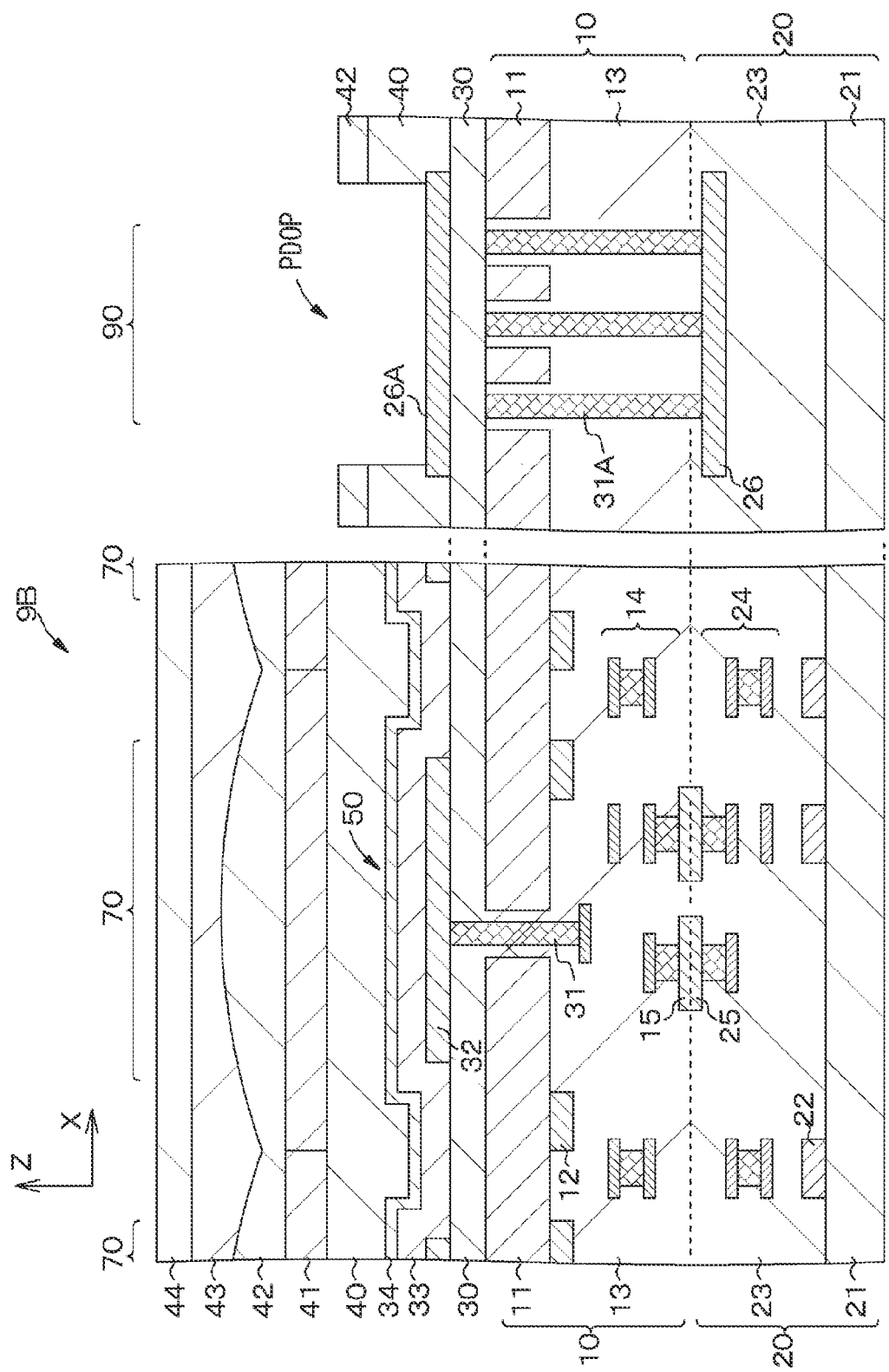
FIG. 56 is a schematic partial end face view for explaining a method for manufacturing a display device according to a tenth embodiment.

FIG. 56 is a schematic partial sectional view of a portion that includes a pixel in a display region, and a portion of a pad region in a display device according to the tenth embodiment.

In a display device 9B, a pad electrode 26A has been formed on the insulating film 30. Then, the pad electrode 26A and the pad electrode 26 are electrically connected to each other via a connecting plug 31A.

In this configuration, a structure in which the pad electrode 26A is located on the insulating film 30 is employed, and therefore leak between pad electrodes or moisture absorption of the organic layer 33 can be reduced.

Description of Electronic Device

The display device according to the present disclosure that has been described above can be used as a display unit (a display device) of an electronic device in every field that displays, as an image or a video, a video signal that has been input to the electronic device or a video signal that has been generated in the electronic device. As an example, the display device according to the present disclosure can be used as a display unit of, for example, a television set, a digital still camera, a laptop personal computer, a portable terminal device such as a portable telephone, a video camera, a head-mounted display, or the like.

The display device according to the present disclosure also includes a device in a module shape that has a sealed configuration. An example is a display module formed by sticking a counter part such as transparent glass in a display region. Note that the display module may be provide with a circuit unit, a flexible printed circuit (FPC), or the like that is used to input or output a signal from an outside to the display region, or the like. As specific examples of an electronic device that uses the display device according to the present disclosure, a digital still camera and a head-mounted display are described below. However, the specific examples described here are only examples, and are not restrictive.

Specific Example 1

Figure 57A:
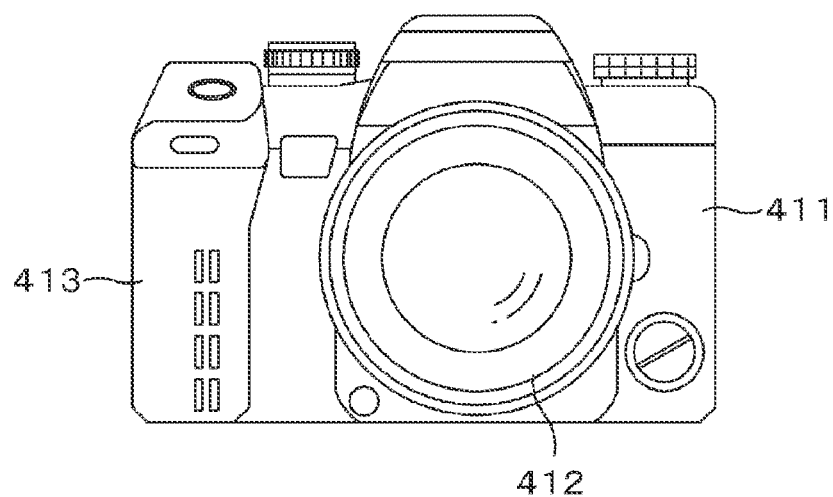
FIGS. 57A and 57B are outside views of a digital still camera of a lens-interchangeable single-lens reflex type.
Figure 57B:
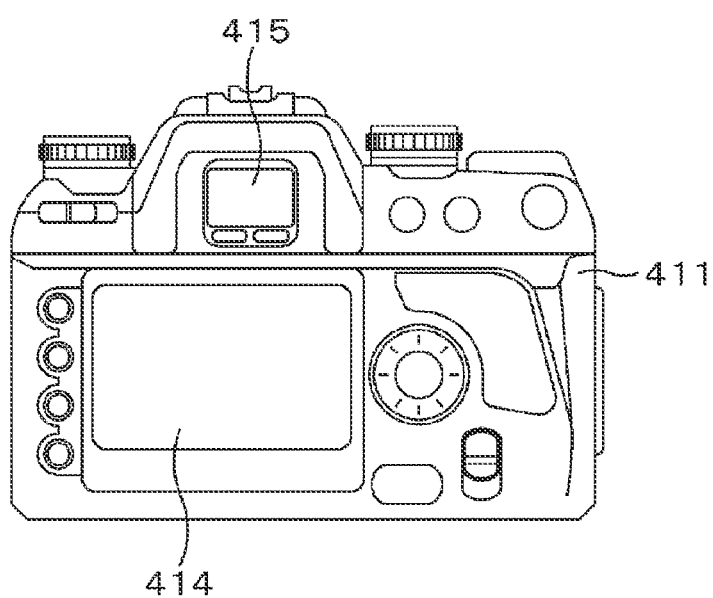

FIGS. 57A and 57B are outside views of a digital still camera of a lens-interchangeable single-lens reflex type, FIG. 57A illustrates a front view of the digital still camera, and FIG. 57B illustrates a rear view of the digital still camera. The digital still camera of the lens-interchangeable single-lens reflex type includes, for example, an interchangeable imaging lens unit (an interchangeable lens) 412 on a front right-hand side of a camera body part (a camera body) 411, and includes a grip part 413 that is gripped by a person who captures an image on a front left-hand side.

Then, roughly in a center of a rear surface of the camera body part 411, a monitor 414 has been provided. Above the monitor 414, a viewfinder (an eyepiece window) 415 has been provided. The person who captures an image looks in the viewfinder 415, and therefore the person can visually recognize an image of light of a subject that has been guided from the imaging lens unit 412, and can determine composition.

In the digital still camera of the lens-interchangeable single-lens reflex type that has the configuration described above, the display device according to the present disclosure can be used as the viewfinder 415. Stated another way, the digital still camera of the lens-interchangeable single-lens reflex type in this example is manufactured by using the display device according to the present disclosure as the viewfinder 415.

SPECIFIC EXAMPLE 2

Figure 58:
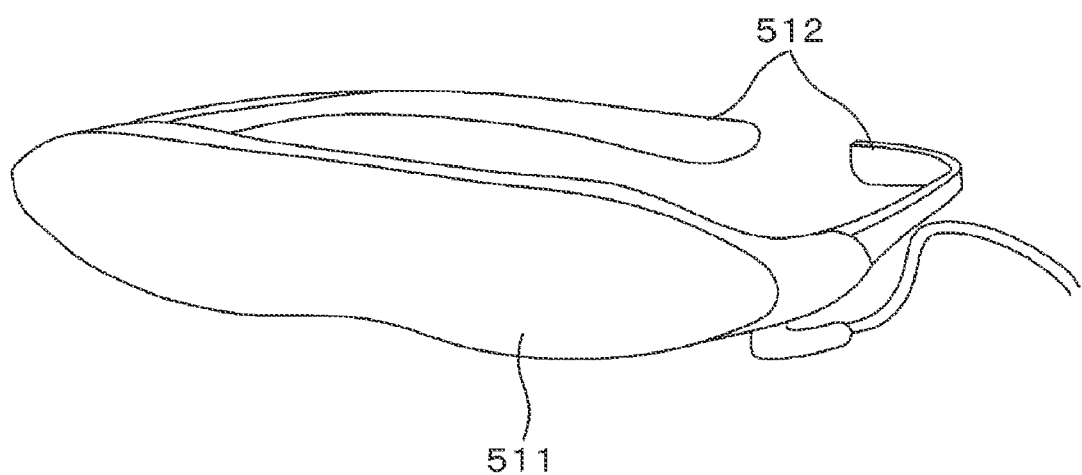
FIG. 58 is an outside view of a head-mounted display.

FIG. 58 is an outside view of a head-mounted display. The head-mounted display includes, for example, an ear hook part 512 that is used to mount the head-mounted display in a user's head, on both sides of a display unit 511 of a glasses type. In this head-mounted display, the display device according to the present disclosure can be used as the display unit 511. Stated another way, the head-mounted display in this example is manufactured by using the display device according to the present disclosure as the display unit 511.

SPECIFIC EXAMPLE 3

Figure 59:
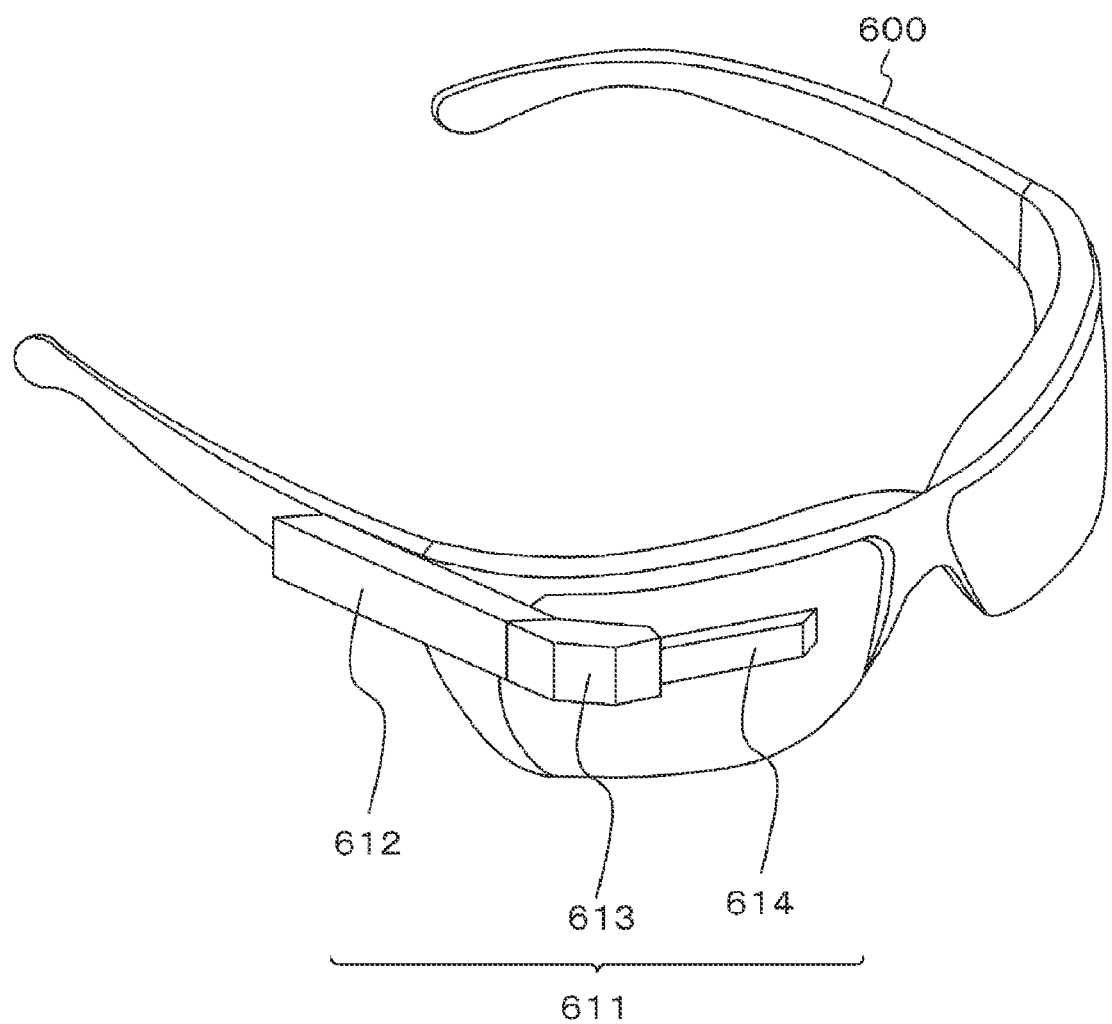
FIG. 59 is an outside view of a see-through head-mounted display.

FIG. 59 is an outside view of a see-through head-mounted display. A see-through head-mounted display 611 includes a body part 612, an arm 613, and a lens barrel 614.

The body part 612 is connected to the arm 613 and glasses 600. Specifically, an end in a longer-side direction of the body part 612 is joined to the arm 613, and one side of a side surface of the body part 612 is coupled to the glasses 600 via a connecting member. Note that the body part 612 may be directly mounted in the head of a human body.

A control board that controls an operation of the see-through head-mounted display 611 or a display unit is incorporated into the body part 612. The arm 613 connects the body part 612 and the lens barrel 614, and supports the lens barrel 614. Specifically, the arm 613 is joined to each of an end of the body part 612 and an end of the lens barrel 614, and fixes the lens barrel 614. Furthermore, a signal line that communicates data of an image to be provided from the body part 612 to the lens barrel 614 is incorporated into the arm 613.

The lens barrel 614 projects image light that has been provided from the body part 612 via the arm 613, through an eyepiece toward eyes of a user who wears the see-through head-mounted display 611. In this see-through head-mounted display 611, the display device according to the present disclosure can be used as the display unit of the body part 612.

[Others]

Note that a technology of the present disclosure can also employ the configurations described below.

[A1]

A display device including:
a first substrate that includes a semiconductor material layer in which a transistor has been formed, the transistor driving a light-emitting part that is included in a pixel; and
a second substrate that includes a predetermined circuit, in which the first substrate and the second substrate are stuck together in such a way that respective joint surfaces face each other, and
a pad opening is provided from a side of the first substrate to face a pad electrode that has been provided on a side of the respective joint surfaces, in such a way that the pad electrode is exposed on a bottom surface.

[A2]

The display device according to [A1] described above, in which on the first substrate,
an insulating film;
a first electrode that has been formed on the insulating film, and is arranged in a matrix shape;
an organic layer that has been formed over an entire surface including an upper side of the first electrode; and
a second electrode that has been formed over an entire surface including an upper side of the organic layer are stacked and formed, and
the light-emitting part includes the first electrode, the organic layer, and the second electrode.

[A3]

The display device according to [A2] described above, in which the pad opening is provided to penetrate the semiconductor material layer of the first substrate, and
the semiconductor material layer that is located around the pad opening is sectioned by an insulating structure that has been provided along a circumference of each of the pad openings to penetrate the semiconductor material layer.

[A4]

The display device according to [A3] described above, in which the insulating structure is formed by using an insulating material that is included in the insulating film.

[A5]

The display device according to [A3] described above, in which a protective film is formed on the second electrode, and
the insulating structure is formed by using an insulating material that is included in the protective film.

[A6]

The display device according to [A3] described above, in which a color filter is formed on the second electrode, and
the insulating structure is formed by using an insulating material that is included in the color filter.

[A7]

The display device according to [A3] described above, in which a microlens is formed on the second electrode, and
the insulating structure is formed by using an insulating material that is included in the microlens.

[A8]

The display device according to [A2] described above, in which the pad opening is provided to penetrate the semiconductor material layer of the first substrate, and
a penetration surface of the semiconductor material layer is covered with an insulating material.

[A9]

The display device according to [A8] described above, in which the penetration surface of the semiconductor material layer is covered with an insulating material that is included in the insulating film.

[A10]

The display device according to [A8] described above, in which a protective film is formed on the second electrode, and
the penetration surface of the semiconductor material layer is covered with an insulating material that is included in the protective film.

[A11]

The display device according to [A8] described above, in which a color filter is formed on the second electrode, and
the penetration surface of the semiconductor material layer is covered with an insulating material that is included in the color filter.

[A12]
The display device according to [A8] described above,
in which a microlens is formed on the second electrode, and
the penetration surface of the semiconductor material layer is covered with an insulating material that is included in the microlens.

[A13]
The display device according to [A1] or [A2] described above,
in which an opening is provided in the semiconductor material layer, the opening having a region that is wider than an exposed region of the pad electrode.

[A14]
The display device according to any of [A1] to [A13] described above,
in which a first connection electrode is provided on a joint surface of the first substrate,
a second connection electrode is provided on a joint surface of the second substrate, and
the first connection electrode and the second connection electrode are metal-joined on the joint surface.

[B1]
A method for manufacturing a display device, the method including:
a first process for sticking a first substrate and a second substrate together in such a way that respective joint surfaces face each other, the first substrate including a semiconductor material layer in which a transistor that drives a light-emitting part has been formed, the second substrate including a predetermined circuit; and
a second process for providing a pad opening from a side of the first substrate to face a pad electrode that has been provided on a side of the respective joint surfaces, in such a way that the pad electrode is exposed on a bottom surface.

[B2]
The method for manufacturing the display device according to [B1] described above, the method further including:
a process for forming the light-emitting part that includes a first electrode, an organic layer, and a second electrode, by stacking on the first substrate:
an insulating film;
the first electrode that has been formed on the insulating film, and is arranged in a matrix shape;
the organic layer that has been formed over an entire surface including an upper side of the first electrode; and
the second electrode that has been formed over an entire surface including an upper side of the organic layer.

[B3]
The method for manufacturing the display device according to [B2] described above,
in which between the first process and the second process,
a process for sectioning the semiconductor material layer that is located around the pad opening, by using an insulating structure that has been provided along a circumference of each of the pad openings to penetrate the semiconductor material layer
is performed.

[B4]
The method for manufacturing the display device according to [B3] described above,
in which the insulating structure is formed by using an insulating material that is included in the insulating film.

[B5]
The method for manufacturing the display device according to [B3] described above, the method further including:
a process for forming a protective film on the first substrate,
in which the insulating structure is formed by using an insulating material that is included in the protective film.

[B6]
The method for manufacturing the display device according to [B3] described above, the method further including:
a process for forming a color filter on the first substrate,
in which the insulating structure is formed by using an insulating material that is included in the color filter.

[B7]
The method for manufacturing the display device according to [B3] described above, the method further including:
a process for forming a microlens on the first substrate,
in which the insulating structure is formed by using an insulating material that is included in the microlens.

[B8]
The method for manufacturing the display device according to [B2] described above,
in which between the first process and the second process,
a process for providing an opening to penetrate the semiconductor material layer of the first substrate in such a way that a region in which the pad opening will be formed is included, and
a process for forming an insulating material layer over an entire surface including the opening
are performed.

[B9]
The method for manufacturing the display device according to [B8] described above,
in which the insulating material layer is formed by using an insulating material that is included in the insulating film.

[B10]
The method for manufacturing the display device according to [B3] described above, the method further including:
a process for forming a protective film on the first substrate,
in which the insulating material layer is formed by using an insulating material that is included in the protective film.

[B11]
The method for manufacturing the display device according to [B3] described above, the method further including:
a process for forming a color filter on the first substrate,
in which the insulating material layer is formed by using an insulating material that is included in the color filter.

[B12]
The method for manufacturing the display device according to [B3] described above, the method further including:
a process for forming a microlens on the first substrate,
in which the insulating material layer is formed by using an insulating material that is included in the microlens.

[B13]
The method for manufacturing the display device according to [B3] described above,
in which between the first process and the second process,
a process for providing, in the semiconductor material layer, an opening having a region that is wider than an exposed region of the pad electrode
is performed.

[C1]
An electronic device including a display device that includes:
a first substrate that includes a semiconductor material layer in which a transistor has been formed, the transistor driving a light-emitting part; and
a second substrate that includes a predetermined circuit,
in which the first substrate and the second substrate are stuck together in such a way that respective joint surfaces face each other, and
a pad opening is provided from a side of the first substrate to face a pad electrode that has been provided on a side of the respective joint surfaces, in such a way that the pad electrode is exposed on a bottom surface.

[C2]
The electronic device according to [C1] described above,
in which on the first substrate,
an insulating film;
a first electrode that has been formed on the insulating film, and is arranged in a matrix shape;
an organic layer that has been formed over an entire surface including an upper side of the first electrode; and
a second electrode that has been formed over an entire surface including an upper side of the organic layer
are stacked and formed, and
the light-emitting part includes the first electrode, the organic layer, and the second electrode.

[C3]
The electronic device according to [C2] described above,
in which the pad opening is provided to penetrate the semiconductor material layer of the first substrate, and
the semiconductor material layer that is located around the pad opening is sectioned by an insulating structure that has been provided along a circumference of each of the pad openings to penetrate the semiconductor material layer.

[C4]
The electronic device according to [C3] described above,
in which the insulating structure is formed by using an insulating material that is included in the insulating film.

[C5]
The electronic device according to [C3] described above,
in which a protective film is formed on the second electrode, and
the insulating structure is formed by using an insulating material that is included in the protective film.

[C6]
The electronic device according to [C3] described above,
in which a color filter is formed on the second electrode, and
the insulating structure is formed by using an insulating material that is included in the color filter.

[C7]
The electronic device according to [C3] described above,
in which a microlens is formed on the second electrode, and
the insulating structure is formed by using an insulating material that is included in the microlens.

[C8]
The electronic device according to [C2] described above,
in which the pad opening is provided to penetrate the semiconductor material layer of the first substrate, and
a penetration surface of the semiconductor material layer is covered with an insulating material.

[C9]
The electronic device according to [C8] described above,
in which the penetration surface of the semiconductor material layer is covered with an insulating material that is included in the insulating film.

[C10]
The electronic device according to [C8] described above,
in which a protective film is formed on the second electrode, and
the penetration surface of the semiconductor material layer is covered with an insulating material that is included in the protective film.

[C11]
The electronic device according to [C8] described above,
in which a color filter is formed on the second electrode, and
the penetration surface of the semiconductor material layer is covered with an insulating material that is included in the color filter.

[C12]
The electronic device according to [C8] described above,
in which a microlens is formed on the second electrode, and
the penetration surface of the semiconductor material layer is covered with an insulating material that is included in the microlens.

[C13]
The electronic device according to [C1] or [C2] described above,
in which an opening is provided in the semiconductor material layer, the opening having a region that is wider than an exposed region of the pad electrode.

[C14]
The electronic device according to any of [C1] to [C13] described above,
in which a first connection electrode is provided on a joint surface of the first substrate,
a second connection electrode is provided on a joint surface of the second substrate, and
the first connection electrode and the second connection electrode are metal-joined on the joint surface.

REFERENCE SIGNS LIST 1, 2, 3, 4, 5, 6, 7, 8, 9A, 9B Display device
10 First substrate
11 Semiconductor material layer
12 Various electrodes
13 Interlayer insulating layer
14 Wiring layer
15 First connection electrode
20 Second substrate
21 Semiconductor material layer
22 Various electrodes
23 Interlayer insulating layer
24 Wiring layer
25 Second connection electrode
26, 26A Pad electrode
30 Insulating film
30A, 30B Insulating structure
30C Insulating material that covers section of semiconductor material layer
31 Connecting plug (via)
32 First electrode (anode electrode)
33 Organic layer
34 Second electrode (cathode electrode)
40 Protective film 40A Insulating structure
40B Insulating material that covers section of semiconductor material layer
41 Color filter
41A Insulating structure
41B Insulating material that covers section of semiconductor material layer
42 Microlens
42B Insulating material that covers section of semiconductor material layer
43 Sealing resin
44 Counter substrate
50 Light-emitting part
70 Pixel
71 Driving circuit
80 Display region
90 Pad region
110 Source driver
120 Vertical scanner
130 Power source
WS Scanning line
DTL Data line
PS1 Feeder line
$TR_W$ Writing transistor
$TR_D$ Driving transistor
$C_S$ Capacity part
$C_{EL}$ Capacity of light-emitting part
411 Camera body part
412 Imaging lens unit
413 Grip part
414 Monitor
415 Viewfinder
511 Glasses-type display unit
512 Ear hook part
600 Glasses
611 See-through head-mounted display
612 Body part
613 Arm
614 Lens barrel

The invention claimed is:
1. A display device, comprising:
a pixel that includes a light-emitting part;
a pad electrode;
a first substrate that includes a semiconductor material layer that includes a transistor, wherein the transistor is configured to drive the light-emitting part included in the pixel;
a second substrate that includes a specific circuit,
wherein a first surface of the first substrate joins a second surface of the second substrate such that the first surface faces the second surface;
an insulating film on the first substrate;
a first electrode on the insulating film, wherein the first electrode is arranged in a matrix shape;
an organic layer over an entire surface including an upper side of the first electrode;
a second electrode over an entire surface including an upper side of the organic layer,
wherein the insulating film, the first electrode, the organic layer, and the second electrode are stacked on the first substrate, and
the light-emitting part includes the first electrode, the organic layer, and the second electrode; and
a pad opening from a first side of the first substrate faces the pad electrode on a second side of each of a respective one of the first surface and the second surface, such that the pad electrode is exposed on a bottom surface, wherein
the pad opening penetrates the semiconductor material layer of the first substrate, and
the semiconductor material layer is around the pad opening sectioned by an insulating structure along a circumference of the pad opening on the second side of each of the respective one of the first surface and the second surface.

2. The display device according to claim 1,
wherein the insulating structure includes an insulating material that is included in the insulating film.

3. The display device according to claim 1, further comprising:
a protective film on the second electrode, wherein
the insulating structure includes an insulating material that is included in the protective film.

4. The display device according to claim 1, further comprising:
a color filter on the second electrode, wherein
the insulating structure includes an insulating material that is included in the color filter.

5. The display device according to claim 1, further comprising:
a microlens on the second electrode, wherein
the insulating structure includes an insulating material that is included in the microlens.

6. The display device according to claim 1,
wherein an insulating material covers a penetration surface of the semiconductor material layer.

7. The display device according to claim 6,
wherein the insulating material is included in the insulating film, and the insulating material covers the penetration surface of the semiconductor material layer.

8. The display device according to claim 6, further comprising:
a protective film on the second electrode, wherein
the insulating material is included in the protective film, and the insulating material covers the penetration surface of the semiconductor material layer.

9. The display device according to claim 6, further comprising:
a color filter on the second electrode, wherein
the insulating material is included in the color filter, and the insulating material covers the penetration surface of the semiconductor material layer.

10. The display device according to claim 6, further comprising:
a microlens on the second electrode, wherein
the insulating material is included in the microlens, and the insulating material covers the penetration surface of the semiconductor material layer.

11. The display device according to claim 1,
wherein an opening is provided in the semiconductor material layer, and the opening includes a region that is wider than an exposed region of the pad electrode.

12. The display device according to claim 1, further comprising:
a first connection electrode on the first surface of the first substrate; and
a second connection electrode on the second surface of the second substrate wherein
the first connection electrode and the second connection electrode are metal-joined on the first surface and the second surface.

13. A method for manufacturing a display device, the method comprising:
- forming a pixel including a light-emitting part on a first substrate of the display device;
- forming the light-emitting part that includes a first electrode, an organic layer, and a second electrode, by stacking on the first substrate:
  - an insulating film,
  - the first electrode on the insulating film, wherein the first electrode is arranged in a matrix shape,
  - the organic layer over an entire surface including an upper side of the first electrode, and
  - the second electrode over an entire surface including an upper side of the organic layer;
- forming a transistor on the first substrate in a semiconductor material layer of the first substrate, wherein the transistor is configured to drive the light-emitting part of the pixel;
- joining a first surface of the first substrate on a second surface of a second substrate of the display device such that the first surface faces the second surface, wherein the second substrate includes a specific circuit; and
- providing a pad opening from a first side of the first substrate, wherein the pad opening faces a pad electrode on a second side of each of a respective one of the first surface and the second surface, such that the pad electrode is exposed on a bottom surface,
- the pad opening penetrates the semiconductor material layer of the first substrate, and
- the semiconductor material layer is around the pad opening sectioned by an insulating structure along a circumference of the pad opening on the second side of each of the respective one of the first surface and the second surface.

14. The method for manufacturing the display device according to claim 13, the method further comprising:
- providing an opening to penetrate the semiconductor material layer of the first substrate such that a region in which the pad opening is formed is included, and
- forming an insulating material layer over an entire surface including the opening.

15. The method for manufacturing the display device according to claim 13, the method further comprising:
- providing, in the semiconductor material layer, an opening including a region that is wider than an exposed region of the pad electrode.

16. An electronic device comprising a display device that includes:
- a pixel that includes a light-emitting part;
- a pad electrode;
- a first substrate that includes a semiconductor material layer that includes a transistor, wherein the transistor is configured to drive the light-emitting part included in the pixel;
- a second substrate that includes a specific circuit,
- wherein a first surface of the first substrate joins a second surface of the second substrate such that the first surface faces the second surface;
- an insulating film on the first substrate;
- a first electrode on the insulating film, wherein the first electrode is arranged in a matrix shape;
- an organic layer over an entire surface including an upper side of the first electrode;
- a second electrode over an entire surface including an upper side of the organic layer,
- wherein the insulating film, the first electrode, the organic layer, and the second electrode are stacked on the first substrate, and
- the light-emitting part includes the first electrode, the organic layer, and the second electrode; and
- a pad opening from a first side of the first substrate faces the pad electrode on a second side of each of a respective one of the first surface and the second surface, such that the pad electrode is exposed on a bottom surface, wherein
- the pad opening penetrates the semiconductor material layer of the first substrate, and
- the semiconductor material layer is around the pad opening sectioned by an insulating structure along a circumference of the pad opening on the second side of each of the respective one of the first surface and the second surface.

* * * * *